(12) United States Patent
Han et al.

(10) Patent No.: US 11,543,919 B2
(45) Date of Patent: Jan. 3, 2023

(54) DISPLAY PANEL AND DISPLAY DEVICE USING THE SAME

(71) Applicant: LG Display Co., Ltd., Seoul (KR)

(72) Inventors: Man Hyeop Han, Paju-si (KR); In Hyuk Song, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 17/410,737

(22) Filed: Aug. 24, 2021

(65) Prior Publication Data
US 2022/0067340 A1    Mar. 3, 2022

(30) Foreign Application Priority Data
Sep. 2, 2020    (KR) .................. 10-2020-0111670

(51) Int. Cl.
| | |
|---|---|
| G06F 3/042 | (2006.01) |
| G06F 3/044 | (2006.01) |
| H01L 27/32 | (2006.01) |
| H01L 51/52 | (2006.01) |
| G06V 40/12 | (2022.01) |
| G06V 40/13 | (2022.01) |
| H01L 27/146 | (2006.01) |
| G06F 3/041 | (2006.01) |
| G09G 3/3266 | (2016.01) |
| G09G 3/3291 | (2016.01) |
| G02B 5/20 | (2006.01) |

(52) U.S. Cl.
CPC .............. *G06F 3/042* (2013.01); *G06F 3/044* (2013.01); *G06V 40/1318* (2022.01); *G06V 40/1365* (2022.01); *H01L 27/322* (2013.01); *H01L 27/323* (2013.01); *H01L 27/3227* (2013.01); *H01L 27/3234* (2013.01); *H01L 27/3246* (2013.01); *H01L 51/5284* (2013.01); *G02B 5/201* (2013.01); *G06F 3/04184* (2019.05); *G06F 2203/04112* (2013.01); *G09G 3/3266* (2013.01); *G09G 3/3291* (2013.01); *G09G 2310/08* (2013.01); *H01L 27/14678* (2013.01)

(58) Field of Classification Search
CPC .............. G06K 9/0004; G06V 40/1318; H01L 27/3227; H01L 27/3234; G06F 3/042; G06F 3/044
See application file for complete search history.

(56) References Cited

U.S. PATENT DOCUMENTS

| | | | |
|---|---|---|---|
| 2020/0104562 A1 | 4/2020 | Sung et al. | |
| 2020/0119113 A1 | 4/2020 | Lee et al. | |
| 2021/0041969 A1* | 2/2021 | Zhao ................ | G06F 3/041 |

(Continued)

FOREIGN PATENT DOCUMENTS

| | | | | |
|---|---|---|---|---|
| CN | 111725264 A | * | 9/2020 | ............ H01L 27/32 |
| KR | 10-2020-0036684 A | | 4/2020 | |

(Continued)

*Primary Examiner* — Yuzhen Shen
(74) *Attorney, Agent, or Firm* — Fenwick & West LLP

(57) ABSTRACT

The present disclosure relates to a display panel and a display device using the same. The display panel includes a display area in which a plurality of display pixels including a light emitting element are disposed, a sensing area in which a plurality of display pixels including a light emitting element and a plurality of sensor pixels including a photoelectric conversion element are disposed, and a touch sensor disposed on display area and the sensing area.

20 Claims, 40 Drawing Sheets

(56) References Cited

U.S. PATENT DOCUMENTS

| | | | | |
|---|---|---|---|---|
| 2021/0096678 A1* | 4/2021 | Kubota | .................. | G06F 3/042 |
| 2021/0376003 A1* | 12/2021 | Xu | ...................... | H01L 27/3272 |
| 2021/0376009 A1* | 12/2021 | Jeon | ...................... | H01L 27/326 |
| 2021/0397806 A1* | 12/2021 | Lu | ....................... | H01L 27/3244 |
| 2022/0069034 A1* | 3/2022 | Yoo | ..................... | H01L 27/3234 |

FOREIGN PATENT DOCUMENTS

| | | |
|---|---|---|
| KR | 10-2020-0038388 A | 4/2020 |
| KR | 10-2020-0042981 A | 4/2020 |

\* cited by examiner

DISPLAY PANEL AND DISPLAY DEVICE USING THE SAME

CROSS-REFERENCE TO RELATED APPLICATION

This application claims priority to and the benefit of Republic of Korea Patent Application No. 10-2020-0111670, filed Sep. 2, 2020, the disclosure of which is hereby incorporated by reference in its entirety.

BACKGROUND

1. Field

The present disclosure relates to a display panel having a fingerprint sensor and a touch sensor, and a display device using the same.

2. Discussion of Related Art

Electroluminescent display devices are roughly classified into inorganic light emitting display devices and organic light emitting display devices depending on the material of the emission layer. The organic light emitting display device of an active matrix type includes an organic light emitting diode (hereinafter, referred to as "OLED") that emits light by itself, and has an advantage in that the response speed is fast, the luminous efficiency and luminance are good, and the viewing angle is wide. In the organic light emitting display device, an organic light emitting diode (OLED) is formed in each pixel. The organic light emitting display device has a fast response speed, is excellent in terms of luminous efficiency, luminance and viewing angle, and provides an excellent contrast ratio and color reproducibility since it can express black grayscales in complete black.

Recently, there is a trend that organic light emitting display devices are widely applied as display devices of mobile terminals. Biometric recognition technology is being applied to authentication of users of mobile terminals. As an example of biometric recognition technology, fingerprint sensors are widely applied to smartphones because they provide security and convenience in a user authentication process. A fingerprint sensor applied to a smartphone senses a user's fingerprint when screen unlocking or user authentication is required.

The fingerprint sensor may place many restrictions on the screen design of a smartphone. For example, the existing button-type fingerprint sensor disposed under the screen of the display device has been an obstacle that makes it nearly impossible to implement a full-screen display by increasing the screen size. To implement a full screen display, Fingerprint Recognition on Display (FoD) technology is being developed in which the fingerprint sensor is disposed under the display panel and a fingerprint is sensed on the screen. Since the fingerprint sensor module has to be placed under the screen to implement FOD technology, the thickness of the display device is increased and the assembly process of the display panel and the fingerprint sensor module is added, causing a problem of lowering the yield and increasing the manufacturing cost.

An optical fingerprint sensor uses an image sensor to obtain a fingerprint image by converting light reflected from the fingerprint into an electrical signal. Since the optical fingerprint sensor and the finger are spaced apart with the display panel interposed therebetween, the fingerprint pattern becomes unclear and the fingerprint recognition rate may decrease. To improve this, a lens may be disposed at or above the light-receiving surface of the optical fingerprint sensor to focus or collimate light on the light-receiving surface. However, due to the focusing lens or collimating lens, the optical fingerprint sensor module becomes thick and the cost increases. When a lens is added to the display panel, the manufacturing process of the display panel becomes more complicated, the display panel becomes thicker, the yield is reduced, and the cost increases.

SUMMARY

An object of the present disclosure is to solve the aforementioned necessity and/or problem.

In particular, the present disclosure provides a display panel that can increase the fingerprint recognition rate by preventing a phenomenon in which scattered light is incident on the optical fingerprint sensor, and a display device using the same.

The objects of the present disclosure are not limited to those mentioned above, and other objects not mentioned will be clearly understood by those skilled in the art from the following description.

A display panel according to an embodiment of the present disclosure includes: a display area in which a plurality of display pixels including a light emitting element are disposed; a sensing area in which a plurality of display pixels including a light emitting element and a plurality of sensor pixels including a photoelectric conversion element are disposed; and a touch sensor disposed on the display area and the sensing area.

The touch sensor includes a line that provides a first opening exposing an emission region of the light emitting element and a second opening exposing a light-receiving surface of the photoelectric conversion element.

In a display panel according to another embodiment of the present disclosure, the touch sensor includes a line that has different line widths in part in the sensing area.

A display device of the present disclosure includes the above display panel.

In the present disclosure, the fingerprint recognition rate can be increased by disposing the line of a touch sensor that blocks scattered light on the photoelectric conversion element in the sensing area.

In the present disclosure, the fingerprint recognition rate can be further improved by using two or more of the pixel defining film, the black matrix, and the barrier layer together with the touch sensor to block scattered light traveling to the photoelectric conversion element in multiple stages.

In the present disclosure, sensor pixels for sensing a fingerprint are embedded together with display pixels in the display panel. In the present disclosure, the structure of the display panel can be simplified by allowing the pixel driving circuit and the sensor driving circuit to share the power line and the signal line and by disposing the electrodes of the light emitting element and the photodiode on the same layer.

In the present disclosure, the data voltage applied to the sensing area is raised in comparison to the data voltage applied to the display area, compensating for a decrease in luminance of the sensing area.

The effects of the present disclosure are not limited to those mentioned above, and other effects that are not mentioned will be clearly understood by those skilled in the art from the description of the claims.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

DETAILED DESCRIPTION

Figure 1:
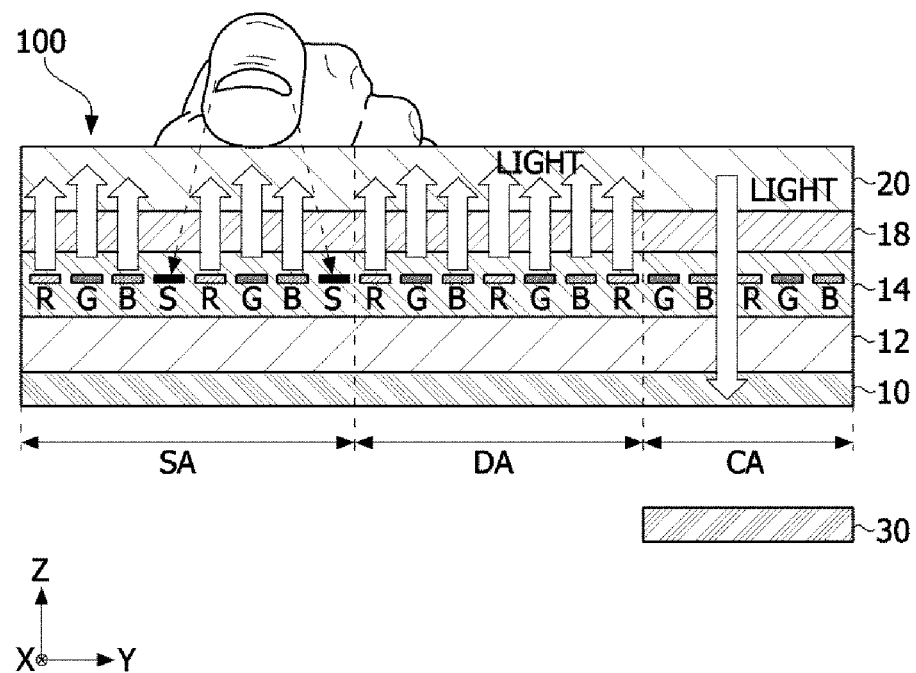
FIG. 1 is a diagram schematically showing a display device according to an embodiment of the present disclosure.

Advantages and features of the present disclosure, and the method for achieving them will become apparent from the embodiments described below in detail together with the accompanying drawings. However, the present disclosure is not limited to the embodiments disclosed below but will be carried out in various forms, these embodiments are provided merely to complete the present disclosure and to fully inform the scope of the invention to those of ordinary skill in the art to which the present disclosure pertains, and the present disclosure is defined only by the scope of the claims.

The shape, size, ratio, angle, and number shown in the drawings for explaining the embodiments of the present disclosure are exemplary, and thus the present disclosure is not limited to the illustrated matters. The same reference symbols refer to the same elements throughout the specification. Additionally, in the description of the present disclosure, when it is determined that a detailed description of a related known technology may unnecessarily obscure the subject matter of the present disclosure, a detailed description thereof will be omitted.

In the present specification, when 'include', 'have', 'composed of', and the like are used, other parts may be added unless 'only' is used. The singular forms are intended to include the plural forms as well, unless the context clearly indicates otherwise.

Components are interpreted as including an error range even if there is no explicit description.

In the description of a positional relationship, when the positional relationship of two parts is described by, for example, 'on', 'above', 'under', and 'next to', one or more other parts may be placed between the two parts unless 'immediately' or 'directly' is used.

In the description of embodiments, the terms 'first' and 'second' may refer to various elements regardless of importance and/or order and are used to distinguish one element from another element without limitation. Hence, a first component may be denoted as a second component, and vice versa without departing from the scope of the present disclosure.

The same reference symbols refer to the same elements throughout the specification.

Features of various embodiments can be integrated or combined with each other in part or in whole and can be technically associated and driven in various ways, and the embodiments may be carried out independently or may be carried out together in a related relationship.

Hereinafter, various embodiments of the present disclosure will be described in detail with reference to the accompanying drawings.

With reference to FIG. 1, the screen of the display panel 100 includes a pixel array on which an input image is reproduced. The pixel array includes a display area DA, and first sensing area SA and a second sensing area CA.

Display pixels R, G and B of a first group to which pixel data is written are disposed in the display area DA. Display pixels R, B and B of a second group and a plurality of sensor pixels S are disposed in the first sensing area SA. Display pixels R, B and B of a third group are disposed in the second sensing area CA.

The display area DA includes display pixels R, G and B arranged at a high pixels-per-inch (PPI) to display input data. The input data may be pixel data of an input image or data including various types of information.

The first sensing area SA includes display pixels R, G and B to which pixel data is written, and pixels of an image sensor sensing a fingerprint pattern (hereinafter, referred to as "sensor pixels"). Each of the sensor pixels S includes a photoelectric conversion element, for example, a photodiode. The sensing area SA displays input data through display pixels in the display mode, and senses a fingerprint using sensor pixels in the fingerprint recognition mode. In the sensing area SA, the display pixels R, G and B and the sensor pixels S share most wirings and have a similar cross-sectional structure. The display pixels R, G and B and the sensor pixels S may be arranged on the same plane. In this case, the PPI of the display pixels in the sensing area SA may be lower than that of the display pixels in the display area DA due to the portion occupied by the sensor pixels S. The display pixels R, G and B and the sensor pixels S in the sensing area SA may be simultaneously formed without a process added to the existing manufacturing process.

The second sensing area CA includes display pixels embedded in the display panel 100, and at least one optical sensor 30 disposed outside the display panel 100. The optical sensor 30 may be disposed under (or, on the rear surface of) the display panel 100 within the second sensing area CA so that the light-receiving surface faces the second sensing area CA.

The display pixels of the second sensing area CA are disposed on the same plane as the display pixels of the display area DA and the first sensing area SA. In the display mode, pixel data is written to the display pixels of the second sensing area CA, which then display an input image. The PPI of the display pixels R, G and B may be the same in the first and second sensing areas SA and CA.

The optical sensor 30 disposed in the second sensing area CA may include one or more of an imaging element such as a camera, an infrared sensor, and an illuminance sensor. To reproduce an input image and increase the light transmittance, the second sensing area CA may include low PPI display pixels and light transmitting portions.

The PPI of the first and second sensing areas SA and CA is lower than that of the display area DA. To eliminate a difference in image quality between the sensing areas SA and the display area DA, an image quality compensation algorithm for compensating for luminance and color coordinates may be applied to pixel data to be written to the display pixels of the sensing areas SA and CA.

The display pixels R, G and B are arranged not only in the display area DA but also in the sensing areas SA and CA. Accordingly, the display device of the present disclosure can implement a full-screen display.

Each of the display pixels R, G and B arranged in the display area DA and the sensing areas SA and CA includes subpixels having different colors to implement the color of an image. The subpixels include a red subpixel (hereinafter, referred to as "R subpixel"), a green subpixel (hereinafter, referred to as "G subpixel"), and a blue subpixel (hereinafter, referred to as "B subpixel"). Although not shown, each of the pixels P may further include a white subpixel (hereinafter, referred to as "W subpixel"). Each of the subpixels includes a pixel circuit and a light emitting element. In FIG. 1, 'R' denotes an R subpixel, 'G' denotes a G subpixel, and 'B' denotes a B subpixel.

At least one of the display pixels of the first sensing area SA may be driven as a light source in the fingerprint recognition mode activated when a fingerprint recognition event occurs. In the fingerprint recognition mode, when the user places a fingerprint on the cover glass 20 of the sensing area SA, the light sources of the sensing area SA are turned on. The sensor pixels S of the sensing area SA are driven in the fingerprint recognition mode, and convert light reflected from the user's fingerprint contacted on the cover glass 20 into an electrical signal and transmit the electrical signal to a fingerprint recognition processor. The fingerprint recognition processor generates fingerprint pattern data by amplifying the output signals of the sensor pixels S and converting them into digital data. The host system omitted in FIG. 1 performs fingerprint authentication by comparing the fingerprint pattern data received from the fingerprint recognition processor with the pre-registered fingerprint pattern of the user.

The fingerprint recognition processor can be integrated with the timing controller that controls the operation timing of the display panel driver.

In the present disclosure, since a separate fingerprint sensor module is not adhered to the display panel 100, there is no decrease in yield caused by the assembly process of the display panel and the fingerprint sensor module, and the manufacturing cost can be lowered.

The display panel 100 has a width in the X-axis direction, a length in the Y-axis direction, and a thickness in the Z-axis direction. The display panel 100 includes a circuit layer 12 disposed on the substrate 10, a light emitting element and sensor layer 14 disposed on the circuit layer 12. A polarizing plate 18 may be disposed on the light emitting element and sensor layer 14, and a cover glass 20 may be disposed on the polarizing plate 18.

The circuit layer 12 may include a pixel circuit connected to data lines, gate lines and power lines, a gate driver for driving the gate lines, a sensor driving circuit, and the like. The circuit layer 12 may include circuit elements such as a transistor implemented with a thin film transistor (TFT), and a capacitor.

The light emitting element and sensor layer 14 may include a light emitting element driven by a pixel circuit. The light emitting element may be implemented with an OLED. The OLED may include an organic compound layer 14-2 formed between the anode electrode and the cathode electrode. The organic compound layer may include, but not limited to, a hole injection layer (HIL), a hole transport layer (HTL), an emission layer (EML), an electron transport layer (ETL), and an electron injection layer (EIL). When a voltage is applied to the anode electrode and cathode electrode of the OLED, holes passing through the hole transport layer (HTL) and electrons passing through the electron transport layer (ETL) move to the emission layer (EML) to form excitons, so that visible light is emitted from the emission layer (EML). The light emitting element and sensor layer 14 may further include color filters that are disposed on the circuit layer 12 to selectively transmit red, green, and blue wavelengths.

The light emitting element and sensor layer 14 includes a photodiode of the sensor pixel S formed on the same layer as the light emitting elements.

The light emitting element and sensor layer 14 may be covered with a protective layer, and the protective layer may be covered with an encapsulation layer. The passivation layer and the encapsulation layer may have a structure in which an organic film and an inorganic film are alternately stacked. The inorganic film blocks the penetration of moisture or oxygen. The organic film planarizes the surface of the inorganic film. When organic and inorganic films are stacked in multiple layers, the movement path of moisture or oxygen becomes longer compared with a single layer, so that the penetration of moisture/oxygen affecting the light emitting element and sensor layer 14 can be effectively blocked.

Touch sensor electrodes may be disposed on the light emitting element and sensor layer 14. The polarizing plate 18 may be adhered to the encapsulation layer. The polarizing plate 18 improves outdoor visibility of the display device. The polarizing plate 18 reduces light reflected from the surface of the display panel 100 and blocks or at least reduces light reflected from the metal of the circuit layer 12 to thereby improve the brightness of pixels. The polarizing plate 18 may be implemented as a polarizing plate or circular polarizing plate in which a linear polarizing plate and a phase retardation film are bonded.

Figure 2:
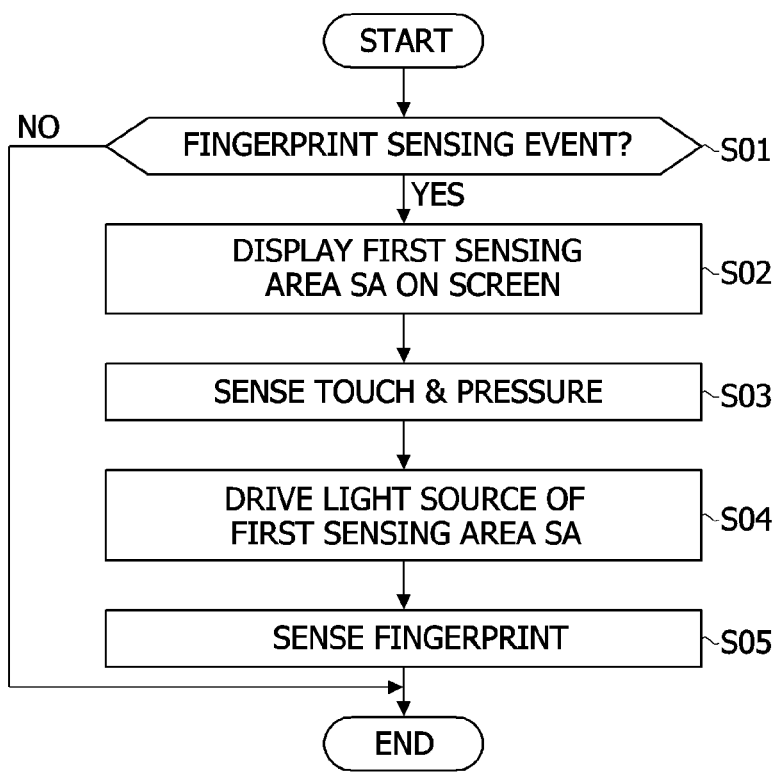
FIG. 2 is a flowchart illustrating a method for driving a first sensing area in the fingerprint recognition mode according to an embodiment of the present disclosure.
Figure 3:
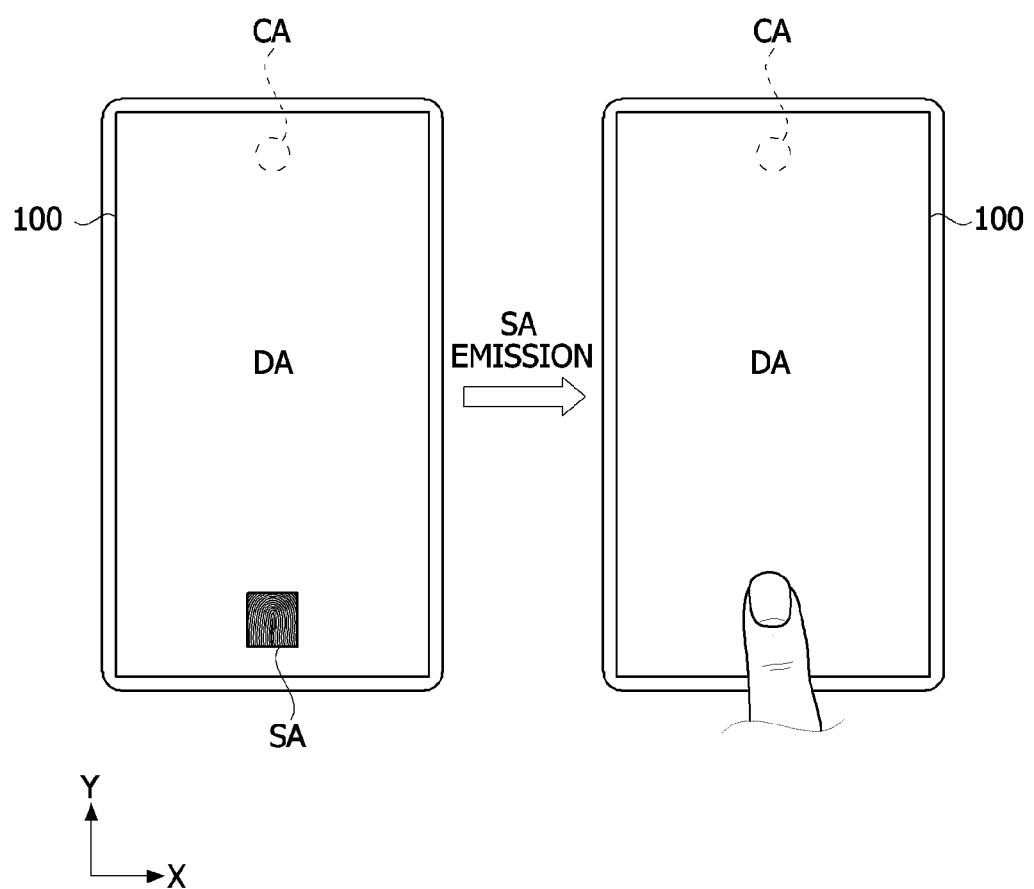
FIG. 3 is a diagram showing an example of fingerprint sensing on the display screen of a mobile terminal according to an embodiment of the present disclosure.

FIG. 2 is a flowchart illustrating a method for driving the sensing area SA in the fingerprint recognition mode according to an embodiment of the disclosure. FIG. 3 is a diagram showing an example of fingerprint sensing on the display screen of a mobile terminal according to one embodiment.

With reference to FIGS. 2 and 3, when a fingerprint sensing event occurs, the sensing area SA starts to operate in a fingerprint recognition mode. The host system receives fingerprint pattern data from the fingerprint recognition processor in an application that is connected to the display device and requires user authentication, and performs fingerprint authentication.

When the fingerprint recognition mode is started, the display device may guide the fingerprint sensing position by displaying the sensing area SA on the screen as shown in FIG. 3 (S01, S02). The host system senses a finger placed on the sensing area SA according to an output signal from the touch sensor or the pressure sensor (S03). The fingerprint recognition processor senses the fingerprint of the finger by driving the light sources and sensor pixels S of the sensing area SA in response to a command from the host system (S04 and S05). In the fingerprint recognition mode, the sensor pixels S perform photoelectric conversion of light reflected from the fingerprint. The fingerprint recognition processor converts the output signals of the sensor pixels S into digital data to generate fingerprint pattern data, and transmits this data to the host system.

Figure 4:
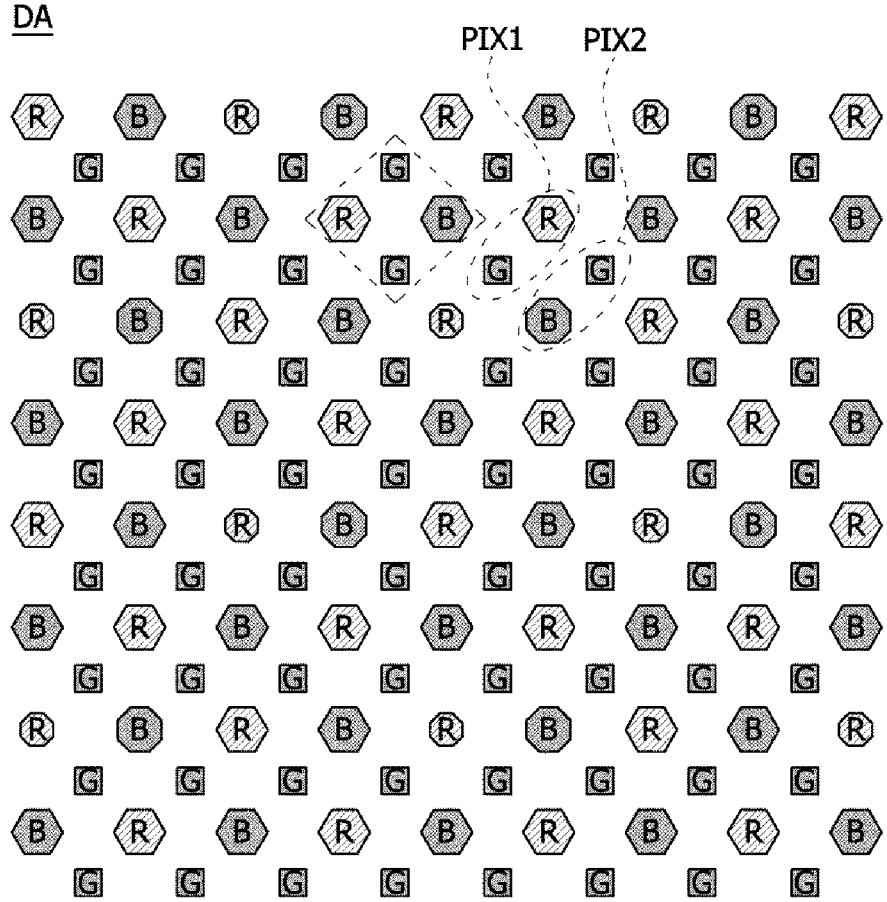
FIG. 4 is a diagram illustrating display pixels arranged in the display area according to an embodiment of the present disclosure.
Figure 5:
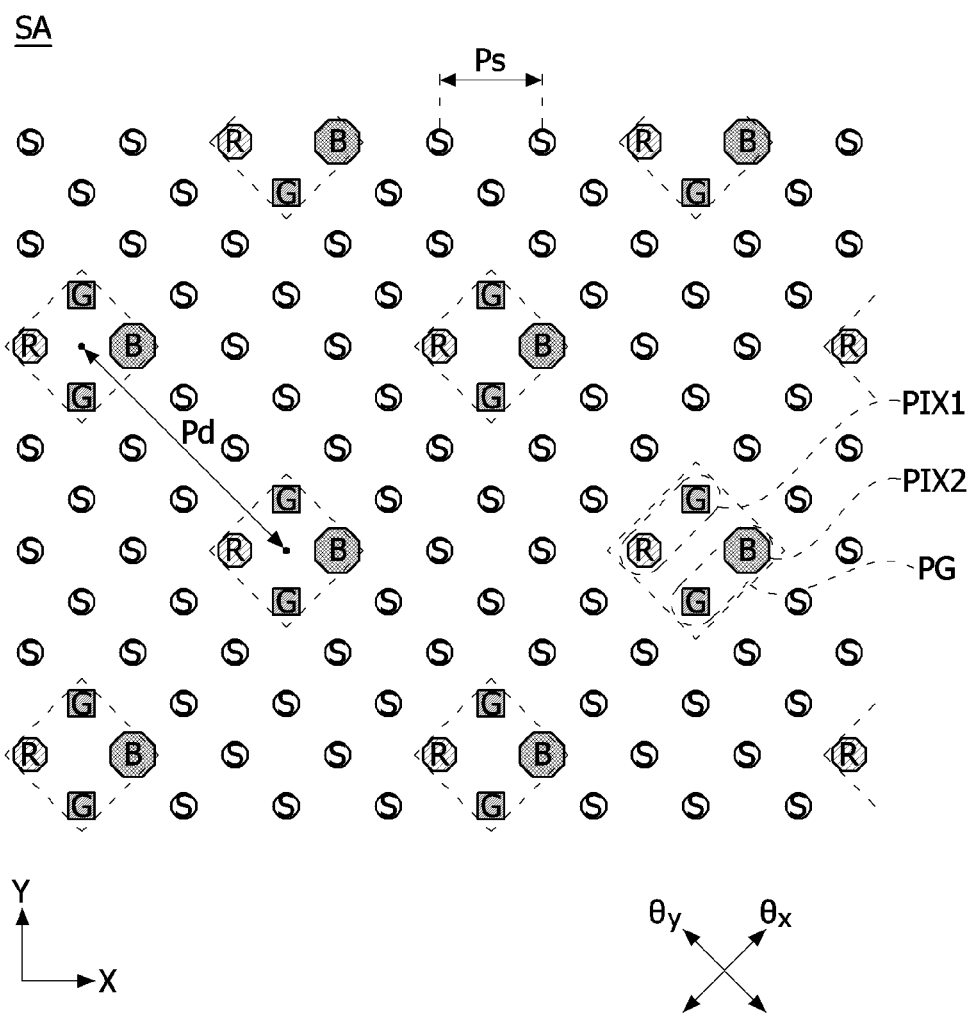
FIG. 5 is a diagram illustrating display pixels and sensor pixels arranged in the first sensing area according to an embodiment of the present disclosure.
Figure 6:
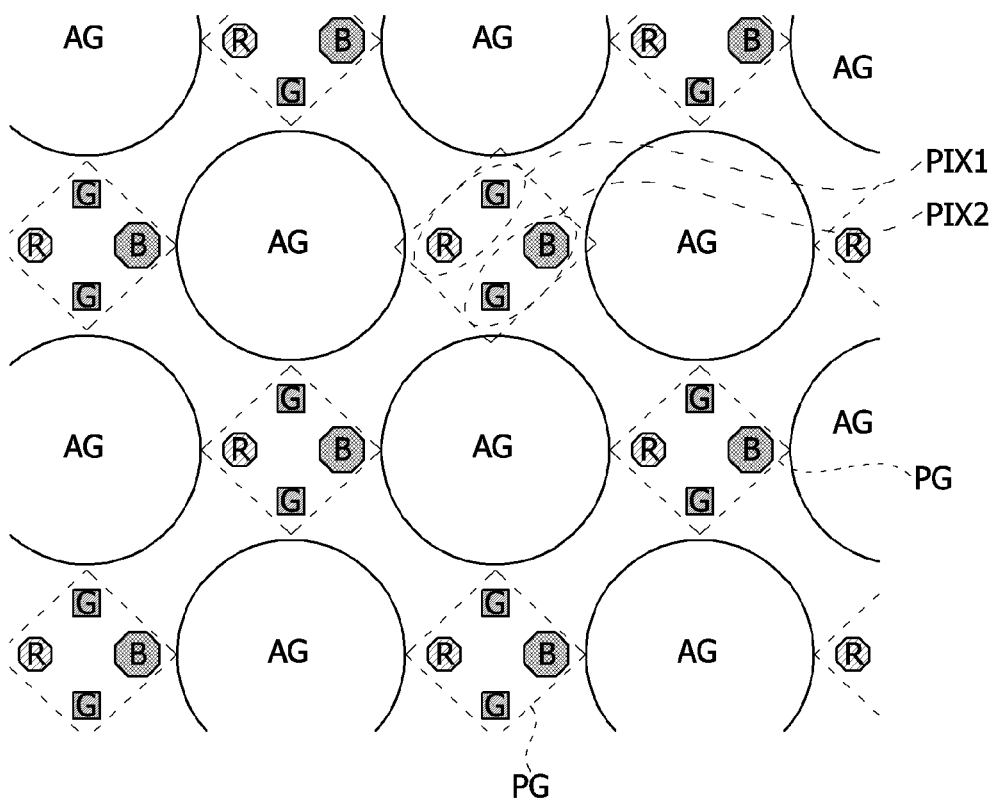
FIG. 6 is a diagram illustrating display pixels and light transmitting portions arranged in the second sensing area according to an embodiment of the present disclosure.

FIG. 4 is a diagram illustrating display pixels arranged in the display area DA according to one embodiment. FIG. 5 is a diagram illustrating display pixels and sensor pixels arranged in the first sensing area SA according to one embodiment. FIG. 6 is a diagram illustrating display pixels and light transmitting portions arranged in the second sensing area CA according to one embodiment. In FIGS. 4 to 6, lines connected to the display pixels and lines connected to the sensor pixels are omitted.

With reference to FIG. 4, the display area DA includes display pixels arranged in a matrix form. Display pixels may be implemented as real color pixels where R, G and B subpixels of three primary colors are configured as one pixel. Also, in the display pixels, two subpixels may be configured as one pixel by using a subpixel rendering algorithm. For example, a first display pixel PIX1 may be composed of R and first G subpixels, and a second display pixel PIX2 may be composed of B and second G subpixels. The insufficient color expression in each of the first and second pixels PIX1 and PIX2 may be compensated with an average value of corresponding color data between neighboring pixels.

With reference to FIG. 5, the first sensing area SA includes display pixel groups PG spaced apart from each other with sensor pixels S interposed therebetween. X and Y indicate orthogonal biaxial directions. $\Theta_x$ and $\Theta_y$ indicate the directions of the inclined axes in which the X and Y axes are rotated by 45°, respectively.

One display pixel group PG may include one or two display pixels. For example, one display pixel group PG may be composed of one display pixel including R, G and B subpixels, or may be composed of two pixels each including two subpixels. In the example of FIGS. 5 and 6, the first display pixel PIX1 may include R and first G subpixels, and the second display pixel PIX2 may include B and second G subpixels.

The distance Pd between neighboring display pixel groups PG is substantially the same in the four directions X, Y, $\Theta_x$ and $\Theta_y$. Hence, the display pixel groups PG of the first sensing area SA are spaced equidistantly in all directions.

The distance between a display pixel group PG and a neighboring sensor pixel is also the same in all directions.

The sensor pixels S of the first sensing area SA are spaced equidistantly in all directions. The distance Pd between the display pixel groups PG is greater than the distance Ps between the sensor pixels S. The distance Ps between neighboring sensor pixels S is substantially the same in the four directions X, Y, $\Theta_x$ and $\Theta_y$. Each of the sensor pixels S includes a photodiode.

With reference to FIG. 6, the second sensing area CA includes display pixel groups PG spaced apart from each other with a light transmitting portion AG interposed therebetween. External light is incident on the light-receiving surface of the optical sensor 30 disposed under the display panel 100 through the light transmitting portions AG.

In the second sensing area CA, one display pixel group PG may include one or two display pixels. For example, one display pixel group PG may be composed of one display pixel including R, G and B subpixels, or may be composed of two pixels each including two subpixels. The first display pixel PIX1 may include R and first G subpixels, and the second display pixel PIX2 may include B and second G subpixels.

The light transmitting portions AG may be made of transparent media only in order to reduce the loss of light incident on the optical sensors 30. The light transmitting portions AG may be made of transparent insulating materials without including metal lines or pixels.

The display pixel resolution of the first and second sensing areas SA and CA is lower than that of the display area DA.

Figure 7:
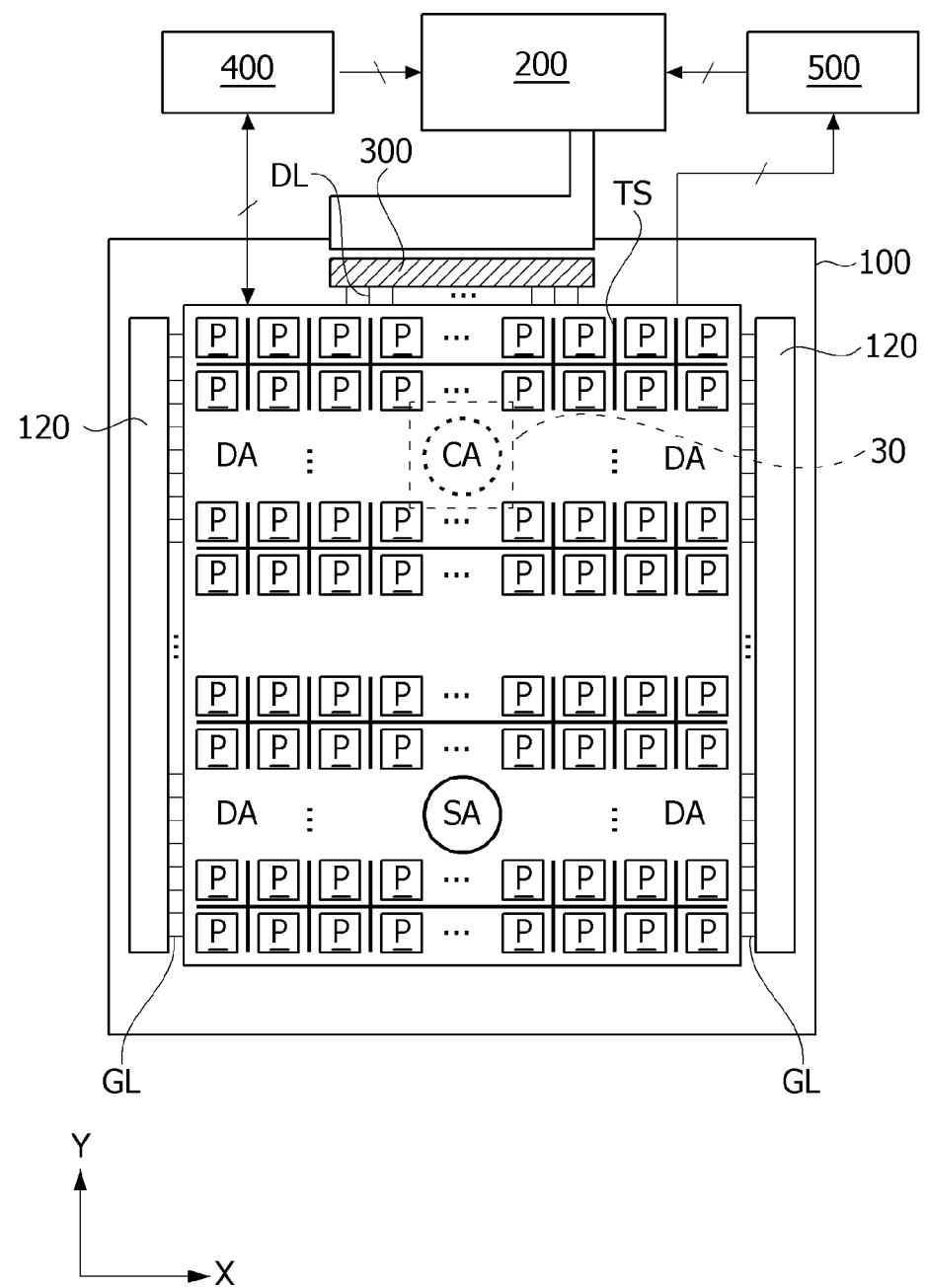
FIG. 7 is a block diagram illustrating a display panel and a display panel driver according to an embodiment of the present disclosure.
Figure 8:
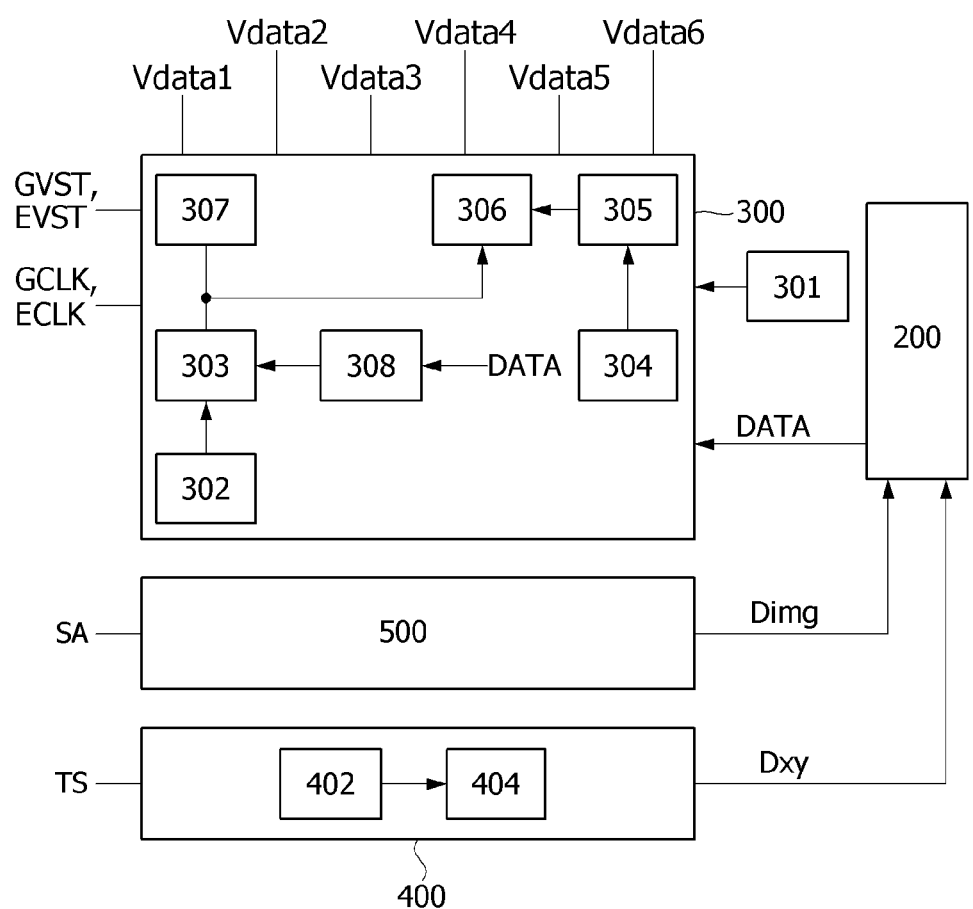
FIG. 8 is a block diagram schematically showing the configuration of a drive integrated circuit (IC) according to an embodiment of the present disclosure.

FIGS. 7 and 8 are diagrams showing a display device according to an embodiment of the present disclosure.

With reference to FIGS. 7 and 8, the display device includes a display panel 100 in which a pixel array is disposed on the screen, a display panel driver, a touch sensor driver 400, a fingerprint recognition processor 500, and the like.

The pixel array of the display panel 100 includes data lines DL, gate lines GL crossing the data lines DL, and display pixels P arranged in a matrix form defined by the data lines DL and gate lines GL. The pixel array may further include power lines for supplying power to the pixels. The pixel array includes the display area DA and sensing areas SA and CA for displaying an input image in the display mode.

The first sensing area SA senses a user's fingerprint pattern by using sensor pixels embedded in the pixel array in the fingerprint recognition mode. Light traveling through the second sensing area CA is incident on the light-receiving surface of the optical sensor 30 disposed under the display panel 100.

The pixel array may be divided into the circuit layer 12 and the light emitting element and sensor layer 14 as shown in FIG. 1. Touch sensor may be disposed on the display area DA and the sensing area SA and CA. The touch sensors may be disposed on the light emitting element and sensor layer 14 in the display area DA and the sensing areas SA and CA.

Each subpixel of the display pixels in the display area DA and the sensing areas SA and CA includes a pixel circuit. The pixel circuit may include a driving element that supplies a current to the light emitting element OLED, a plurality of switch elements for sampling the threshold voltage of the driving element and switching the current paths of the pixel circuit, and a capacitor maintaining the gate voltage of the driving element. Each of the sensor pixels S in the sensing area SA includes an organic photodiode and a sensor driving circuit for driving the photodiode.

While the display pixels in the sensing area SA display input data in the display mode by emitting light according to the data voltage of the pixel data, they are driven as a light source in the fingerprint recognition mode by emitting light with high luminance according to the voltage of the light source driving data. In the fingerprint recognition mode, the light source driving data is set to data unrelated to the pixel data of the input image and is written to the display pixels of the first sensing area SA. Hence, the display pixels in the first sensing area SA may emit light with a luminance corresponding to a grayscale value of the light source driving data in the fingerprint recognition mode.

Figure 13:
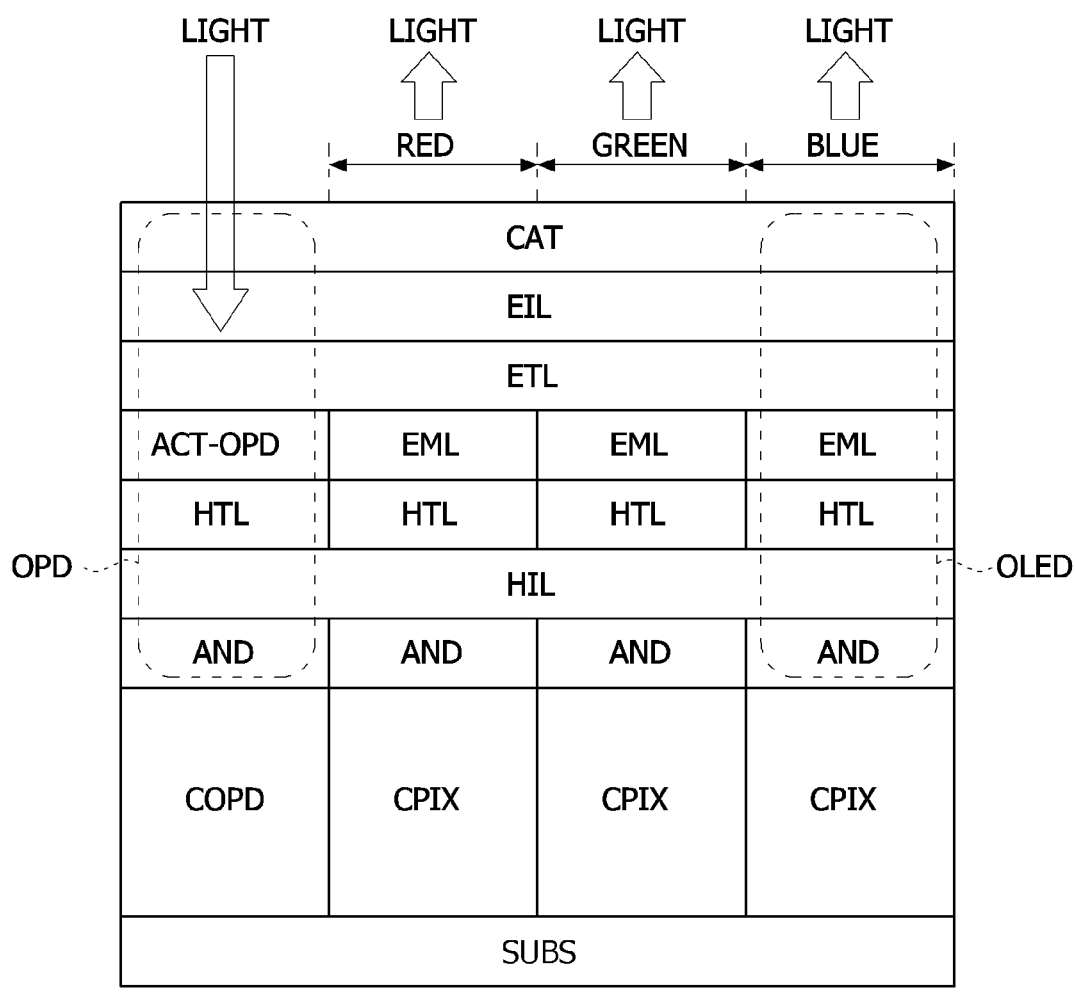
FIG. 13 is a cross-sectional view schematically showing the cross-sectional structure of a sensor pixel and a display pixel according to an embodiment of the present disclosure.

As shown in FIG. 13, the pixel circuit CPIX may be disposed under the light emitting element OLED. The sensor driving circuit COPD may be disposed under the organic light emitting diode OPD.

The display panel driver writes pixel data of an input image to the display pixels P. The display panel driver includes a data driver 306 that supplies a data voltage of pixel data to the data lines DL, and a gate driver 120 that sequentially supplies a gate pulse to the gate lines GL. The data driver 306 may be integrated in a drive IC 300. The data driver 306 may be integrated in the drive IC 300 together with the timing controller 303.

The drive IC 300 may include a data receiving and calculating unit 308, a timing controller 303, a data driver 306, a gamma compensation voltage generator 305, a power supply 304, a second memory 302, and the like. The drive IC 300 may be connected to the host system 200, the first memory 301, and the display panel 100.

The drive IC 300 may be adhered to the display panel 100. The drive IC 300 receives pixel data of an input image and a timing signal from the host system 200, supplies a data voltage of the pixel data to the display pixels through the data lines DL, and synchronizes the data driver 306 and the gate driver 120.

The drive IC 300 is connected to the data lines DL through data output channels, and supplies a data voltage Vdata1~Vdata6 of pixel data DATA to the data lines DL. The drive IC 300 may output a gate timing signal for controlling the gate driver 120 through gate timing signal output channels. The gate timing signal generated from the timing controller 303 may include a start pulse (gate start pulse, VST), a shift clock (gate shift clock, CLK), and the like. The start pulse VST and the shift clock CLK swing between the gate-on voltage VGL and the gate-off voltage VGH. The gate timing signal (VST, CLK) output from the level shifter 307 is applied to the gate driver 120 and controls the shift operation of the gate driver 120.

The gate driver 120 may include a shift register formed on the circuit layer of the display panel 100 together with the pixel array. The shift register of the gate driver 120 supplies a gate signal to the gate lines GL in sequence under the control of the timing controller 30. The gate signal includes a scan pulse applied to the pixel circuit, a pulse of an emission control signal (hereinafter, referred to as "EM pulse"), an exposure signal TG applied to the sensor driving circuit, and the like. The shift register may include a scan driver that outputs a scan pulse and an EM driver that outputs an EM pulse. In FIG. 8, GVST and GCLK are a gate timing signal input to the scan driver. EVST and ECLK are a gate timing signal input to the EM driver.

The data receiving and calculating unit 308 includes a receiving unit for receiving pixel data input as a digital signal from the host system 200, and a data operation unit that processes pixel data input through the receiving unit to improve image quality. The data operation unit may include a data restoration unit that decodes and restores compressed pixel data, and an optical compensation unit that adds a preset optical compensation value to the pixel data. The optical compensation value may be derived for each pixel to compensate for measured luminance variations between the pixels based on the image captured by a camera in the manufacturing process, and may be stored in the memory 301 or 302 in the form of a look-up table.

An external compensation circuit can be applied to the display pixels and the drive IC. In this case, the data receiving and calculating unit 308 may compensate for driving variations and deterioration of the pixels by adding or multiplying the sensing result of the display pixels and the pixel data of the input image together.

The timing controller 303 provides pixel data of an input image received from the host system 200 to the data driver 306. The timing controller 303 generates a gate timing signal for controlling the gate driver 120 and a source timing signal for controlling the data driver 306 to thereby control operation timings of the gate driver 120 and the data driver 306.

The data driver 306 converts the pixel data (digital data) received from the timing controller 303 into a gamma compensation voltage through a digital to analog converter (DAC) to output a data voltage. The data voltage output from the data driver 306 is supplied to the data lines DL of the pixel array through an output buffer connected to the data channel of the drive IC 300.

Figure 25:
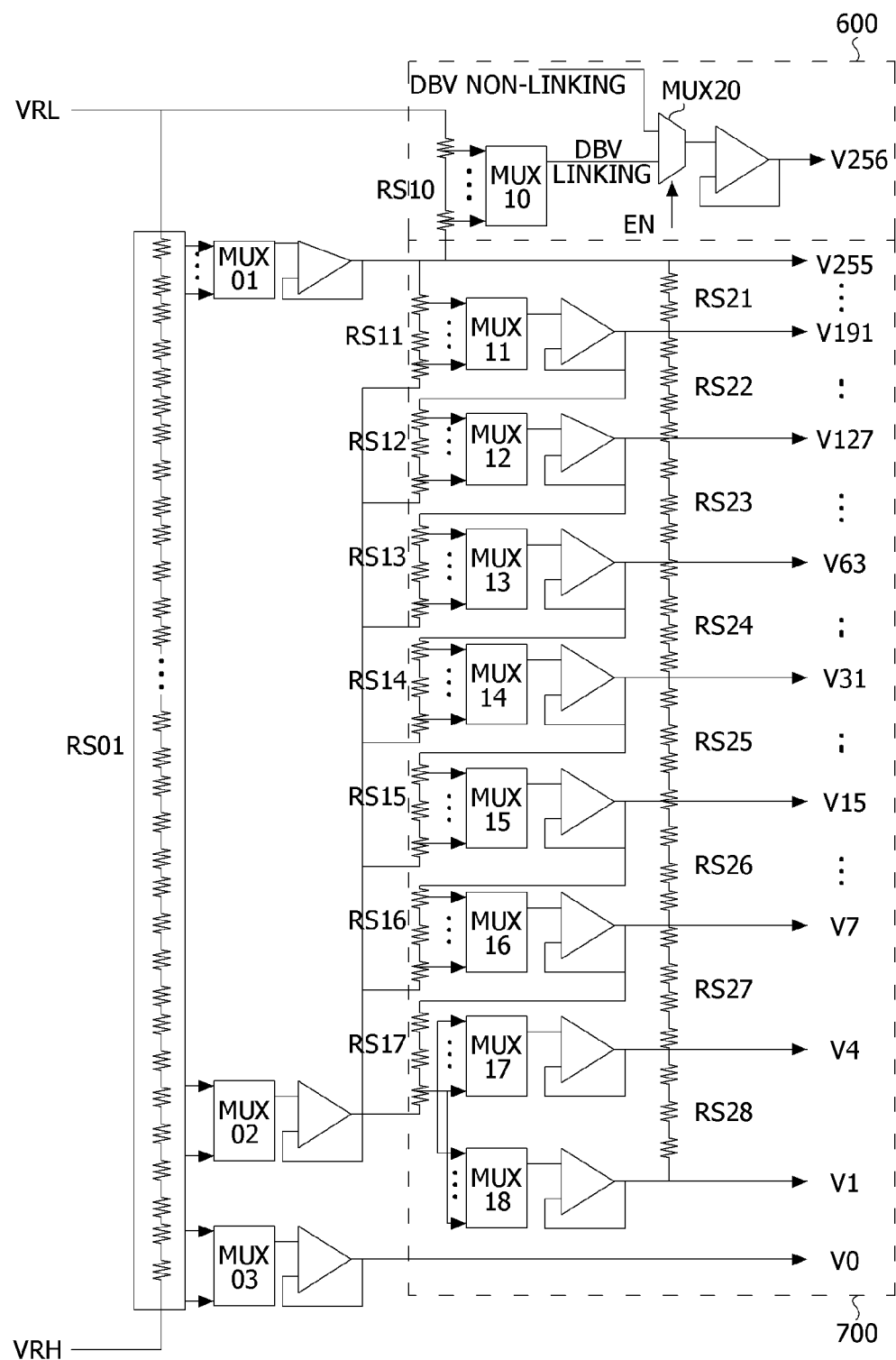
FIG. 25 is a circuit diagram showing a gamma compensation voltage generator according to an embodiment of the present disclosure.

The gamma compensation voltage generator 305 divides the gamma reference voltage from the power supply 304 through a divider circuit to generate a gamma compensation voltage for each grayscale. The gamma compensation voltage is an analog voltage in which a voltage is set for each grayscale of pixel data. The gamma compensation voltage output from the gamma compensation voltage generator 305 is provided to the data driver 306. The gamma compensation voltage generator 305 may be implemented as a programmable voltage generation circuit capable of varying the voltage level of the output voltage according to a resistor setting value as shown in FIG. 25.

The power supply 304 generates power required for driving the pixel array of the display panel 100, the gate driver 120, and the drive IC 300 by using a DC-DC converter. The DC-DC converter may include a charge pump, a regulator, a buck converter, a boost converter, and the like. The power supply 304 may adjust the DC input voltage from the host system 200 to generate DC power, such as gamma reference voltage, gate-on voltage VGL, gate-off voltage VGH, pixel driving voltage ELVDD, low-potential power voltage ELVSS, reference voltage Vref, or initialization voltage Vini. The gamma reference voltage is supplied to the gamma compensation voltage generator 305. The gate-on voltage VGL and the gate-off voltage VGH are supplied to the level shifter 307 and the gate driver 120. Pixel power such as pixel driving voltage ELVDD, low-potential power voltage ELVSS, or initialization voltage Vini is supplied commonly to the pixels P. The pixel driving voltage ELVDD is set to a voltage higher than the low-potential power voltage ELVSS. The initialization voltage Vini and the reference voltage Vref may be set to a voltage that is lower than the pixel driving voltage ELVDD and is lower than or equal to the low-potential power voltage ELVSS.

The second memory 302 stores compensation values, register setting data, and the like received from the first memory 301 when power is supplied to the drive IC 300. The compensation values can be applied to various algorithms for improving image quality. The compensation values may include an optical compensation value. The register setting data is set in advance to control the operations of the data driver 306, the timing controller 303, the gamma compensation voltage generator 305, and the like. The first memory 301 may include a flash memory. The second memory 302 may include a static random-access memory (SRAM).

The host system 200 may be implemented with an application processor (AP). The host system 200 may transmit pixel data of an input image to the drive IC 300 through a mobile industry processor interface (MIPI). The host system 200 may be connected to the drive IC 300 through, for example, a flexible printed circuit (FPC).

The fingerprint recognition processor 500 is connected to the sensor pixels S of the sensing area SA. The fingerprint recognition processor 500 amplifies the output voltage of the sensor pixels S, converts it to digital data by using an analog-to-digital converter (ADC), and generates fingerprint pattern data Dimg. In the fingerprint recognition mode, the host system 200 receives the fingerprint pattern data Dimg from the fingerprint recognition processor 500 and performs fingerprint authentication based on the result of comparing it with a previously registered fingerprint image.

The touch sensor TS may be implemented with a capacitive type touch sensor, for example, a mutual capacitance sensor or a self-capacitance sensor. Self-capacitance is formed along a single-layered conductor line formed in one direction. Mutual capacitance is formed between two orthogonal conductor lines. The touch sensor TS may be implemented with a mesh-type wiring to increase light transmittance.

The touch sensor driver 400 applies a driving signal to the touch sensor TS, senses a change in capacitance of the touch sensor TS, and outputs touch data when the change in capacitance is greater than or equal to a preset threshold. The touch data includes coordinate information of each touch input. The touch data is transmitted to the host system 200. The host system 200 executes a command or an application program corresponding to the touch input.

The touch sensor driver 400 includes a sensing unit 402 and a touch recognition unit 404. The sensing unit 402 includes a driver that applies a sensor driving signal to the touch sensor TS, an amplifier that amplifies the signal of the touch sensor TS, an integrator that accumulates the output voltage of the amplifier, and an ADC that converts the voltage of the integrator into digital data. The digital data output from the ADC represents a change in capacitance of the touch sensor TS before and after the touch input. The touch recognition unit 404 compares the touch data received from the sensing unit with a preset threshold value, detects touch data higher than the threshold value, and generates the coordinates Dxy of each touch input. The touch sensor driver 400 transmits touch data Dxy indicating the location of each touch input to the host system 200. The touch recognition unit 400 may be implemented with, but not limited to, a micro control unit (MCU).

The display panel 100 may be implemented with a flexible panel applicable to a flexible display. The flexible display can be changed in screen size by winding, folding or bending the flexible panel, and can be easily manufactured in various designs. The flexible display may be implemented as a rollable display, a foldable display, a bendable display, a slideable display, or the like. A flexible panel may be made of so-called "plastic OLED panel". The plastic OLED panel may include a backplane and a pixel array disposed on an organic thin film on the backplane.

The backplane may be a polyethylene terephthalate (PET) substrate. The pixel array and the touch sensor array may be formed on the organic thin film substrate. The backplane can block or at least reduce moisture permeation toward the organic thin film so that the pixel array is not exposed to humidity. The organic thin film substrate may be a polyimide (PI) film substrate. A multi-layered buffer film (not shown) made of an insulating material may be formed on the organic thin film substrate. The circuit layer 12 and the light emitting element and sensor layer 14 may be stacked on the organic thin film.

In the display device of the present disclosure, the pixel circuit CPIX, the sensor driving circuit COPD, and the gate driver 120 disposed on the circuit layer 12 may include a plurality of transistors. The transistors may be implemented with an oxide thin film transistor (oxide TFT) including an oxide semiconductor, or a low temperature polysilicon (LTPS) TFT including LTPS. Each of the transistors can be implemented with a p-channel TFT or an n-channel TFT.

The transistor is a three-electrode element including a gate, a source, and a drain. The source is an electrode that supplies carriers to the transistor. Within the transistor, carriers start to flow from the source. The drain is an electrode through which carriers exit from the transistor. In the transistor, carriers flow from the source to the drain. In the case of an n-channel transistor, as carriers are electrons, the source voltage has a voltage lower than the drain voltage so that electrons can flow from the source to the drain. In the n-channel transistor, a current flows in a direction from the drain to the source. In the case of a p-channel transistor (PMOS), as carriers are holes, the source voltage is higher than the drain voltage so that holes can flow from the source to the drain. In the p-channel transistor, as holes flow from the source to the drain, a current flows from the source to the drain. It should be noted that the source and the drain of the transistor are not fixed. For example, the source and the drain may be changed according to an applied voltage. Therefore, the present disclosure is not limited due to the source and drain of the transistor. In the following description, the source and drain of the transistor will be referred to as first and second electrodes.

The gate pulse swings between a gate-on voltage and a gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, but it is turned off in response to the gate-off voltage. In the case of an n-channel transistor, the gate-on voltage may be a gate high voltage VGH, and the gate-off voltage may be a gate low voltage VGL. In the case of a p-channel transistor, the gate-on voltage may be a gate low voltage VGL, and the gate-off voltage may be a gate high voltage VGH.

The driving element of the pixel circuit may be implemented with a transistor. The driving element should have uniform electrical characteristics among all pixels, but there may be differences between pixels due to process variations and variations in element characteristics, and it may change according to the lapse of display driving time. To compensate for variations in electrical characteristics of the driving element, the display device may include an internal compensation circuit and an external compensation circuit. The internal compensation circuit is added to the pixel circuit at each of the subpixels, and samples the threshold voltage Vth and/or the mobility μ of the driving element, which vary according to the electrical characteristics of the driving element, and compensates the change in real time. The external compensation circuit transmits a threshold voltage and/or mobility of the driving element sensed through a sensing line connected to each of the subpixels to an external compensation unit. The compensation unit of the external compensation circuit compensates for changes in electrical characteristics of the driving element by modulating the pixel data of the input image in consideration of the sensing result. The external compensation circuit senses a voltage of the pixel that changes according to electrical characteristics of the driving element, and modulates the data of an input image in an external circuit based on the sensed voltage, thereby compensating for variations in electrical characteristics of the driving element between pixels.

Figure 9:
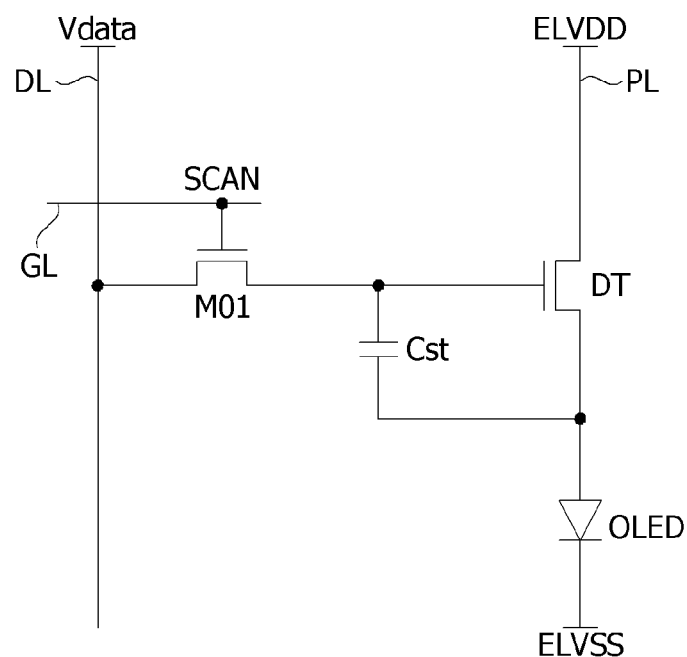
FIGS. 9 to 11 are circuit diagrams showing various pixel circuits applicable to the pixel circuit of the present disclosure.
Figure 10:
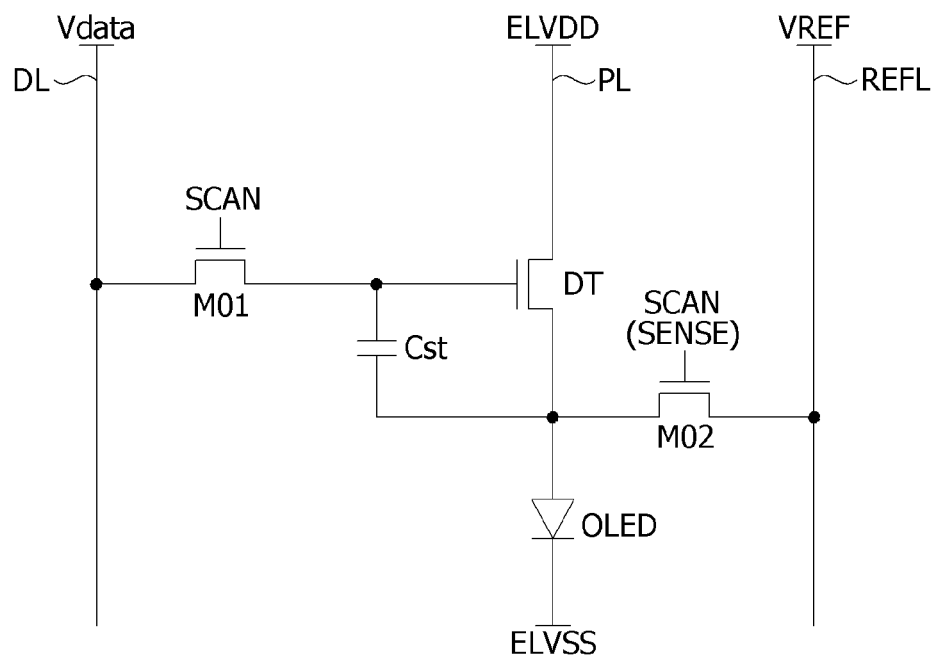
Figure 11:
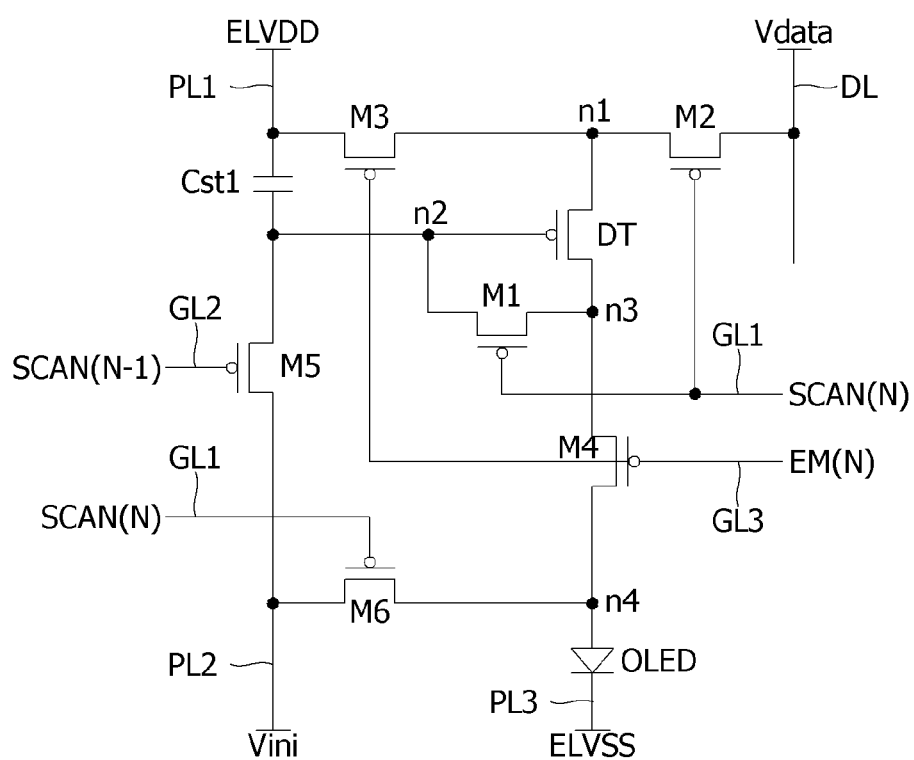

FIGS. 9 to 11 are circuit diagrams showing various pixel circuits applicable to the pixel circuit of the present disclosure.

With reference to FIG. 9, the pixel circuit includes a light emitting element OLED, a driving element DT that supplies a current to the light emitting element OLED, a switch element M01 connecting the data line DL in response to the scan pulse SCAN, and a capacitor Cst connected to the gate of the driving element DT.

The pixel driving voltage ELVDD is applied through the power line PL to the first electrode (or driving drain) of the driving element. The driving element DT drives the light emitting element OLED by supplying a current to the light emitting element OLED according to the gate-source voltage Vgs. When the forward voltage between the anode electrode and the cathode electrode is higher than or equal to the threshold voltage, the light emitting element OLED is turned on to emit light. The capacitor Cst is connected between the gate electrode and the source electrode of the driving element DT to maintain the gate-source voltage Vgs of the driving element DT.

FIG. 10 shows an example of a pixel circuit connected to an external compensation circuit.

With reference to FIG. 10, the pixel circuit further includes a second switch element M02 connected between the reference voltage line REFL and the second electrode (or source) of the driving element DT. The second switch element M02 applies the reference voltage Vref in response to the scan pulse SCAN or a separate sensing pulse SENSE.

In the sensing mode, a current flowing through the channel of the driving element DT or a node voltage between the driving element DT and the light emitting element OLED is sensed through the reference line REFL. The current flowing through the reference line REFL is converted into a voltage through an integrator and the voltage is converted into digital data through an ADC. This digital data is sensing data including information on the threshold voltage or mobility of the driving element DT. The sensing data is transmitted to the data receiving and calculating unit 308.

Figure 12:
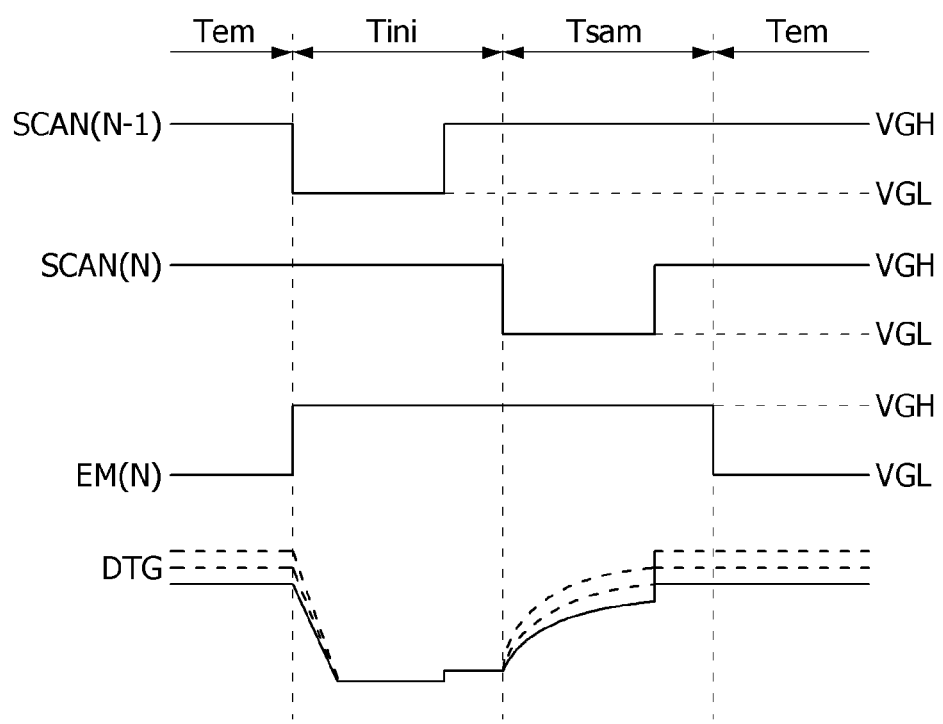
FIG. 12 is a waveform diagram depicting a method for driving the pixel circuit shown in FIG. 11 according to an embodiment of the present disclosure.

FIG. 11 is a circuit diagram showing an example of a pixel circuit to which an internal compensation circuit is applied. FIG. 12 is a diagram illustrating a method of driving the pixel circuit shown in FIG. 11. The pixel circuit illustrated in FIG. 11 may be equally applied to display pixels in the display area DA and the sensing areas SA and CA.

With reference to FIGS. 11 and 12, the pixel circuit includes a light emitting element OLED, a driving element DT for supplying a current to the light emitting element OLED, and a switch circuit for switching voltages applied to the light emitting element OLED and the driving element DT.

The switch circuit is connected to the power lines PL1, PL2 and PL3 to which the pixel driving voltage ELVDD, the low-potential power voltage ELVSS and the initialization voltage Vini are applied, the data line DL, and the gate lines GL1, GL2 and GL3, and it switches the voltage applied to the light emitting element OLED and the driving element DT in response to the scan pulse SCAN(N−1) or SCAN(N) and the EM pulse EM(N).

The switch circuit includes an internal compensation circuit that samples the threshold voltage Vth of the driving element DT by using a plurality of switch elements M1 to M6 and stores it in the capacitor Cst1, and compensates for the gate voltage of the driving element DT as much as the threshold voltage Vth of the driving element DT. Each of the driving element DT and the switch elements M1 to M6 may be implemented with a p-channel TFT.

The driving period of the pixel circuit may be divided into an initialization period Tini, a sampling period Tsam, and an emission period Tem as shown in FIG. 12.

The $N^{th}$ scan pulse SCAN(N) is generated as the gate-on voltage VGL during the sampling period Tsam and is applied to the first gate line GL1. The $N-1^{th}$ scan pulse SCAN(N−1) is generated as the gate-on voltage VGL during the initialization period Tini prior to the sampling period and is applied to the second gate line GL2. The EM pulse EM(N) is generated as the gate-off voltage VGH during the initialization period Tini and the sampling period Tsam and is applied to the third gate line GL3.

During the initialization period Tini, the $N-1^{th}$ scan pulse SCAN(N−1) is generated as the gate-on voltage VGL, and the voltage of each of the $N^{th}$ scan pulse SCAN(N) and the EM pulse EM(N) is the gate-off voltage VGH. During the sampling period Tsam, the $N^{th}$ scan pulse SCAN(N) is generated as a pulse of the gate-on voltage (VGL), and the voltage of each of the $N-1^{th}$ scan pulse SCAN(N−1) and the EM pulse EM(N) is the gate-off voltage VGH. During at least some of the emission period Tem, the EM pulse EM(N) is generated as the gate-on voltage VGL, and the voltage of each of the $N-1^{th}$ scan pulse SCAN(N−1) and the $N^{th}$ scan pulse SCAN(N) is generated as the gate-off voltage VGH.

During the initialization period Tini, the fifth switch element M5 is turned on according to the gate-on voltage VGL of the $N-1^{th}$ scan pulse SCAN(N−1), initializing the pixel circuit. During the sampling period Tsam, the first and second switch elements M1 and M2 are turned on according to the gate-on voltage VGL of the $N^{th}$ scan pulse SCAN(N), and the data voltage Vdata compensated as much as the threshold voltage of the driving element DT is stored in the capacitor Cst1. At the same time, the sixth switch element M6 is turned on during the sampling period Tsam and lowers the voltage of the fourth node n4 to the reference voltage Vref, suppressing the emission of the light emitting element OLED.

During the emission period Tem, the third and fourth switch elements M3 and M4 are turned on and the light emitting element OLED emits light. During the emission period Tem, to accurately express the luminance of the low grayscale, the voltage level of the EM pulse EM(N) may be inverted at a preset duty ratio between the gate-on voltage VGL and the gate-off voltage VGH. In this case, the third and fourth switch elements M3 and M4 may be repeatedly turned on and off according to the duty ratio of the EM pulse EM(N) during the emission period Tem.

The light emitting element OLED may be implemented with an organic light emitting diode or an inorganic light emitting diode. Hereinafter, a description is given of an example in which the light emitting element OLED is implemented with an organic light emitting diode.

The anode electrode of the light emitting element OLED is connected to the fourth node n4 between the fourth and sixth switch elements M4 and M6. The fourth node n4 is connected to the anode electrode of the light emitting element OLED, the second electrode of the fourth switch element M4, and the second electrode of the sixth switch element M6. The cathode electrode of the light emitting element OLED is connected to the VSS line PL3 to which the low-potential power voltage ELVSS is applied. The light emitting element OLED emits light with a current Ids flowing according to the gate-source voltage Vgs of the driving element DT. The current path of the light emitting element OLED is switched by the third and fourth switch elements M3 and M4.

The capacitor Cst1 is connected between the VDD line PL1 and the second node n2. The data voltage Vdata compensated as much as the threshold voltage Vth of the driving element DT is charged in the capacitor Cst1. As the data voltage Vdata is compensated as much as the threshold voltage Vth of the driving element DT at each of the subpixels, characteristic variations of the driving element DT are compensated for at the subpixels.

The first switch element M1 is turned on in response to the gate-on voltage VGL of the $N^{th}$ scan pulse SCAN(N) to thereby connect the second node n2 and the third node n3. The second node n2 is connected to the gate electrode of the driving element DT, the first electrode of the capacitor Cst1, and the first electrode of the first switch element M1. The third node n3 is connected to the second electrode of the driving element DT, the second electrode of the first switch element M1, and the first electrode of the fourth switch element M4. The gate electrode of the first switch element M1 is connected to the first gate line GL1 to receive the $N^{th}$ scan pulse SCAN(N). The first electrode of the first switch element M1 is connected to the second node n2, and the second electrode of the first switch element M1 is connected to the third node n3.

As the first switch element M1 is turned on for very short one horizontal period (1H) in which the $N^{th}$ scan pulse SCAN(N) is generated as the gate-on voltage VGL in one frame period, a leakage current may occur in the off state. To suppress the leakage current of the first switch element M1, the first switch element M1 may be implemented with a transistor having a dual gate structure in which two transistors M1a and M1b are connected in series.

The second switch element M2 is turned on in response to the gate-on voltage VGL of the $N^{th}$ scan pulse SCAN(N) to thereby supply the data voltage Vdata to the first node n1. The gate electrode of the second switch element M2 is connected to the first gate line GL1 to receive the $N^{th}$ scan pulse SCAN(N). The first electrode of the second switch element M2 is connected to the first node n1. The second electrode of the second switch element M2 is connected to the data line DL to which the data voltage Vdata is applied. The first node n1 is connected to the first electrode of the second switch element M2, the second electrode of the third switch element M3, and the first electrode of the driving element DT.

The third switch element M3 is turned on in response to the gate-on voltage VGL of the EM pulse EM(N) to thereby connect the VDD line PL1 to the first node n1. The gate electrode of the third switch element M3 is connected to the third gate line GL3 to receive the EM pulse EM(N). The first electrode of the third switch element M3 is connected to the VDD line PL1. The second electrode of the third switch element M3 is connected to the first node n1.

The fourth switch element M4 is turned on in response to the gate-on voltage VGL of the EM pulse EM(N) to thereby connect the third node n3 to the anode electrode of the light emitting element OLED. The gate electrode of the fourth switch element M4 is connected to the third gate line GL3 to receive the EM pulse EM(N). The first electrode of the fourth switch element M4 is connected to the third node n3, and the second electrode is connected to the fourth node n4.

The fifth switch element M5 is turned on in response to the gate-on voltage VGL of the N-1$^{th}$ scan pulse SCAN(N-1) to thereby connect the second node n2 to the Vini line PL2. The gate electrode of the fifth switch element M5 is connected to the second gate line GL2 to receive the N-1$^{th}$ scan pulse SCAN(N-1). The first electrode of the fifth switch element M5 is connected to the second node n2, and the second electrode is connected to the Vini line PL2. To suppress the leakage current of the fifth switch element M5, the fifth switch element M5 may be implemented with a transistor having a dual gate structure in which two transistors M5$a$ and M5$b$ are connected in series.

The sixth switch element M6 is turned on in response to the gate-on voltage VGL of the N$^{th}$ scan pulse SCAN(N) to thereby connect the Vini line PL2 to the fourth node n4. The gate electrode of the sixth switch element M6 is connected to the first gate line GL1 to receive the N$^{th}$ scan pulse SCAN(N). The first electrode of the sixth switch element M6 is connected to the Vini line PL2, and the second electrode is connected to the fourth node n4.

The gate electrodes of the fifth and sixth switch elements M5 and M6 may be commonly connected to the second gate line GL2 to which the N-1$^{th}$ scan pulse SCAN(N-1) is applied. In this case, the fifth and sixth switch elements M5 and M6 may be turned on at the same time in response to the N-1$^{th}$ scan pulse SCAN(N-1).

The driving element DT drives the light emitting element OLED by adjusting the current flowing through the light emitting element OLED according to the gate-source voltage Vgs. The driving element DT includes a gate electrode connected to the second node n2, a first electrode connected to the first node n1, and a second electrode connected to the third node n3.

During the initialization period Tini, the N-1$^{th}$ scan pulse SCAN(N-1) is generated as the gate-on voltage VGL. The N$^{th}$ scan pulse SCAN(N) and the EM pulse EM(N) maintain the gate-off voltage VGH during the initialization period Tini. Hence, the fifth switch element M5 is turned on during the initialization period Tini, so that the second and fourth nodes n2 and n4 are initialized to Vini. A hold period Th may be configured between the initialization period Tini and the sampling period Tsam. In the hold period Th, the scan pulses SCAN(N-1) and SCAN(N) and the EM pulse EM(N) are at the gate-off voltage VGH.

During the sampling period Tsam, the N$^{th}$ scan pulse SCAN(N) is generated as the gate-on voltage VGL. The pulse of the N$^{th}$ scan pulse SCAN(N) is synchronized with the data voltage Vdata of the N$^{th}$ pixel line. The N-1$^{th}$ scan pulse SCAN(N-1) and the EM pulse EM(N) maintain the gate-off voltage VGH during the sampling period Tsam. Hence, the first and second switch elements M1 and M2 are turned on during the sampling period Tsam.

During the sampling period Tsam, the gate voltage DTG of the driving element DT is raised due to the current flowing through the first and second switch elements M1 and M2. When the driving element DT is turned off, the gate voltage DTG is Vdata−|Vth|. Here, the voltage of the first node n1 is also Vdata−|Vth|. During the sampling period Tsam, the gate-source voltage Vgs of the driving element DT is |Vgs|=Vdata−(Vdata−|Vth|)=|Vth|.

During the emission period Tem, the EM pulse EM(N) may be generated as the gate-on voltage VGL. During the emission period Tem, the voltage of the EM pulse EM(N) may be inverted at a preset duty ratio. Hence, the EM pulse EM(N) may be generated as the gate-on voltage VGL during at least some of the emission period Tem.

When the EM pulse EM(N) is at the gate-on voltage VGL, a current flows between the ELVDD and the light emitting element OLED, so that the light emitting element OLED may emit light. During the emission period Tem, the N-1$^{th}$ and N$^{th}$ scan pulses SCAN(N-1) and SCAN(N) maintain the gate-off voltage VGH. During the emission period Tem, the third and fourth switch elements M3 and M4 are turned on according to the gate-on voltage VGL of the EM pulse EM(N). When the EM pulse EM(N) is at the gate-on voltage VGL, the third and fourth switch elements M3 and M4 are turned on, so that a current flows through the light emitting element OLED. Here, Vgs of the driving element DT is |Vgs|=ELVDD−(Vdata−|Vth|), and the current flowing through the light emitting element OLED is K(VDD−Vdata)$^2$, where K is a constant value determined according to the charge mobility, parasitic capacitance, and channel capacity of the driving element DT.

FIG. 13 is a cross-sectional view schematically showing the cross-sectional structure of a sensor pixel and a display pixel according to an embodiment of the present disclosure.

With reference to FIG. 13, the sensor pixel may include an organic photodiode (OPD). The organic photodiode OPD may be implemented with substantially the same structure as the light emitting element OLED.

The light emitting element OLED includes an organic compound layer sandwiched between the anode electrode AND and the cathode electrode CAT. The anode electrode AND of the light emitting element OLED may be connected to the pixel circuit CPIX. The anode electrode AND of the light emitting element OLED is formed in an independent pattern separated between subpixels in each of the display pixels. The cathode electrode CAT is a common electrode connected to the display pixels and the sensor pixel. The organic compound layer of the light emitting element OLED may include, but not limited to, a hole injection layer HIL, a hole transport layer HTL, an emission layer EML, an electron transport layer ETL, and an electron injection layer EIL. The hole injection layer HID may be in contact with the anode electrode AND, and the electron injection layer EIL may be in contact with the cathode electrode CAT.

The organic photodiode OPD includes an organic compound layer sandwiched between the anode electrode AND and the cathode electrode CAT. The anode electrode AND of the organic photodiode OPD may be connected to the sensor driving circuit COPD. The anode electrode AND of the organic photodiode OPD is formed in an independent pattern separated in each of the sensor pixels. The organic compound layer of the organic photodiode OPD may include, but not limited to, a hole injection layer HIL, a hole transport layer HTL, an active layer ACT-OPD, an electron transport layer ETL, and an electron injection layer EIL. The electron injection layer EIL, the electron transport layer ETL, and the hole injection layer HIT may be shared by the display pixel and the sensor pixel. The active layer ACT-OPD includes an organic semiconductor material.

The active layer ACT-OPD of the organic photodiode OPD may use, but not limited to, an organic semiconductor material coatable by a solution process, for example, a compound of one or more organic materials among P3HT: PC61BM, squaraine:PC61BM, C60, PBDTTT-C:PC71BM, PDPP3T:PC71BM, PCDTBT:PC61BM, PVK:PC71BM, PCDTBT:PC71BM, ZnO:F8T2, PBDT-TFTTE:PC71BM, P3HT:PC61BM, TAPC:C60, P3HT:PC60BM, PFBT2OBT: PC71BM, PIDT-TPD:PC61BM, P3HT:PC71BM, PV-D4650:PC61BM, P3HT:O-IDTBR, and 2,9-dimethylquinacridone (2,9-DMQA). Compared to an inorganic semiconductor material formed in a high-temperature deposition process, as the organic semiconductor material can be processed at a relatively low temperature in a solution process, the manufacturing cost can be reduced and it can be applied to a flexible display.

The low-potential power voltage ELVDD and the pixel driving voltage ELVDD may be commonly applied to the pixel circuit CPIX and the sensor driving circuit COPD. The cathode electrode CAT of the light emitting element OLED and the cathode electrode CAT of the photodiode OPD may share the same metal electrode, and may be commonly connected to the VS S line PL3. The anode electrode AND of the light emitting element OLED and the anode electrode AND of the photodiode OPD may be divided by metal patterns formed on the same layer. The anode electrode AND of the light emitting element OLED and the anode electrode AND of the organic photodiode OPD are electrically separated.

As can be seen in FIG. 13, the organic photodiode OPD has substantially the same cross-sectional structure as the light emitting element OLED, and most layers may be made of the same material as the light emitting element OLED. The organic photodiode OPD and the light emitting element CAT may be shared, and may share power lines and gate lines. Hence, the light emitting element OLED and the organic photodiode OPD may be formed in the same manufacturing process, and since they have the same cross-sectional structure, most circuit components may be shared, thereby simplifying the structure of the display panel.

Figure 14:
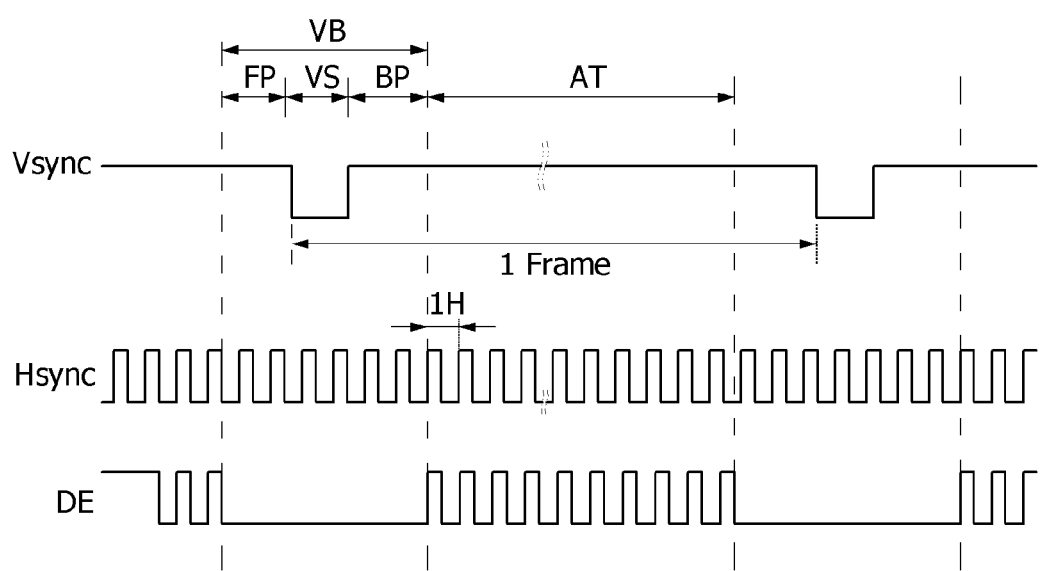
FIG. 14 is a diagram showing in detail an active period and a vertical blank period in one frame period according to an embodiment of the present disclosure.

FIG. 14 is a diagram showing in detail an active period and a vertical blank period in one frame period. In FIG. 14, the vertical synchronization signal Vsync, the horizontal synchronization signal Vsync, and the data enable signal DE are timing signals synchronized with the input video signal. Such a timing signal may be generated from the host system, synchronized with the input video signal, and input to the timing controller of the display device. In a mobile device, the above timing signal may be generated in a simpler format.

With reference to FIG. 14, one frame period (1 frame) is divided into an active interval AT in which pixel data of an input image is input from the host system 200 and a vertical blank interval VB without pixel data. During the active interval AT, one frame of pixel data to be written to all pixels on the screen AA of the display panel 100 is received by the drive IC 300 and written to the pixels P.

The vertical blank interval VB is a blank period in which pixel data is not received by the drive IC 300 between the active interval AT of the N–1$^{th}$ frame period (N is a natural number) and the active interval AT of the N$^{th}$ frame period. The vertical blank interval VB includes a vertical sync time VS, a vertical front porch FP, and a vertical back porch BP.

The vertical synchronization signal Vsync defines one frame period. The horizontal synchronization signal Hsync defines one horizontal period 1H. The data enable signal DE defines a period of valid data including pixel data to be displayed on the screen. The pulse of the data enable signal DE is synchronized with pixel data to be written to the pixels of the display panel 100. One pulse period of the data enable signal DE is one horizontal period 1H.

Figure 15:
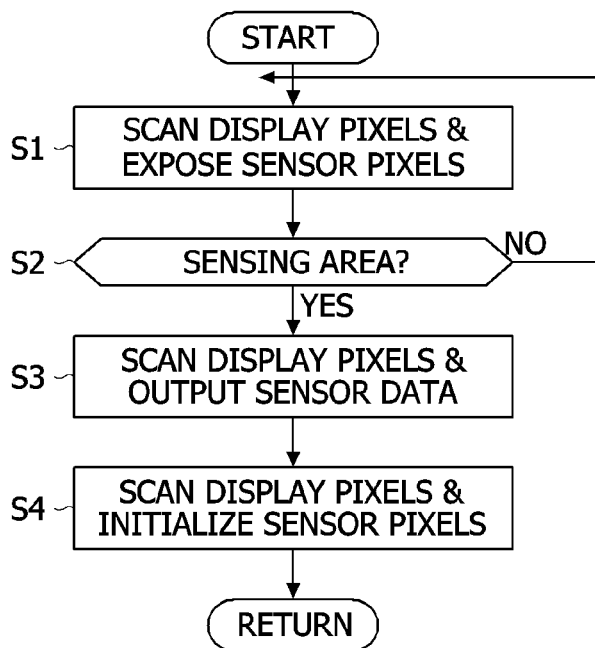
FIGS. 15 and 16 are a diagram illustrating a method for driving a display device according to an embodiment of the present disclosure.
Figure 16:
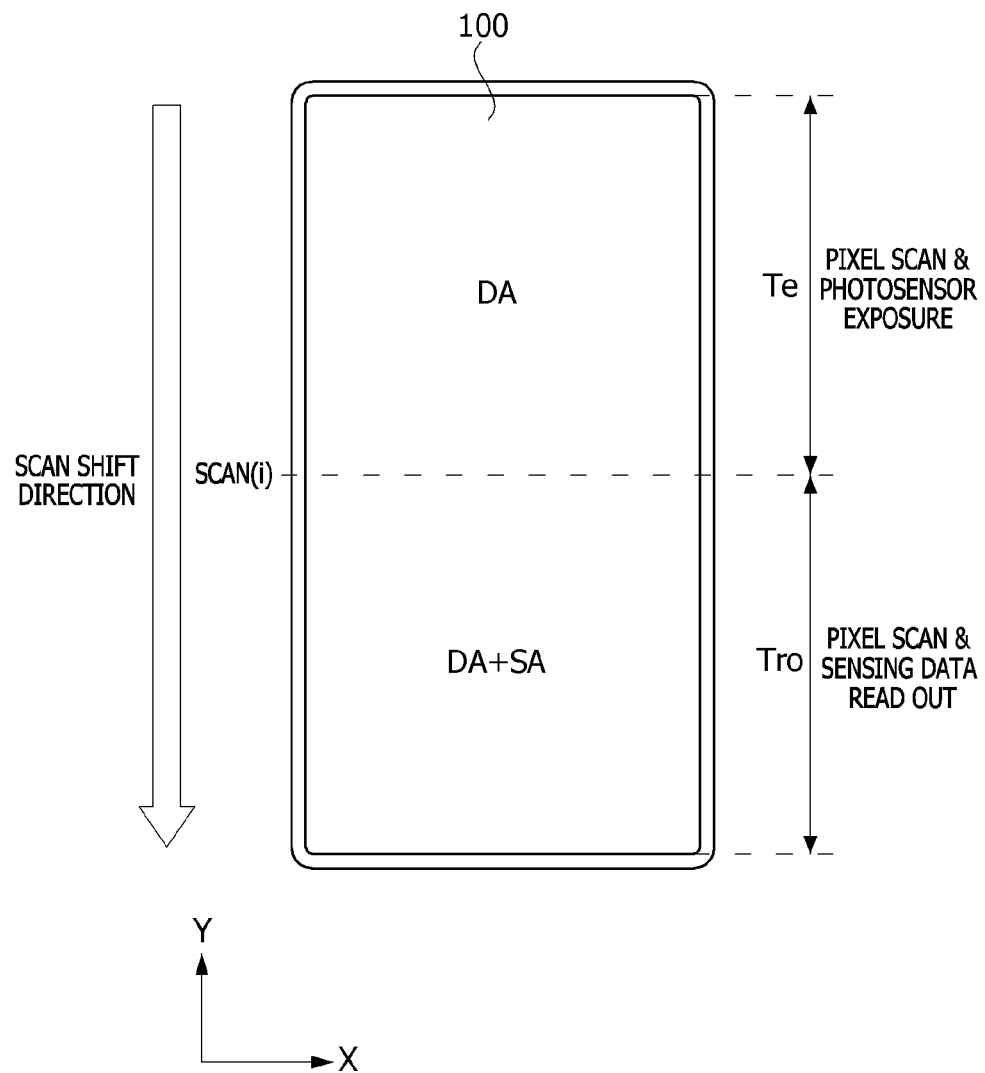

FIGS. 15 and 16 are a diagram illustrating a method for driving a display device according to an embodiment of the present disclosure.

With reference to FIGS. 15 and 16, the display device of the present disclosure may determine the pixel position to which pixel data currently being input is to be written by counting the timing signal synchronized with an input image.

The display device sequentially scans the display pixels of the display panel 100 in units of pixel lines to write pixel data to the display pixels.

Some of the pixel lines of the display panel 100 may include display pixels of the display area DA and display pixels of the first sensing area SA sharing gate lines. In FIG. 16, "SCAN shift direction" indicates the shift direction of the scan pulse. Display pixels are sequentially driven in units of pixel lines along the shift direction of the scan pulse, so that pixel data is sequentially written to the pixel lines. The display pixels of the first sensing area SA and the display area DA may be driven simultaneously at some pixel lines by sharing gate lines to which the scan pulse is applied.

The display pixels of the display area DA are scanned before reaching the first sensing area SA.

The sensor pixels may be exposed for a preset exposure time Te, next output a photoelectric conversion signal (sensor data), and then be initialized. The sensor pixels may be exposed within the scan period in which only the display pixels of the display area DA are driven. Hence, the sensor pixels are exposed to light, and at the same time the display pixels of the display area DA are scanned, so that pixel data may be written to the display pixels (S1).

In the process of sequentially shifting scan pulses in the display area DA, when a pixel line including the sensor pixels of the sensing area SA (e.g., pixel line to which the i$^{th}$ scan pulse SCAN(i) (i is a positive integer greater than 2) is applied) is scanned, the display pixels are scanned and at the same time output signals (i.e., sensor data) of the sensor pixels may be read out through the RX line RXL. The sensor driving circuit COPD of the sensor pixels S is driven in a source follower mode to output sensor data to the RX line RXL. Hence, during the output and initialization time Tro of the sensor pixels after the exposure time Te of the sensor pixels, the display pixels are scanned and pixel data is written to the display pixels, and at the same time sensor data may be output from the sensor pixels (S2 and S3).

In the pixel lines including the first sensing area SA, the sensor pixel may be initialized to the initialization voltage Vini. When the sensor pixel is initialized, pixel data may be written to the display pixels that share the gate line with the sensor pixel. In the pixel lines including the sensor pixels of the first sensing area SA, the sensor pixels output sensor data in sequence pixel line by pixel line according to scan pulses that are shifted sequentially and then are initialized, and the display pixels are scanned in sequence pixel line by pixel line (S4).

Figure 17:
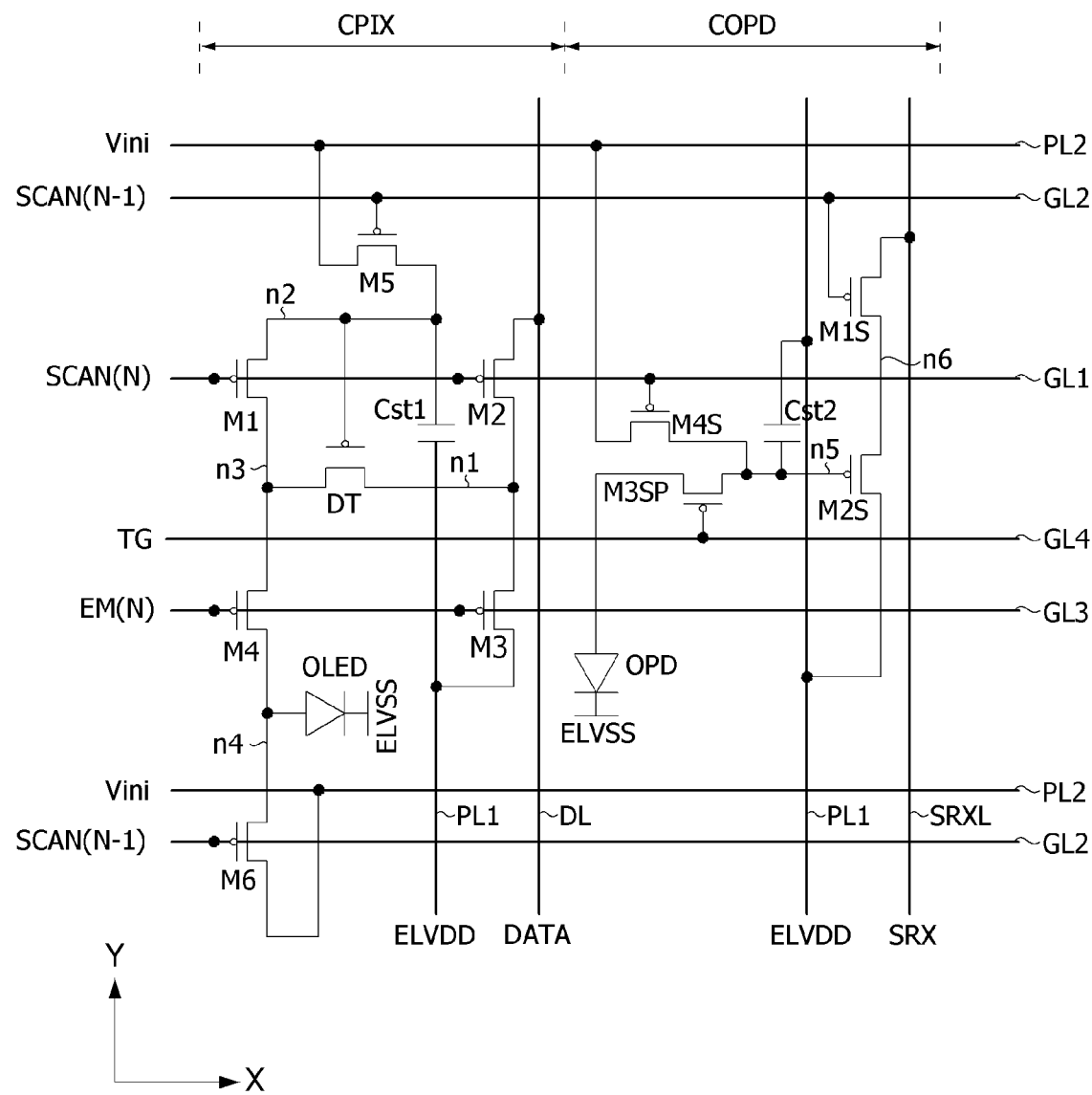
FIG. 17 is a circuit diagram showing a pixel circuit and a sensor driving circuit according to a first embodiment of the present disclosure.
Figure 18:
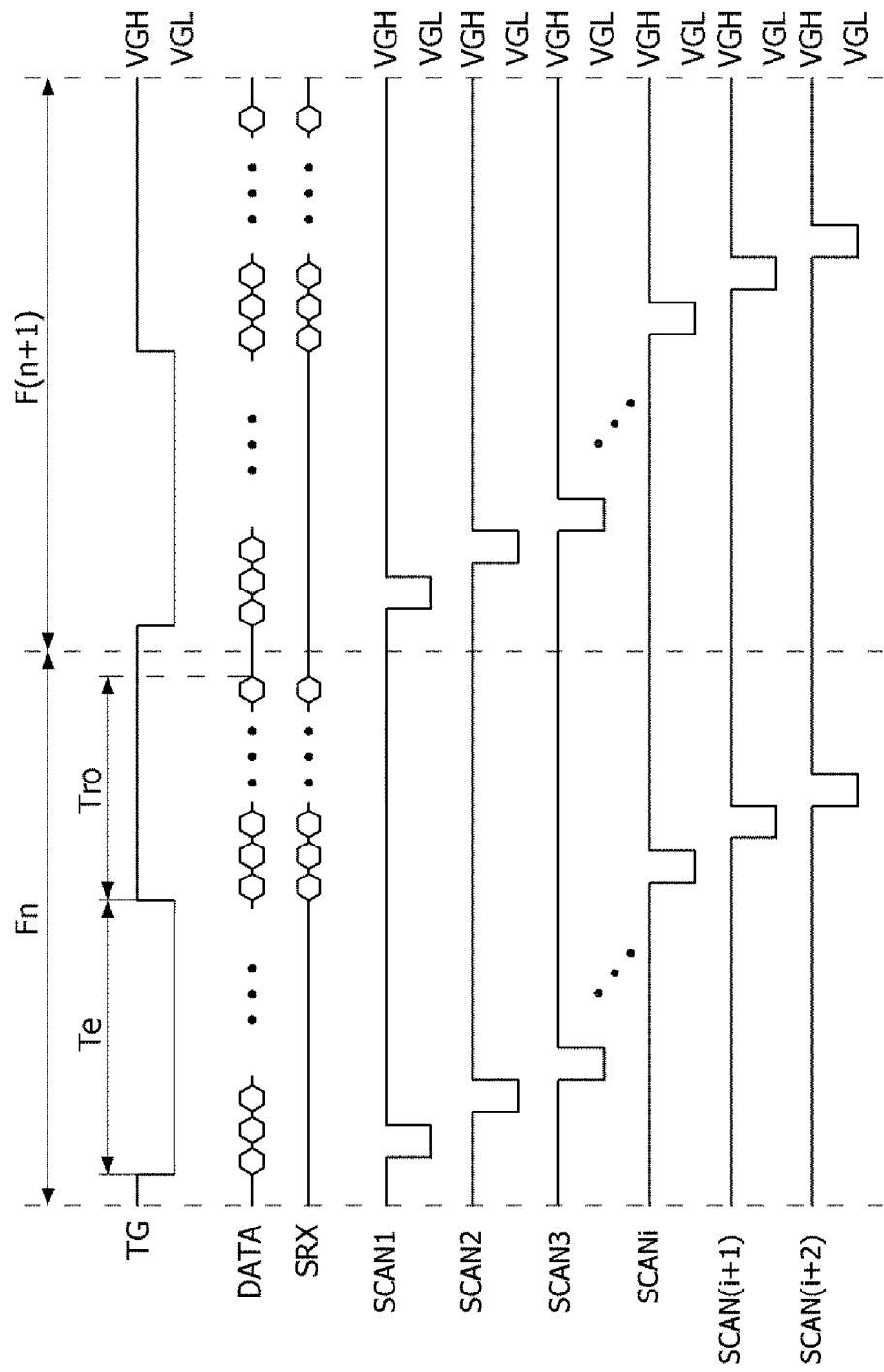
FIG. 18 is a waveform diagram depicting a method for driving the pixel circuit and sensor driving circuit shown in FIG. 17 according to the first embodiment of the present disclosure.

FIG. 17 is a circuit diagram showing a pixel circuit and a sensor driving circuit according to a first embodiment of the present disclosure. FIG. 18 is a waveform diagram depicting a method for driving the pixel circuit and sensor driving circuit shown in FIG. 17 according to the first embodiment of the present disclosure. As the pixel circuit has been described above in the embodiment of FIGS. 11 and 12, a detailed description thereof will be omitted. In FIG. 18, "DATA" indicates pixel data written to the display pixels R, G and B in synchronization with the scan pulse SCAN1 to SCAN(i+2), and "SRX" indicates sensor data output from the sensor pixels in synchronization with the scan pulse SCANi to SCAN(i+2). "Fn" indicates the $n^{th}$ frame period (n is a positive integer), and "F(n+1)" indicates the $n+1^{th}$ frame period.

Among the pixel lines including the sensor pixels S, sensor data SRX starts to be output from the sensor pixel in the pixel line to which the pixel data is written in response to the $i^{th}$ scan pulse SCANi. Hence, the output and initialization time Tro of the sensor pixel may be set to a duration ranging from the $i^{th}$ scan pulse SCANi to the scan pulse applied to the last pixel line of the sensing area SA. The $N-1^{th}$ scan pulse SCAN(N−1) in FIG. 19 may be one of the i to $i+2^{th}$ scan pulses SCANi to SCAN(i+2) shown in FIG. 20.

With reference to FIG. 17, the pixel circuit CPIX and the sensor driving circuit COPD share the power lines PL1, PL2 and PL3. Hence, power sources such as ELVDD, Vini, and ELVSS are commonly applied to the pixel circuit CPIX and the sensor driving circuit COPD.

The sensor driving circuit COPD drives the organic photodiode OPD and outputs sensor data SRX that is generated as a signal photoelectrically converted by the organic photodiode OPD. The sensor data SRX generated by the organic photodiode OPD may be transmitted to the fingerprint recognition processor 500 through the RX line SRXL.

The sensor driving circuit COPD is connected to the VDD line PL1, the Vini line PL2, the VSS line PL3, the gate lines GL1, GL2 and GL4, the RX line SRXL of the sensor pixel, and the like. The gate lines GL1, GL2 and GL4 may be formed of parallel lines crossing the RX line SRXL and the data line DL. The RX line SRXL may be formed of lines parallel to the data line DL and the VDD line PL1.

The sensor driving circuit COPD outputs sensor data SRX in response to the $N-1^{th}$ scan pulse SCAN(N−1) and then is initialized according to the $N^{th}$ scan pulse SCAN(N). The $N-1^{th}$ scan pulse SCAN(N−1) is an example of a scan pulse generated before the $N^{th}$ scan pulse SCAN(N). It should be noted that the $N-1^{th}$ scan pulse SCAN(N−1) is not limited to itself because the $N-1^{th}$ scan pulse SCAN(N−1) can be replaced with another scan pulse, for example, the $N-2^{th}$ scan pulse.

The sensor driving circuit COPD includes an organic photodiode OPD, a capacitor Cst2, and a switch circuit. The switch circuit switches the current path between the organic photodiode OPD and the RX line SRXL in response to the scan pulses SCAN(N−1) and SCAN(N) and the exposure signal TG.

The switch circuit is connected to the organic photodiode OPD, the capacitor Cst2, the first power line PL1, the second power line PL2, the third power line PL3, the RX line SRXL, and the gate lines GL1, GL2 and GL4. The switch circuit includes first to fourth S-switch elements M1S~M4S. The first to fourth S-switch elements M1S~M4S may be implemented with a p-channel TFT.

The organic photodiode OPD includes an anode electrode connected to the third S-switch element M3SP, a cathode electrode to which the low-potential power voltage ELVSS is applied, and an active layer formed between the anode electrode and the cathode electrode. The cathode electrode is connected to the third power line PL3. The active layer ACT-OPD of the organic photodiode OPD includes an organic semiconductor material. The organic photodiode OPD generates a photocurrent according to the received light when a reverse bias voltage is applied. The voltage of the fifth node n5 to which the gate electrode of the second S-switch element M2S is connected is changed due to the electric charge generated by the photocurrent. The capacitor Cst2 is charged with a voltage difference between the voltage of the fifth node n5 and the pixel driving voltage ELVDD.

The capacitor Cst2 is connected between the fifth node n5 and the VDD line PL1. The capacitor Cst2 maintains the voltage of the fifth node n5 that charges electric charges from the organic photodiode OPD when the third S-switch element M3SP is turned on. The exposure time Te of the sensor pixel S is determined according to the pulse width of the exposure signal TG applied to the gate electrode of the third S-switch element M3SP. As the pulse width of the exposure signal TG generated as the gate-on voltage VGL lengthens, the exposure time Te increases, and thus the amount of charge flowing to the fifth node n5 increases.

The first S-switch element M1S is turned on in response to the gate-on voltage VGL of the $N-1^{th}$ scan pulse SCAN(N−1) to thereby connect the sixth node n6 to the RX line RXL. The sixth node n6 is connected to the second electrode of the first S-switch element M1S and the first electrode of the second S-switch element M2S. The gate electrode of the first S-switch element M1S is connected to the second gate line GL2 to which the $N-1^{th}$ scan pulse SCAN(N−1) is applied. The first electrode of the first S-switch element M1S is connected to the RX line SRXL, and the second electrode of the first S-switch element M1S is connected to the sixth node n6. When the first S-switch element M1S is turned on, the sensor data SRX is output through the RX line SRXL.

The second S-switch element M2S adjusts the amount of current flowing through the RX line SRXL between the VDD line PL1 and the sixth node n6 according to the gate voltage, that is, the voltage of the fifth node n5. The second S-switch element M2S includes a gate electrode connected to the fifth node n5, a first electrode connected to the sixth node n6, and a second electrode connected to the VDD line PL1. The fifth node n5 is connected to the second electrode of the third S-switch element M3SP, the capacitor Cst2, and the gate electrode of the second S-switch element M2S.

The third S-switch element M3SP is turned on according to the gate-on voltage VGL of the exposure signal TG to thereby connect the anode electrode of the organic photodiode OPD to the fifth node n5. When the third S-switch element M3SP is in the on state, a charge from the organic photodiode OPD flows to the fifth node n5. The third S-switch element M3SP includes a gate electrode connected to the fourth gate line GL4 to which the exposure signal TG is applied, a first electrode connected to the anode electrode of the organic photodiode OPD, and a second electrode connected to the fifth node n5. The exposure signal TG is generated as the gate-on voltage VGL during the exposure time Te, and is generated as the gate-off voltage VGH during the output and initialization time Tro of the sensor pixel. Hence, the third S-switch element M3SP is turned on during the exposure time Te, and is turned off during the output and initialization time Tro of the sensor pixel.

The fourth S-switch element M4S is turned on according to the gate-on voltage VGL of the $N^{th}$ scan pulse SCAN(N) to thereby initialize the fifth node n5 to the initialization voltage Vini. The fourth S-switch element M4S includes a gate electrode connected to the first gate line GL1 to which the $N^{th}$ scan pulse SCAN(N) is applied, a first electrode connected to the Vini line PL2 to which the initialization voltage Vini is applied, and a second electrode connected to the fifth node n5.

The initialization voltage Vini charges main nodes of the pixel circuit CPIX and initializes main nodes of the sensor driving circuit COPD. The initialization voltage Vini may be set to a voltage equal to or lower than the low-potential power voltage ELVSS.

With reference to FIG. 18, the display pixels are sequentially scanned line by line during the active interval AT. From the viewpoint of driving the sensor pixels, one frame period of the display device may be divided into an exposure time Te and an output and initialization time Tro of the sensor pixel. For each frame period Fn or F(n+1), the exposure time Te may be set to a duration within the active interval AT or to a duration including the active interval AT and at least a portion of the vertical blank interval VB. The sensor data output time Tro may be set as a time during which a scan signal can be applied to the sensor pixels of the sensing area SA.

During the exposure time Te of the sensor pixel, the first to third scan pulses SCAN1 to SCAN3 may be applied to the gate lines of the pixel lines without a sensor pixel S. During the exposure time Te, pixel data may be written in sequence to the display pixels of the display area DA and/or the second sensing area CA according to the shift direction of the scan pulse, and the organic photodiodes OPD of the sensor pixels S may be exposed to light to generate a photocurrent.

During the output and initialization time Tro of the sensor pixel, the i to i+$2^{th}$ scan pulses SCANi to SCAN(i+2) may be applied to the gate lines of the pixel lines in which the display pixels of the display area DA, and the display pixels and the sensor pixels of the first sensing area SA are disposed. During the output and initialization time Tro of the sensor pixel, pixel data is written to the display pixels, sensor data SRX is output from the sensor pixels, and then the sensor pixels are initialized.

Figure 19:
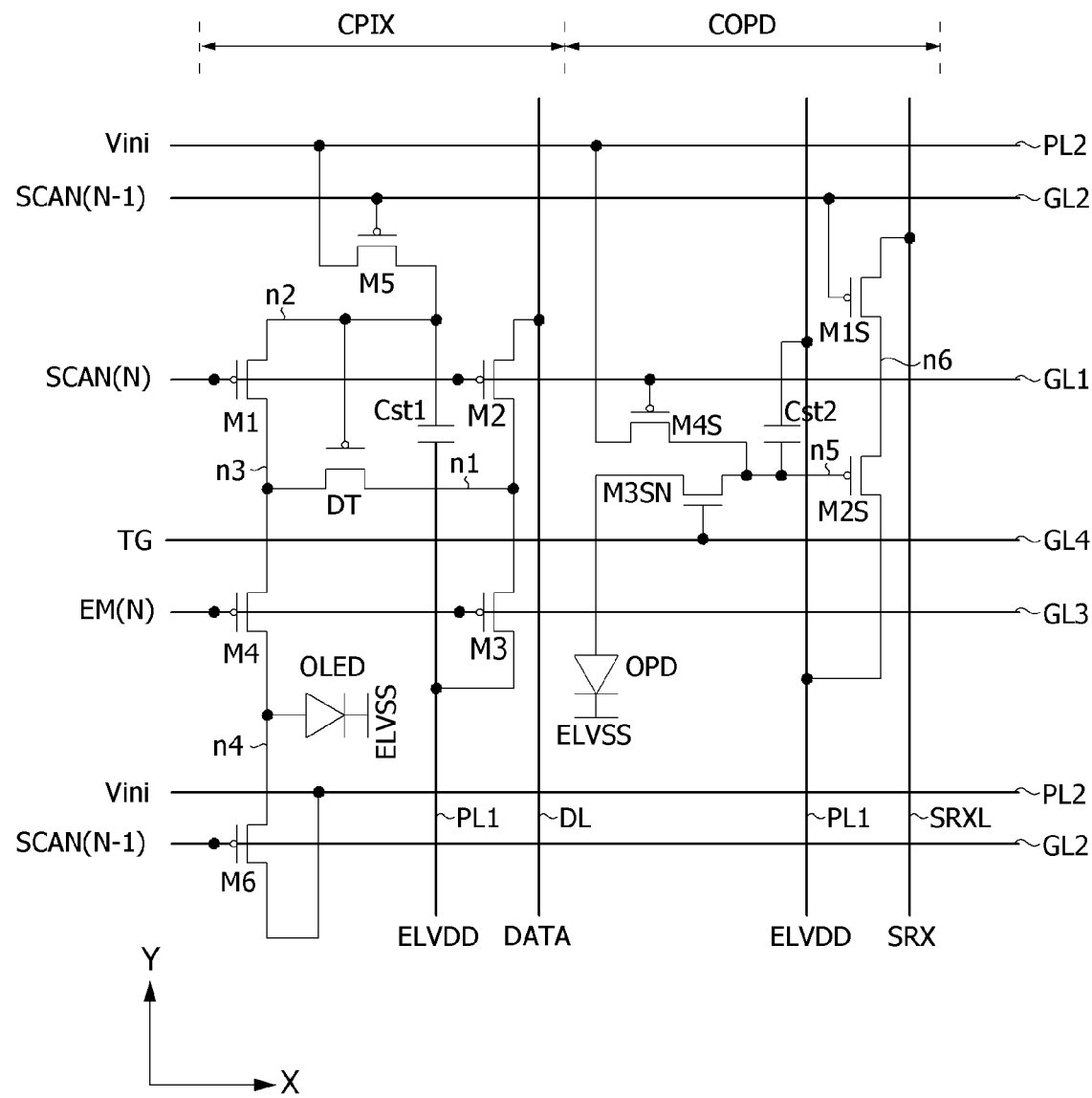
FIG. 19 is a circuit diagram showing a pixel circuit and a sensor driving circuit according to a second embodiment of the present disclosure.
Figure 20:
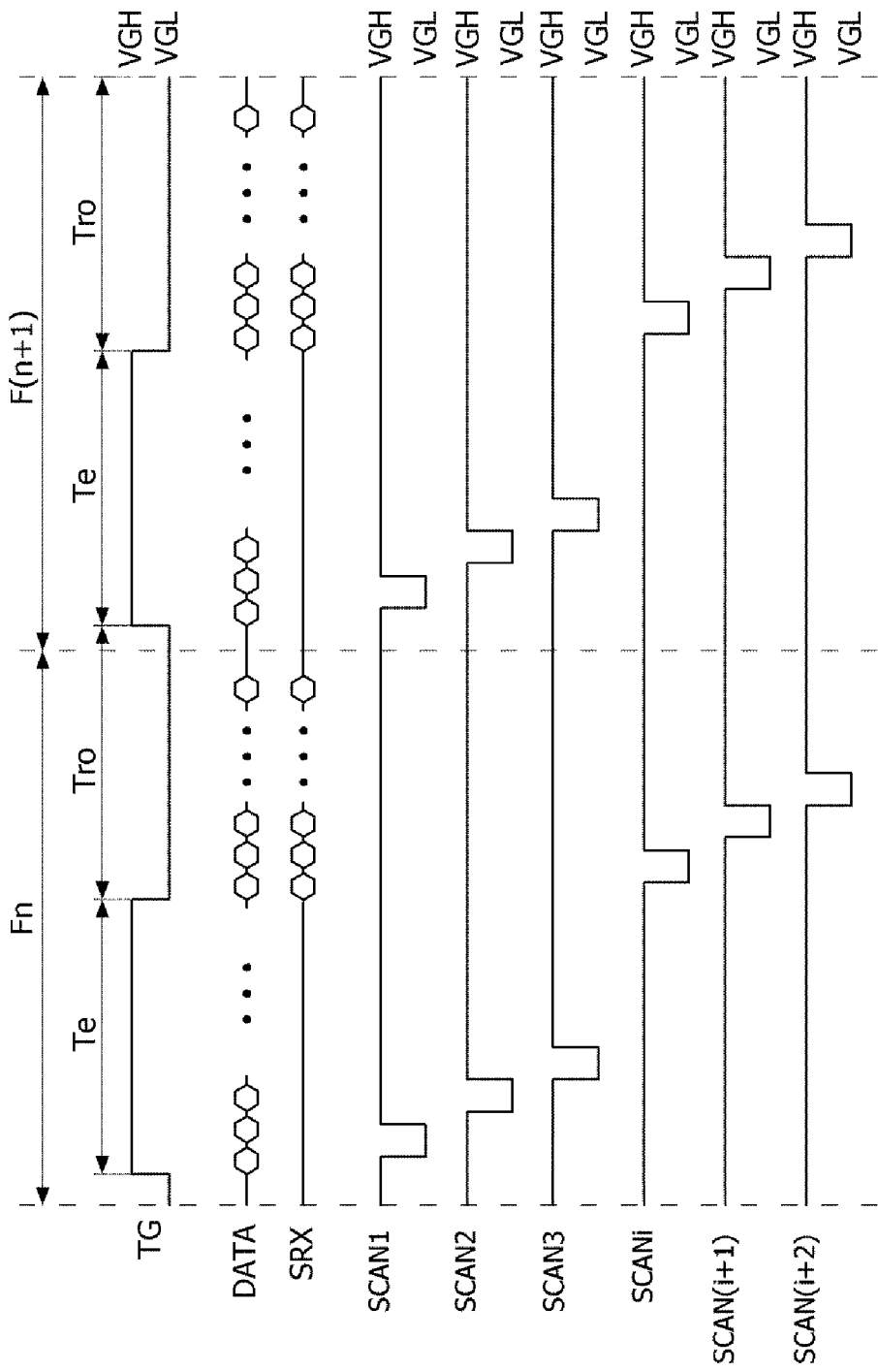
FIG. 20 is a waveform diagram depicting a method for driving the pixel circuit and sensor driving circuit shown in FIG. 19 according to the second embodiment of the present disclosure.

FIG. 19 is a circuit diagram showing a pixel circuit and a sensor driving circuit according to a second embodiment of the present disclosure. FIG. 20 is a waveform diagram depicting a method for driving the pixel circuit and sensor driving circuit shown in FIG. 19. In FIGS. 19 and 20, components that are substantially the same as those of the above-described embodiment are denoted by the same reference symbols and detailed descriptions thereof will be omitted.

With reference to FIGS. 19 and 20, the third S-switch element M3SP of the sensor driving circuit COPD may be implemented with an n-channel oxide TFT to reduce an off current in the off state. In the n-channel oxide TFT, the gate-on voltage is VGH. The pulse of the exposure signal TG is generated as a pulse of the gate-on voltage VGH during the exposure time Te, and is generated as the gate-off voltage VGL during the output and initialization time Tro of the sensor pixel. Hence, the third S-switch element M3SN is turned on during the exposure time Te, and is turned off during the output and initialization time Tro of the sensor pixel.

Figure 21:
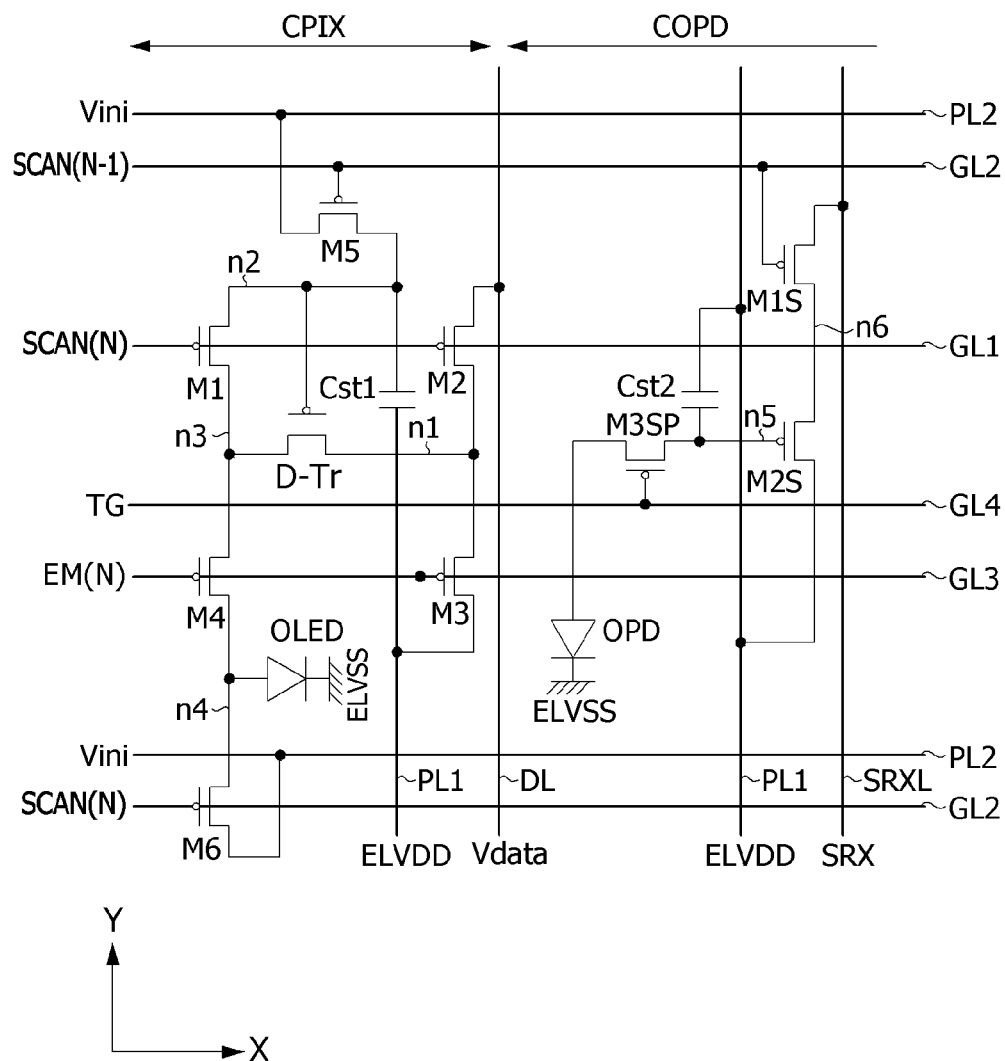
FIG. 21 is a circuit diagram showing a pixel circuit and a photosensor driving circuit according to a third embodiment of the present disclosure.
Figure 22:
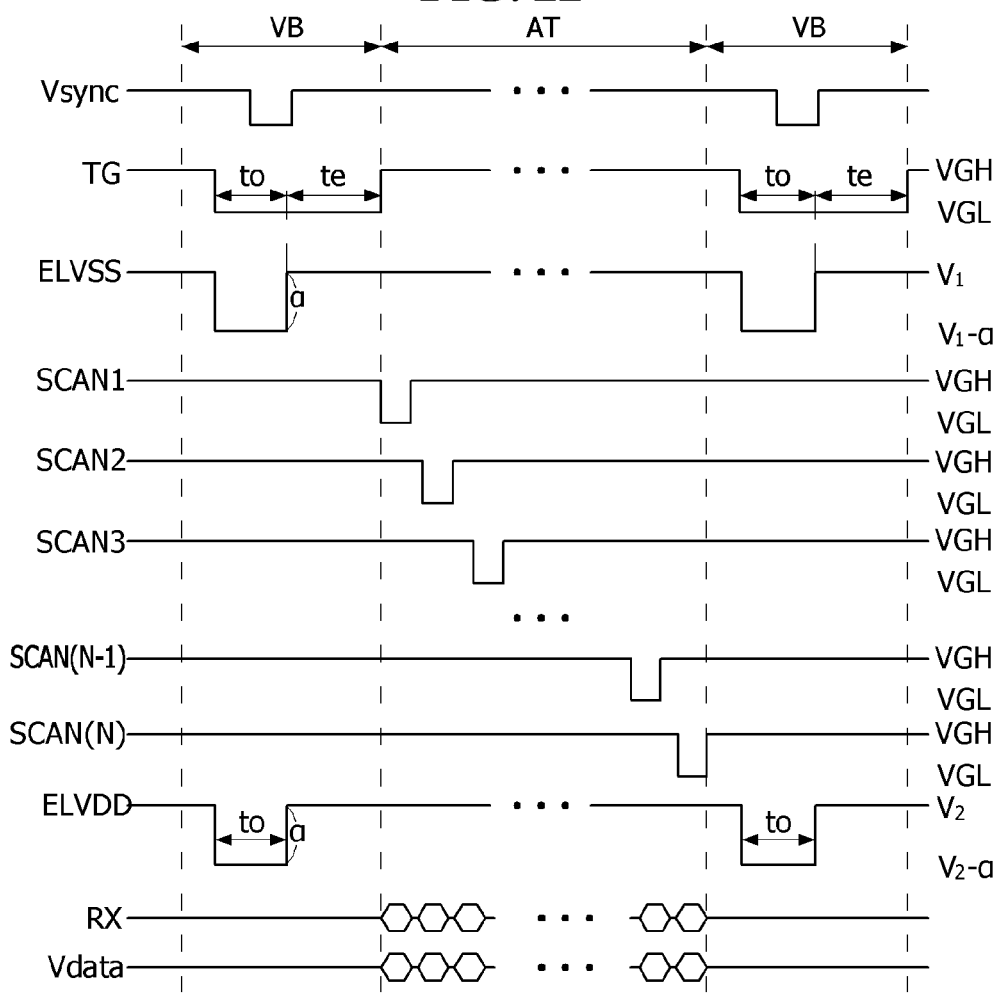
FIG. 22 is a waveform diagram depicting a method for driving the pixel circuit and photosensor driving circuit shown in FIG. 21 according to the third embodiment of the present disclosure.

FIG. 21 is a circuit diagram showing a pixel circuit and a sensor driving circuit according to a third embodiment of the present disclosure. FIG. 22 is a waveform diagram depicting a method for driving the pixel circuit and sensor driving circuit shown in FIG. 21 according to the third embodiment of the present disclosure. As the pixel circuit has been described above with reference to FIGS. 11 and 12, a detailed description thereof will be omitted.

With reference to FIG. 21, power such as ELVDD and ELVSS is applied to the pixel circuit CPIX and the sensor driving circuit COPD.

The sensor driving circuit COPD drives the organic photodiode OPD and outputs sensor data SRX that is obtained from a signal photoelectrically converted by the organic photodiode OPD. The sensor data SRX may be transmitted to the fingerprint recognition processor 500 through the RX line SRXL.

The sensor driving circuit COPD is connected to the VDD line PL1, the VSS line PL3, the second and fourth gate lines GL2 and GL4, the RX line SRXL, and the like. The second and fourth gate lines GL2 and GL4 may be formed of parallel lines crossing the RX line SRXL and the data line DL on the pixel array. The RX line SRXL may be formed of lines parallel to the data line DL and the VDD line PL1.

The sensor driving circuit COPD includes an organic photodiode OPD, a capacitor Cst2, and a switch circuit that is connected to the gate lines GL2 and GL4 and switches the current path between the organic photodiode OPD and the RX line SRXL in response to the scan pulse SCAN(N−1) and the exposure signal TG.

The switch circuit is connected to the organic photodiode OPD, the capacitor Cst2, the VDD line PL1, the VSS line PL3, the RX line SRXL, and the second gate line GL2, and the fourth gate line GL4. The switch circuit includes first to third S-switch elements M1S to M3SP. The first to third S-switch elements M1S to M3SP may be implemented with a p-channel TFT.

The organic photodiode OPD includes an anode electrode connected to the third S-switch element M3SP, a cathode electrode to which the low-potential power voltage ELVSS is applied, and an active layer formed between the anode electrode and the cathode electrode. The active layer of the organic photodiode OPD includes an organic semiconductor material. The organic photodiode OPD generates a photocurrent according to the received light when a reverse bias voltage is applied.

It should be noted that the anode electrode of the organic photodiode OPD and the anode electrode of the light emitting element OLED are disposed on the same layer in the cross-sectional structure of the display panel 100, and the cathode electrode is shared. Due to this structure, the anode electrode of the organic photodiode OPD is connected to the first electrode of the third S-switch element M3SP.

The capacitor Cst2 is connected between the gate electrode of the second S-switch element M2S connected to the fifth node n5 and the VDD line PL1. When the third S-switch element M3SP is turned on, the capacitor Cst2 is charged with the electric charge from the organic photodiode OPD to thereby store the voltage of the photoelectrically converted signal. The exposure time of the photosensor S is determined according to the pulse width of the exposure signal TG applied to the gate electrode of the third S-switch element M3SP. As the pulse width of the exposure signal TG lengthens, the amount of charge of the capacitor Cst2 due to the photosensor S may increase.

The first S-switch element M1S is turned on in response to the gate-on voltage VGL of the N−$1^{th}$ scan pulse SCAN (N−1) to thereby connect the fourth node n4 to the RX line SRXL. The sixth node n6 is connected to the second electrode of the first S-switch element M1S and the first electrode of the second S-switch element M2S. The gate electrode of the first S-switch element M1S is connected to the second gate line GL2 to receive the N−$1^{th}$ scan pulse SCAN(N−1). The first electrode of the first S-switch element M1S is connected to the RX line SRXL, and the second electrode of the first S-switch element M1S is connected to the sixth node n6.

The second S-switch element M2S adjusts the amount of current flowing between the VDD line PL1 and the sixth node n6 according to the gate voltage, that is, the voltage of the fifth node n5. The second S-switch element M2S includes a gate electrode connected to the fifth node n5, a first electrode connected to the sixth node n6, and a second electrode connected to the VDD line PL1. The fifth node n5 is connected to the second electrode of the third S-switch element M3SP, the capacitor Cst2, and the gate electrode of the second S-switch element M2S.

The third S-switch element M3SP is turned on according to the gate-on voltage VGL of the exposure signal TG to thereby connect the anode electrode of the organic photodiode OPD to the fifth node n5. When the third S-switch element M3SP is in the on state, electric charges from the organic photodiode OPD are charged in the capacitor Cst2. The third S-switch element M3SP includes a gate electrode connected to the fourth gate line GL4 to which the exposure signal TG is applied, a first electrode connected to the anode electrode of the organic photodiode OPD, and a second electrode connected to the fifth node n5.

The sensor driving circuit COPD is initialized during the vertical blank interval VB as shown in FIG. 22.

With reference to FIG. 22, the vertical blank interval VB includes a reset time (to) and an exposure time to for the sensor driving circuit COPD. During the active interval AT in which pixel data is received by the timing controller 303, the scan pulses SCAN(N-1) and SCAN(N) and the EM pulse EM(N) are generated and shifted in sequence.

To reset the sensor driving circuit COPD, the voltage levels of the exposure signal TG, the low-potential power voltage ELVSS, and the pixel driving voltage ELVDD are changed within the vertical blank interval VB. During the reset time (to), the organic photodiode OPD and the third S-switch element M3SP are turned on, and the voltage of the fifth node n5 is set to a low-potential power voltage (VSS=$V_1-\alpha$).

As the pixel circuit CPIX and the sensor driving circuit COPD share the power lines PL1 and PL3, the low-potential power voltage ELVSS and the pixel driving voltage ELVDD are applied. In the pixel circuit CPIX, when the voltage applied across the light emitting element OLED changes, the current changes and the luminance changes accordingly. Hence, to keep the luminance of the pixel circuit fixed during the reset time (to) of the sensor driving circuit COPD, although the voltage level of the low-potential power voltage ELVSS and the pixel driving voltage ELVDD may change, the voltage across the light emitting element OLED must not change. In other words, the variation ranges of the low-potential power voltage ELVSS and the pixel driving voltage ELVDD are set to be equal.

The exposure signal TG is generated as a pulse of the gate-on voltage VGL during the reset time (to) and the exposure time te, and it maintains the gate-off voltage VGH for other times. Hence, the third S-switch element M3SP is turned on during the reset time (to) and the exposure time te. The capacitor Cst2 is discharged during the reset time (to), and then is charged with the electric charge from the organic photodiode OPD during the exposure time te to store the electric charge of the photoelectrically converted signal RX.

The low-potential power voltage ELVSS is lowered to a preset voltage $V_1-\alpha$ during the reset time (to), and maintains a voltage V1 for other times. During the reset time (to), the cathode voltage of the organic photodiode OPD is lowered to $V_1-\alpha$, so that a forward bias is applied to the organic photodiode OPD. Hence, during the reset time (to), the organic photodiode OPD and the third S-switch element M3SP are turned on to thereby set the voltage of the fifth node n5 to $V_1-\alpha$. The second S-switch element M2S is turned on during the reset time (to). $V_1-\alpha$ may be set to a voltage lower than V1 and higher than the gate-on voltage VGL.

During the reset time (to), the voltage across the light emitting element OLED should not be changed so that the current of the light emitting element OLED does not change. To this end, during the reset time (to), the pixel driving voltage ELVDD is lowered as much as the change of the low-potential power voltage ELVSS ($\alpha$). The pixel driving voltage ELVDD is lowered to $V_2-\alpha$ during the reset time (to), and maintains a voltage V2 for other times. The voltage levels of the pixel driving voltage ELVDD and the low-potential power voltage ELVSS may be lowered at the same time and may be raised at the same time. $V_2$ may be set to a voltage higher than $V_1$ and lower than the gate-off voltage VGH.

During the exposure time te, the low-potential power voltage ELVSS rises to $V_1$. The third S-switch element M3SP remains in the on state according to the gate-on voltage VGL during the exposure time te. Here, as the cathode voltage of the organic photodiode OPD rises to $V_1$ and the anode voltage is $V_1-\alpha$, a reverse bias is applied to the organic photodiode OPD. During the exposure time te, the second S-switch element M2S remains in the on state because the gate voltage is $V_1-\alpha$.

When light is irradiated to the active layer ACT-OPD of the organic photodiode OPD during the exposure time te, a photocurrent is generated, the voltage of the capacitor Cst2 changes in proportion to the amount of received light, and the sensor data SRX is stored.

The exposure time te is determined according to the pulse width of the exposure signal TG. The exposure time te may be configured in, but not limited to, the vertical blank interval VB before pixel data is written to the display pixels. The exposure time te may be extended up to a time before the first scan pulse SCAN1 is generated as the gate-on voltage VGL according to the pulse width of the exposure signal TG. In another embodiment, the exposure time te may be extended to the inside of the active interval AT to overlap one or more scan pulses depending on the position of the sensing area SA.

During the active interval AT, the display pixels are sequentially scanned so that pixel data is written to the display pixels, and sensing data, that is, sensor data SRX obtained from the photosensors is read out. During the active interval AT, scan pulses SCAN1 to SCAN(N) synchronized with the data voltage Vdata of the pixel data are applied in sequence to the gate lines GL1 and GL2. The first S-switch element M1S of the sensor driving circuit COPD is turned on according to the gate-on voltage VGL of the scan pulse SCAN(N-1) during the active interval AT to thereby connect the sixth node n6 to the RX line SRXL. At this time, a current flowing through the channel of the second S-switch element M2S, in which the gate-source voltage of the photoelectrically converted signal is set, flows through the first S-switch element M1S to the RX line SRXL.

To prevent the data voltage Vdata from affecting the sensor data RX, in the pixel circuit CPIX and the sensor driving circuit COPD sharing the gate lines GL2 and GL4, it is preferable to separate the scan pulse for controlling the second switch element M2 of the pixel circuit and the scan pulse for controlling the first S-switch element M1S of the sensor driving circuit COPD. For example, the gate electrode of the second switch element M2 may be connected to the first gate line GL1 to which the $N^{th}$ scan pulse SCAN(N) is applied, and the gate electrode of the first S-switch element M1S may be connected to the second gate line GL2 to which the N–1$^{th}$ scan pulse SCAN(N–1) is applied. The scan pulse for controlling the first S-switch element M1S is not limited to the N–1$^{th}$ scan pulse SCAN(N–1).

Figure 23:
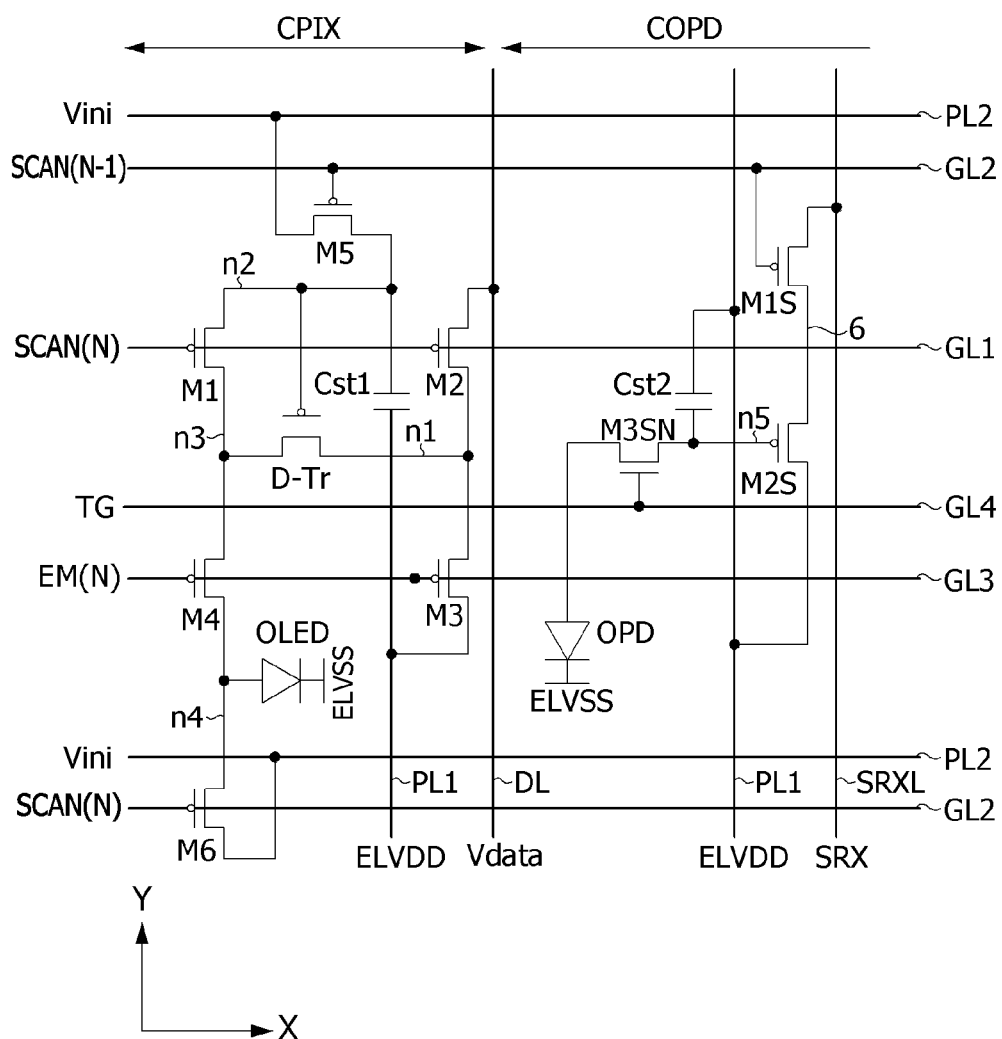
FIG. 23 is a circuit diagram showing a pixel circuit and a photosensor driving circuit according to a fourth embodiment of the present disclosure.
Figure 24:
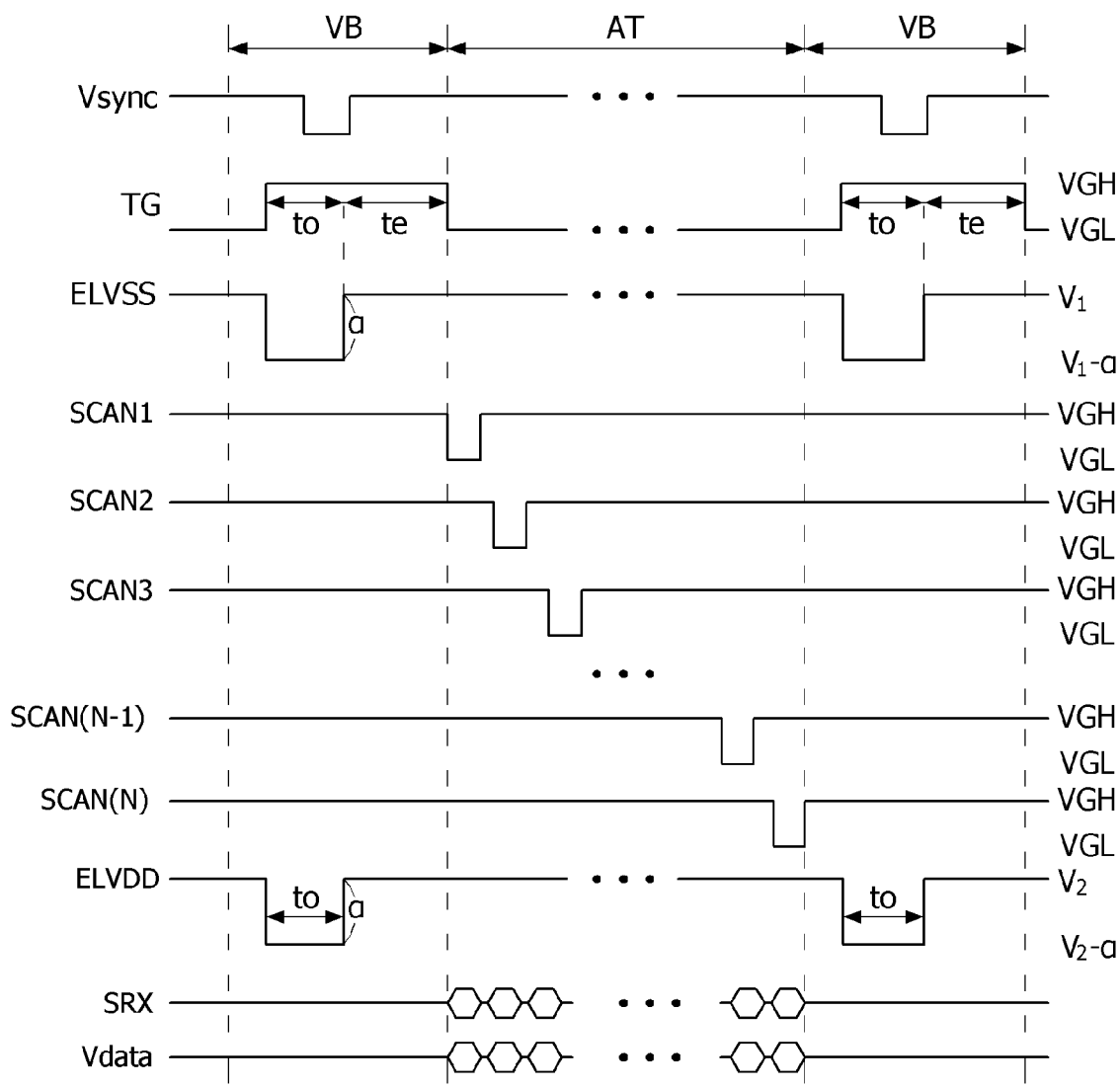
FIG. 24 is a waveform diagram depicting a method for driving the pixel circuit and photosensor driving circuit shown in FIG. 23 according to the fourth embodiment of the present disclosure.

FIG. 23 is a circuit diagram showing a pixel circuit and a sensor driving circuit according to a fourth embodiment of the present disclosure. FIG. 24 is a waveform diagram depicting a method for driving the pixel circuit and sensor driving circuit shown in FIG. 23 according to the fourth embodiment of the present disclosure. In FIGS. 23 and 24, components that are substantially the same as those of the above-described embodiment are denoted by the same reference symbols, and detailed descriptions thereof will be omitted.

With reference to FIGS. 23 and 24, the third S-switch element M3SN of the sensor driving circuit COPD may be implemented with an n-channel oxide TFT to reduce an off current in the off state. In the n-channel TFT, the gate-on voltage is VGH. Hence, the pulse of the exposure signal TG is generated as a pulse of the gate-on voltage VGH during the initialization time to and the exposure time te.

FIG. 25 is a circuit diagram showing a gamma compensation voltage generator according to an embodiment of the present disclosure.

With reference to FIG. 25, the gamma compensation voltage generator 305 receives a high-potential input reference voltage VRH and a low-potential input reference voltage VRL from the power supply 304, and outputs a gamma compensation voltage (or, display driving voltage) for each grayscale for driving the display and a light source driving voltage. When the driving element DT of the pixel circuit CPIX is driven as a p-channel TFT, the amount of current increases as the gate voltage decreases. Hence, as the gamma compensation voltage output from the gamma compensation voltage generator 305 is lower, the light emitting elements OLED of the pixels and the sensing light source may emit light with higher luminance.

The gamma compensation voltage generator 305 includes an input voltage selector, a grayscale voltage generator 700 for generating a gamma compensation voltage for display driving, and a light source driving voltage generator 600.

The gamma compensation voltage generator 305 includes a plurality of voltage divider circuits and a plurality of multiplexers. The voltage divider circuit divides a voltage between the high-potential voltage and the low-potential voltage by using resistors connected in series to output voltages having different voltage levels. Each multiplexer selects a voltage indicated by a resistor setting value from among the voltages divided by the divider circuit. The timing controller 303 may input register setting values to the control terminals of the multiplexers in each of the display mode and the fingerprint recognition mode to adjust the voltage level of the output voltages V0 to V256 of the gamma compensation voltage generator 305 for each mode. The register setting values may be defined by the register setting data stored in the memory 302 and may be updated.

The input voltage selector includes a voltage divider circuit (RS01), a multiplexer MUX01 that selects the highest grayscale voltage V255 according to a first register setting value, a multiplexer MUX02 that selects a lower gamma compensation voltage according to a second register setting value, and a multiplexer MUX03 that outputs the lowest gamma compensation voltage V0 according to a third register setting value. The voltage V255 output from the multiplexer MUX01 is supplied to the grayscale voltage generator 700 and the voltage divider circuit of the light source driving voltage generator 600. The voltage output from the multiplexer MUX01 is supplied to the voltage divider circuit of the grayscale voltage generator 700.

The light source driving voltage generator 600 includes a tenth voltage divider circuit RS10 connected between the VRL node and the V255 node, and multiplexers MUX10 and MUX20. The voltage divider circuit RS10 divides a voltage between the low-potential input reference voltage VRL and the highest grayscale voltage V255. The output voltages of the voltage divider circuit RS10 have voltage levels higher than that of the highest grayscale voltage V255. The multiplexer MUX10 selects one of the voltages divided by the divider circuit RS10 according to a fourth register setting value and outputs a light source driving voltage (DBV linked voltage) that is variable according to the display brightness value (DBV). The DBV is luminance setting data for varying luminance according to a luminance sensor output signal of the host system 200 or a luminance input value of the user. The register setting values that separately control the individual multiplexers may vary depending on the DBV. The output voltage of the multiplexer MUX10 is selected from a grayscale voltage range higher than the highest grayscale voltage V255.

In the fingerprint recognition mode, as the display pixels of the first sensing area SA are driven as a light source, they may emit light with a luminance higher than that of the display area DA. In this case, the data voltage applied to the display pixels of the first sensing area SA in the fingerprint recognition mode may be applied to the light source driving voltage V256 having a grayscale higher than the highest grayscale voltage V255 of the display mode.

The multiplexer MUX20 selects one of a separate reference voltage (DBV unlinked voltage) set independently of the DBV and the DBV linked voltage output from the multiplexer MUX10 to output a light source driving voltage V256 under the control of the host system 200. The DBV unlinked voltage is a voltage of a grayscale higher than the highest grayscale voltage V255. The host system 200 may control the output voltage of the multiplexer MUX20 by using the enable signal EN in the fingerprint recognition mode. Hence, the DBV linked voltage or the DBV unlinked voltage output from the multiplexer MUX20 is a light source driving voltage V256 higher than the highest grayscale voltage V255.

The grayscale voltage generator 700 includes a plurality of divider circuits RS11 to RS18 and a plurality of multiplexers MUX11 to MUX18.

The first-first divider circuit R11 divides a voltage between the output voltage of the first multiplexer MUX01 and the output voltage of the second multiplexer MUX02. The first-first multiplexer MUX11 selects one of the voltages divided by the first-first voltage divider circuit R11 according to a register setting value. The output voltage of the first-first multiplexer MUX11 may be output through a buffer and may be a voltage V191 of grayscale 191. The first-second voltage divider circuit R12 divides a voltage between the output voltage of the first-first multiplexer MUX11 and the output voltage of the second multiplexer MUX02. The first-second multiplexer MUX12 selects one of the voltages divided by the voltage divider circuit R12 according to a register setting value. The output voltage of the first-second multiplexer MUX12 may be output through a buffer and may be a voltage V127 of grayscale 127.

The first-third divider circuit R13 divides a voltage between the output voltage of the first-second multiplexer MUX12 and the output voltage of the second multiplexer MUX02. The first-third multiplexer MUX13 selects one of the voltages divided by the voltage divider circuit R13 according to a register setting value. The output voltage of the first-third multiplexer MUX13 may be output through a buffer and may be a voltage V63 of grayscale 63. The first-fourth divider circuit R14 divides a voltage between the output voltage of the first-third multiplexer MUX13 and the output voltage of the second multiplexer MUX02. The first-fourth multiplexer MUX14 selects one of the voltages divided by the voltage divider circuit R14 according to a register setting value. The output voltage of the first-fourth multiplexer MUX14 may be output through a buffer and may be a voltage V31 of grayscale 31.

The first-fifth divider circuit R15 divides a voltage between the output voltage of the first-fourth multiplexer MUX14 and the output voltage of the second multiplexer MUX02. The first-fifth multiplexer MUX15 selects one of the voltages divided by the voltage divider circuit R15 according to a register setting value. The output voltage of the first-fifth multiplexer MUX15 may be output through a buffer and may be a voltage V15 of grayscale 15. The first-sixth divider circuit R16 divides a voltage between the output voltage of the first-fifth multiplexer MUX15 and the output voltage of the second multiplexer MUX02. The first-sixth multiplexer MUX16 selects one of the voltages divided by the voltage divider circuit R16 according to a register setting value. The output voltage of the first-sixth multiplexer MUX16 may be output through a buffer and may be a voltage V7 of grayscale 7.

The first-seventh divider circuit R17 divides a voltage between the output voltage of the first-sixth multiplexer MUX16 and the output voltage of the second multiplexer MUX02. The first-seventh multiplexer MUX17 selects one of the voltages divided by the voltage divider circuit R17 according to a register setting value. The output voltage of the first-seventh multiplexer MUX17 may be output through a buffer and may be a voltage V4 of grayscale 4. The first-eighth divider circuit R18 divides a voltage between the highest grayscale voltage and the lowest grayscale voltage among the voltages divided by the first-seventh divider circuit R17. The first-eighth multiplexer MUX18 selects one of the voltages divided by the voltage divider circuit R18 according to a register setting value. The output voltage of the first-eighth multiplexer MUX18 may be output through a buffer and may be a voltage V1 of grayscale 1.

The grayscale voltage generator 700 further includes a plurality of voltage divider circuits RS21 to RS28. The second-first voltage divider circuit R21 divides a voltage between the highest gamma compensation voltage V255 and a voltage V191 of grayscale 191 to output a gamma compensation voltage between the highest grayscale and grayscale 191. The second-second voltage divider circuit R22 divides a voltage between a voltage V191 of grayscale 191 and a voltage V127 of grayscale 127 to output a gamma compensation voltage between grayscale 191 and grayscale 127. The second-third voltage divider circuit R23 divides a voltage between a voltage V127 of grayscale 127 and a voltage V63 of grayscale 63 to output a gamma compensation voltage between grayscale 127 and grayscale 63. The second-fourth voltage divider circuit R24 divides a voltage between a voltage V63 of grayscale 63 and a voltage V31 of grayscale 31 to output a gamma compensation voltage between grayscale 63 and grayscale 31. The second-fifth voltage divider circuit R25 divides a voltage between a voltage V31 of grayscale 31 and a voltage V15 of grayscale 15 to output a gamma compensation voltage between grayscale 31 and grayscale 15. The second-sixth voltage divider circuit R26 divides a voltage between a voltage V15 of grayscale 15 and a voltage V7 of grayscale 7 to output a gamma compensation voltage between grayscale 15 and grayscale 7. The second-seventh voltage divider circuit R27 divides a voltage between a voltage V7 of grayscale 7 and a voltage V4 of grayscale 4 to output a gamma compensation voltage between grayscale 7 and grayscale 4. The second-eighth voltage divider circuit R28 divides a voltage between a voltage V4 of grayscale 4 and a voltage V1 of grayscale 1 to output a gamma compensation voltage between grayscale 4 and grayscale 1.

The gamma compensation voltage generator 305 may include an R gamma compensation voltage generator, a G gamma compensation voltage generator, and a B gamma compensation voltage generator in order to obtain an optimum gamma compensation voltage for each color of the subpixels. In this case, the resistor setting value may be set to different voltages for the R gamma compensation voltage generator, the G gamma compensation voltage generator, and the B gamma compensation voltage generator. The gamma compensation voltages output from the R gamma compensation voltage generator are a grayscale voltage of the data voltage to be supplied to the R subpixel. The gamma compensation voltages V0 to V256 output from the G gamma compensation voltage generator are a grayscale voltage of the data voltage to be supplied to the G subpixel. The gamma compensation voltages output from the B gamma compensation voltage generator are a grayscale voltage of the data voltage to be supplied to the B subpixel.

The gamma compensation voltages V0 to V255 for individual grayscales and the light source driving voltage V256 are input to the DAC of the data driver 306. The DAC of the data driver 306 converts the pixel data received from the timing controller 303 into different gamma compensation voltages for individual grayscales and generates a data voltage Vdata for display driving. In the fingerprint recognition mode, the data driver 306 converts the light source driving data received from the timing controller 303 into a light source driving voltage V256, and supplies it to the display pixels of the first sensing area SA being used as a light source through the data line.

The PPI of the first and second sensing areas SA and CA is lower than that of the display area DA. For this reason, when the display pixels of the display area DA and the display pixels of the sensing areas SA and CA are driven with the same data voltage at the same grayscale, the luminance of the sensing areas SA and CA may be lowered. According to the present disclosure, in the fingerprint sensing mode, the register setting value of the gamma compensation voltage generator 305 is changed so as to expand the dynamic range of the data voltage applied to the display pixels of the sensing area SA, thereby increasing the luminance of the pixels in the sensing areas SA and CA.

Figure 26:
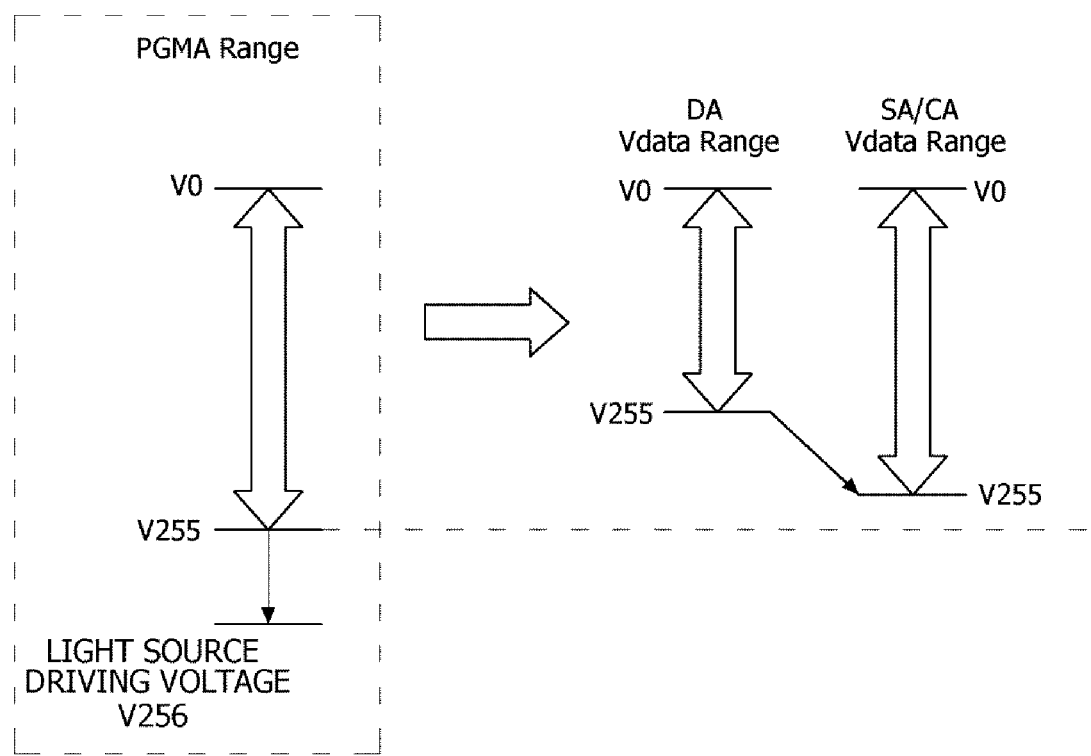
FIG. 26 is a diagram illustrating a data voltage applied to pixels in the display area and a data voltage applied to pixels in the sensing area according to an embodiment of the present disclosure.

FIG. 26 is a diagram illustrating a data voltage applied to pixels in the display area DA and a data voltage applied to pixels in the sensing area. "PGMA Range" in FIG. 26 represents the range of the output voltage of the grayscale voltage generator 700.

With reference to FIG. 26, the data voltage of the pixel data output from the data driver 306 may be set differently in the display area DA and the sensing areas SA and CA. As the PPI of the sensing areas SA and CA is low, the range of the data voltage to be applied to the display pixels of the sensing area SA is larger than that of the data voltage Vdata to be applied to the display pixels of the display area DA. Hence, the data voltage Vdata applied to the gate of the driving element DT of the display pixels in the sensing areas SA and CA is set to a voltage lower than that of the display area DA. As a result, when the voltage V255 of grayscale 255 is applied to the driving element DT of the sensing areas SA and CA, as the voltage (anode voltage) applied to the anode electrode of the light emitting element OLED through the driving element DT becomes higher than the anode voltage of the display area DA, it is possible to compensate for a decrease in luminance of the sensing areas SA and CA.

Figure 27:
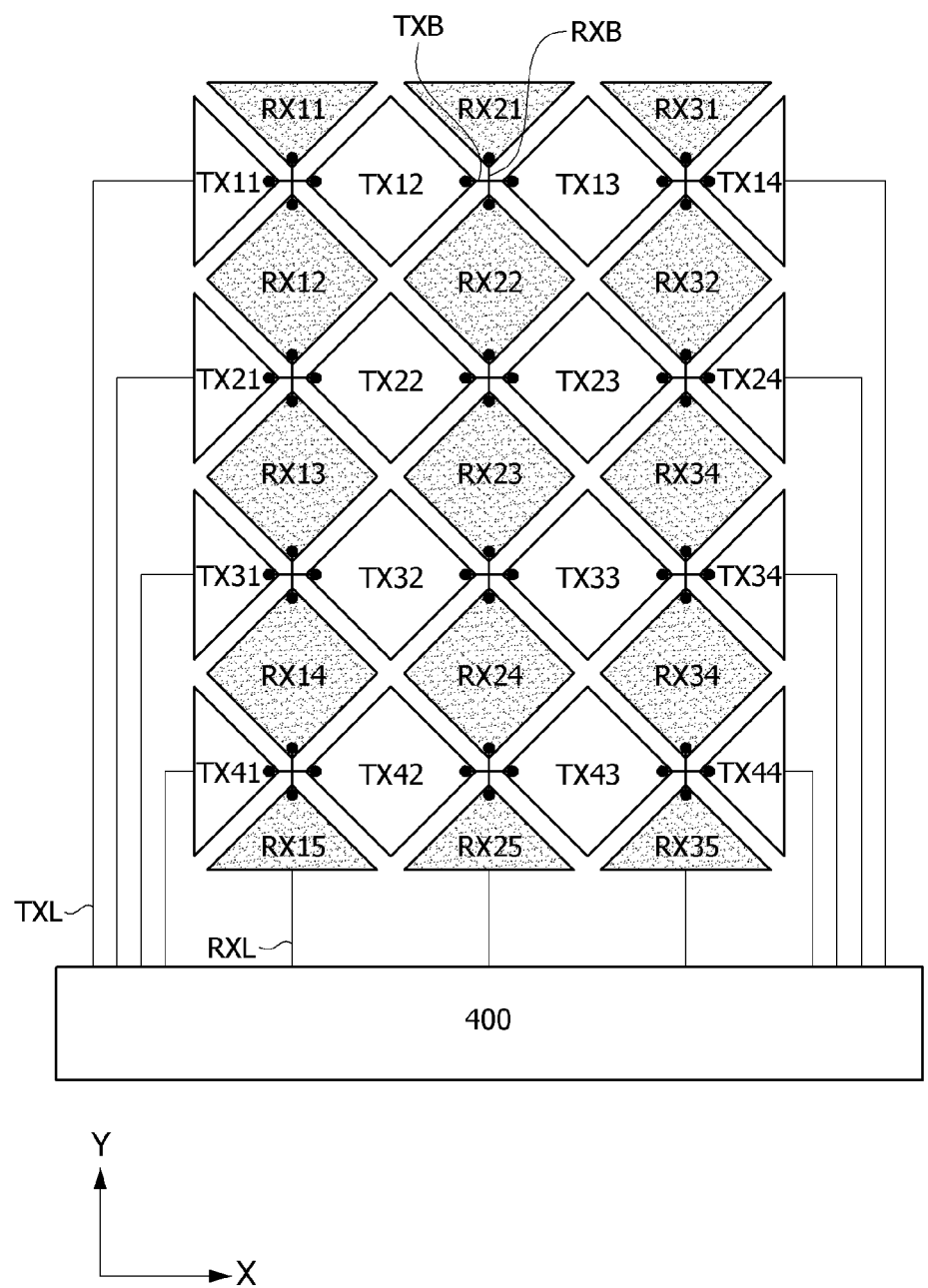
FIG. 27 is a diagram illustrating an embodiment of a touch sensor according to an embodiment of the present disclosure.

FIG. 27 is a diagram illustrating an embodiment of a touch sensor TS.

Figure 29:
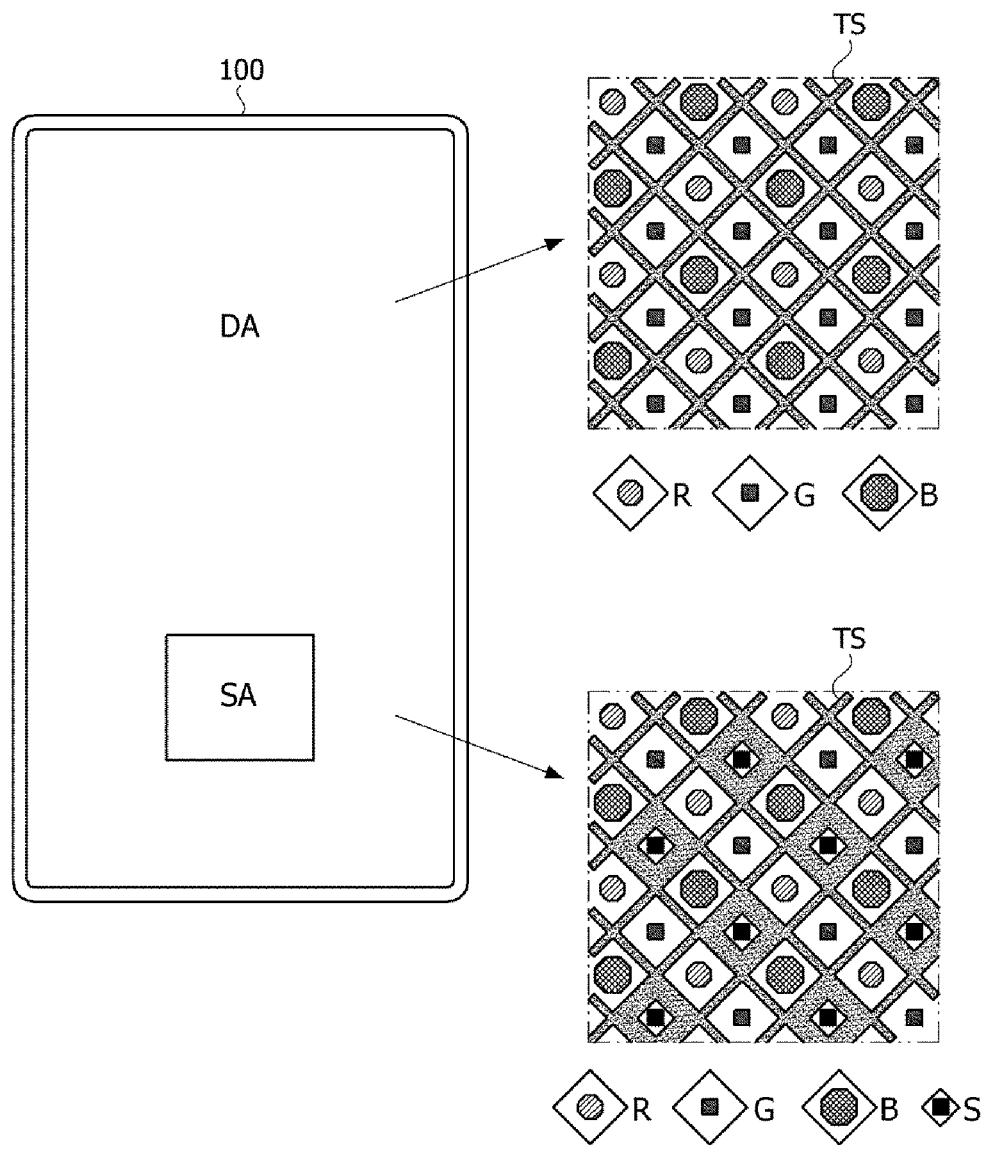
FIG. 29 is a diagram illustrating a mesh-type electrode of the touch sensor disposed in the display area and the first sensing area according to an embodiment of the present disclosure.

With reference to FIG. 27, the touch sensor TS includes Tx electrodes TX11 to TX44 and Rx electrodes RX11 to RX35 crossing the Tx electrodes. A capacitance of the touch sensor TS is formed between each of the Tx electrodes TX11 to TX44 and each of the Rx electrodes RX11 to RX35. The Tx electrodes TX11 to TX44 and the Rx electrodes RX11 to RX35 may be formed as a mesh-type electrode as shown in FIG. 29. The mesh-type electrode may be made of metal lines.

The Tx electrodes TX11 to TX44 are formed as long lines along the first direction X through TX bridges TXB. The Rx electrodes RX11 to RX35 are formed as long lines along the second direction Y through RX bridges RXB.

The Tx electrodes TX11 to TX44 are connected to the touch sensor driver 400 through Tx routing lines TXL. The Rx electrodes RX11 to RX35 are connected to the touch sensor driver 400 through Rx routing lines RXL.

The sensing unit 402 of the touch sensor driver 400 may include a Tx driving part and a receiving part. The Tx driving part supplies a sensor driving signal to the Tx electrodes TX11 to TX44 to charge the capacitances of the touch sensor TS with electric charges. The receiving part receives an electric charge input from the capacitance of the touch sensor TS and supplies it to the amplifier. The sensing unit 402 may supply the output voltage of the amplifier to the integrator, convert the output voltage of the integrator into digital data through an ADC, and output touch data.

Figure 28:
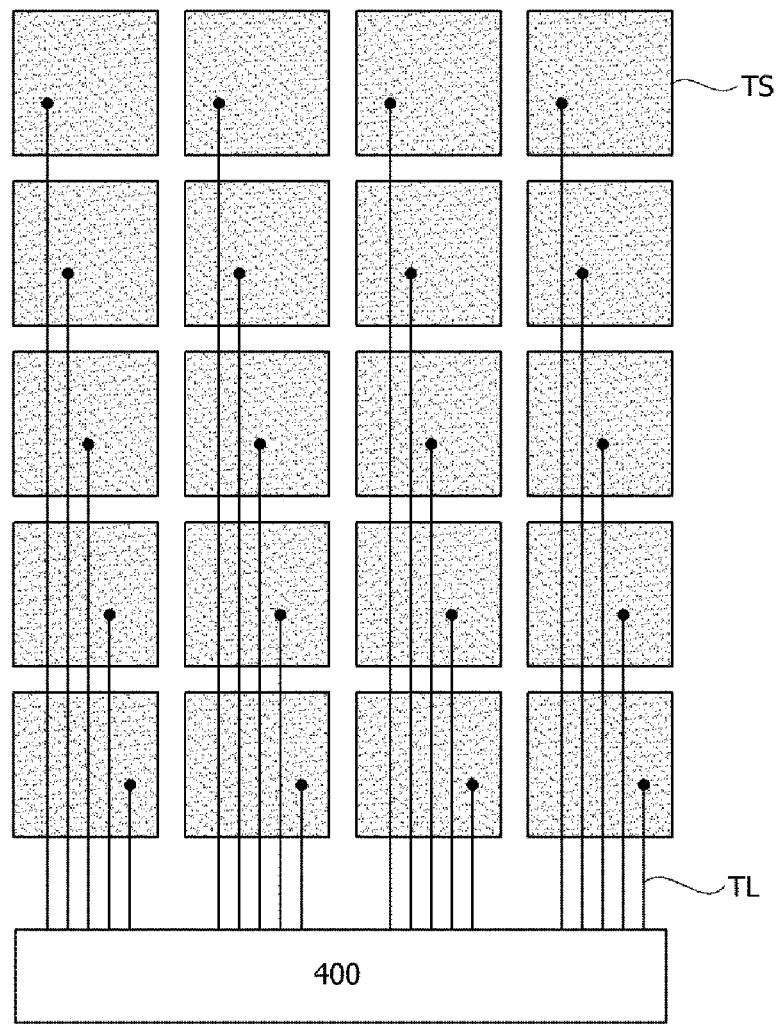
FIG. 28 is a diagram illustrating another embodiment of a touch sensor.

FIG. 28 is a diagram illustrating another embodiment of a touch sensor TS.

With reference to FIG. 28, the touch sensor TS includes a plurality of sensor electrodes separated from each other, and sensor lines TL connecting the individual sensor electrodes to the touch sensor driver 400. A capacitance of the touch sensor TS is formed on each of the sensor electrodes. The sensor electrodes may be formed as a mesh-type electrode as shown in FIG. 29.

The sensing unit 402 of the touch sensor driver 400 supplies a sensor driving signal to the sensor electrodes through the sensor lines TL, and receives electric charges flowing through the sensor lines TL. The sensing unit 402 may amplify the touch sensor signal, supply it to the integrator, convert the output voltage of the integrator into digital data through an ADC, and output touch data.

Figure 30:
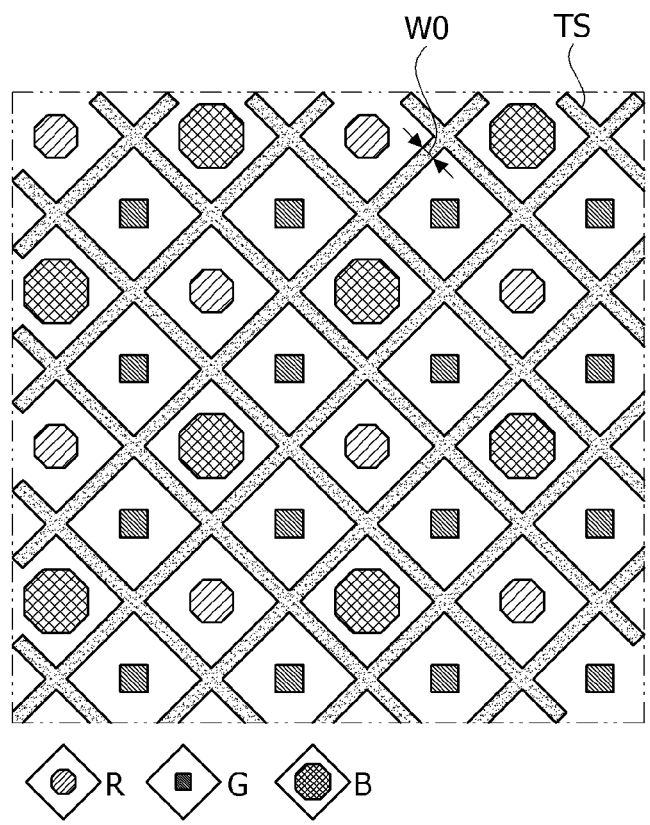
FIG. 30 is an enlarged plan view of a portion of the display area according to an embodiment of the present disclosure.
Figure 31:
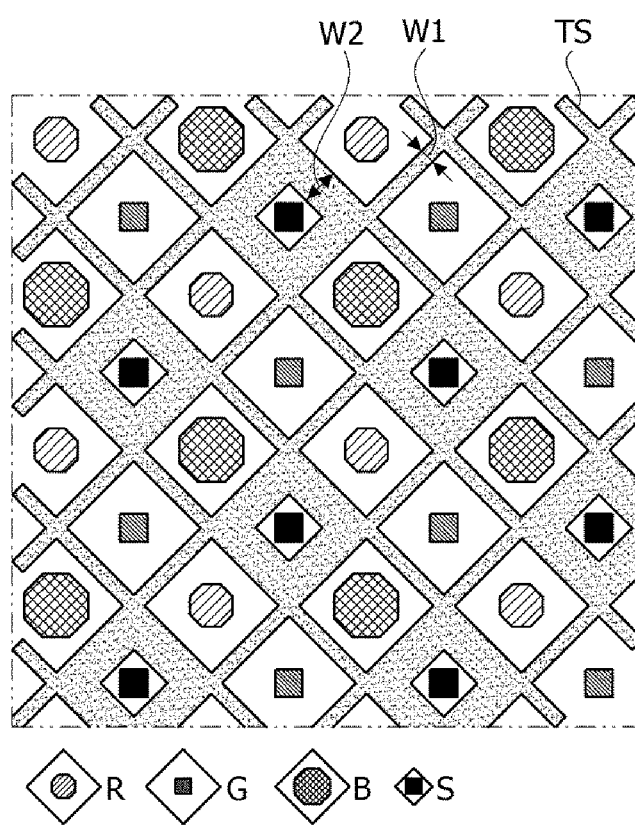
FIG. 31 is an enlarged plan view of a portion of the first sensing area according to an embodiment of the present disclosure.

FIG. 29 is a diagram illustrating mesh-type electrodes of the touch sensor TS disposed in the display area DA and the first sensing area SA according to one embodiment. FIG. 30 is an enlarged plan view of a portion of the display area DA according to one embodiment. FIG. 31 is an enlarged plan view of a portion of the first sensing area SA according to one embodiment.

With reference to FIGS. 29 to 31, the touch sensors TS of the display area DA and the first sensing area SA include a mesh-type electrode.

The mesh-type electrode of the display area DA has substantially the same line width W0 as shown in FIG. 30. In contrast, the mesh-type electrode of the first sensing area DA has different line widths W1 and W2 in part as shown in FIG. 31. To block scattered light incident on the sensor pixels of the first sensing area DA, the line width W2 of the mesh-type electrode adjacent to the sensor pixels S is set to be larger than the line width W1 of the mesh-type electrode adjacent to the display pixels R, G and B. Although the second sensing area CA is omitted from the drawing, the mesh-type electrode disposed on the second sensing area CA may have substantially the same line width W0 and shape as the display area DA.

Figure 32:
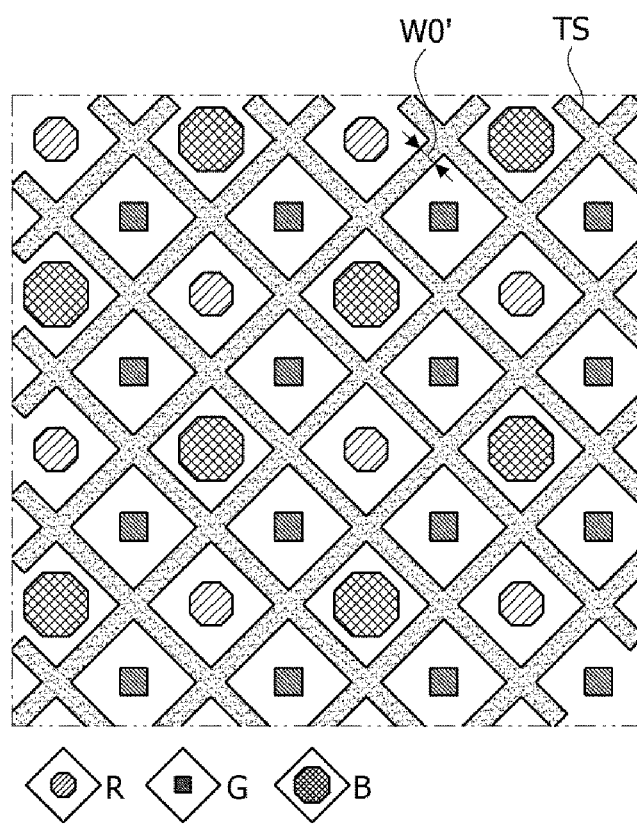
FIGS. 32 to 34 are plan views illustrating various embodiments of a mesh-type electrode disposed in the display area.
Figure 33:
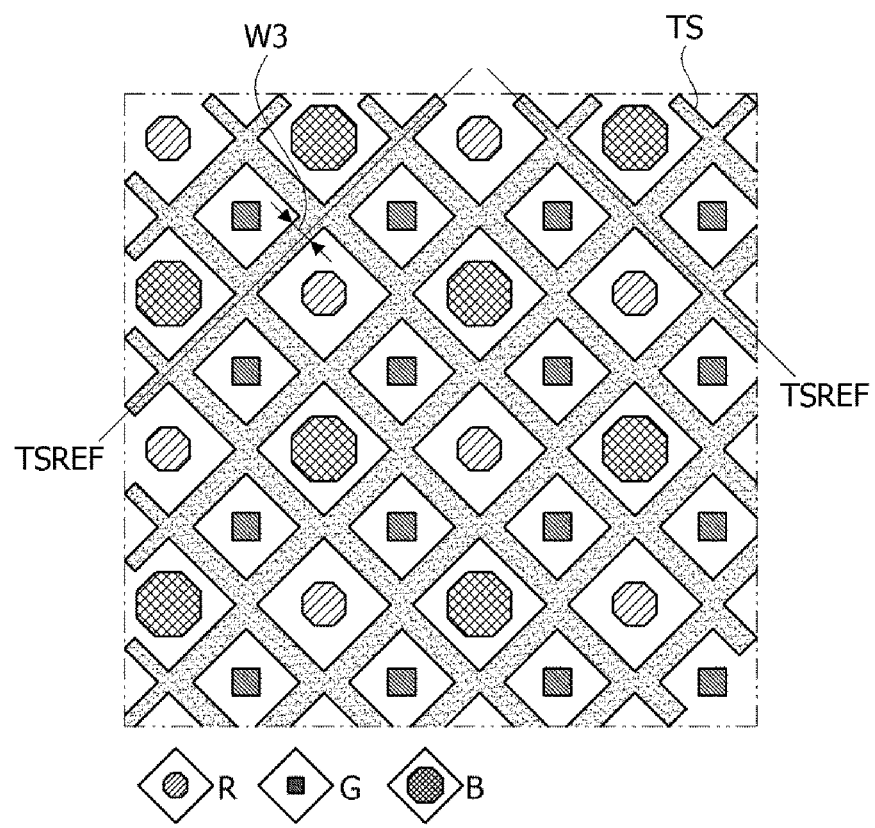
Figure 34:
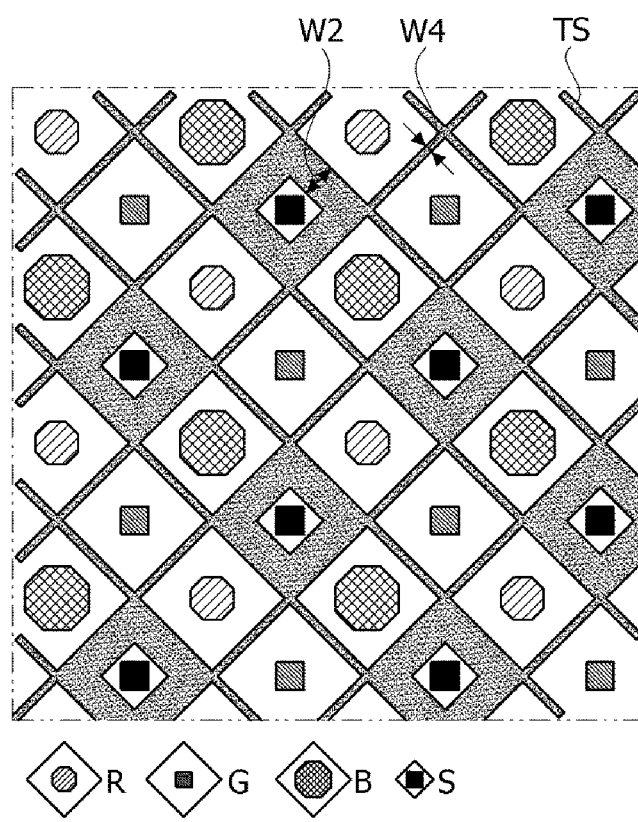

The capacitance of the touch sensor TS may vary according to the area of the electrode. Hence, if the line widths of the mesh-type lines are different in part, the capacitances of the touch sensors change, and thus a difference may occur in the amount of charge between the touch sensors. The sensing unit 402 of the touch sensor driver 400 may apply a gain (or, weight) to the touch data to compensate for variations in capacitance between the touch sensors. For example, touch data obtained from a touch sensor signal having a large capacitance may be multiplied or added by a gain smaller than 1. The gain applied to the touch sensor signal may be set to a value in inverse proportion to the mesh-type line width. In another embodiment, as shown in FIGS. 32 to 34, the structure of the mesh-type electrodes may be changed so as to compensate for a variation in capacitance between the touch sensors of the display area and the first sensing area SA. The mesh-type electrode structure as shown in FIGS. 32 to 34 may be applied together with the compensation method of the sensing unit.

FIGS. 32 to 34 are plan views illustrating various embodiments of a mesh-type electrode.

With reference to FIG. 32, the mesh-type electrode disposed on the display area DA may be formed to have a line width W0' that is identical or similar to the average line width of the mesh-type electrode of the first sensing area SA. In this case, since the line width of the mesh-type electrode disposed in the display area DA is substantially the same as the average line-width of the mesh-type electrode disposed in the first sensing area SA, a variation in capacitance of the touch sensors TS between the display area DA and the first sensing area SA can be reduced.

With reference to FIG. 33, the mesh-type electrode disposed on the display area DA may be formed to have a thick line width W3 at a portion adjacent to the G subpixel having a small emission region. In this case, as can be seen from a virtual reference line TSREF, the center of the line width is skewed toward the green subpixel and is eccentric. As a result, the average line width of the mesh-type electrode of the display area DA may become identical or similar to that of the first sensing area SA.

With reference to FIG. 34, the line width of the mesh-type electrode may vary in part. For example, the mesh-type electrode disposed on the first sensing area SA may be thickened at a portion adjacent to the sensor pixel S and be thinned at a portion adjacent to the display pixels R, G and B. The mesh-type electrode line width W2 between the sensor pixel S and the display pixels R, G and B may be set to be at least two times as thick as the mesh-type electrode line width W4 between adjacent subpixels in the display pixels R, G and B. The average line width of the mesh-type electrode disposed in the display area DA may become identical or similar to that of the first sensing area SA.

Figure 35:
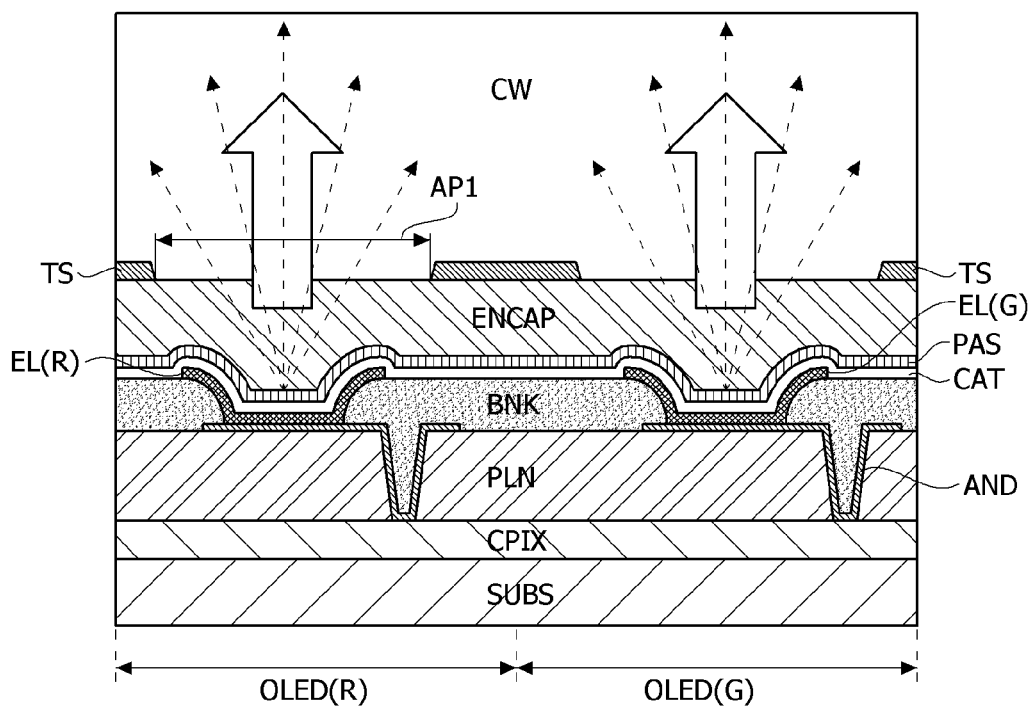
FIG. 35 is a cross-sectional view showing in detail a cross-sectional structure of neighboring subpixels in a display pixel according to an embodiment of the present disclosure.

FIG. 35 is a cross-sectional view showing in detail a cross-sectional structure of neighboring subpixels in a display pixel. In FIG. 35, a detailed cross-sectional structure of the pixel circuit CPIX is omitted. In FIG. 35, "OLED(R)" indicates the light emitting element of an R subpixel. "OLED(G)" indicates the light emitting element of a G subpixel. "EL(R)" indicates an organic compound layer including the emission layer of an R subpixel. "EL(G)" indicates an organic compound layer including the emission layer of a G subpixel.

With reference to FIG. 35, the pixel circuit CPIX is formed on a substrate SUBS of the display panel.

The planarization layer PLN may be an organic insulating material that covers the pixel circuit CPIX and provides a flat surface. The anode electrode AND of the light emitting element OLED is connected to the pixel circuit CPIX through a contact hole penetrating the planarization layer PLN.

The pixel defining film BNK defines an emission region of the light emitting element OLED in each of the display pixels R, G and B. The pixel defining film BNK may cover the contact hole of the planarization layer PLN and a portion of the anode electrode AND. The pixel defining film BNK may be formed of an organic insulating material. The organic compound layer EL of the light emitting element OLED is formed in the emission region defined by the pixel defining film BNK. The cathode electrode CAT of the light emitting element OLED covers the pixel defining film BNK and the organic compound layer EL.

An inorganic insulating film PAS is formed on the cathode electrode CAT, and an encapsulation layer ENCAP is formed thereon. The encapsulation layer ENCAP is an insulating layer having a structure in which at least one of an organic insulating layer and an inorganic insulating layer is stacked. A metal-type electrode of the touch sensor TS is formed on the encapsulation layer ENCAP. The metal type electrode is formed of metal lines that avoid the emission region of the light emitting element OLED so as not to interfere with the emission region. In FIG. 35, "AP1" indicates an opening between metal lines of the mesh-type electrode.

The cover glass 20 covers the encapsulation layer ENCAP and the mesh-type electrode of the touch sensor TS.

Figure 36:
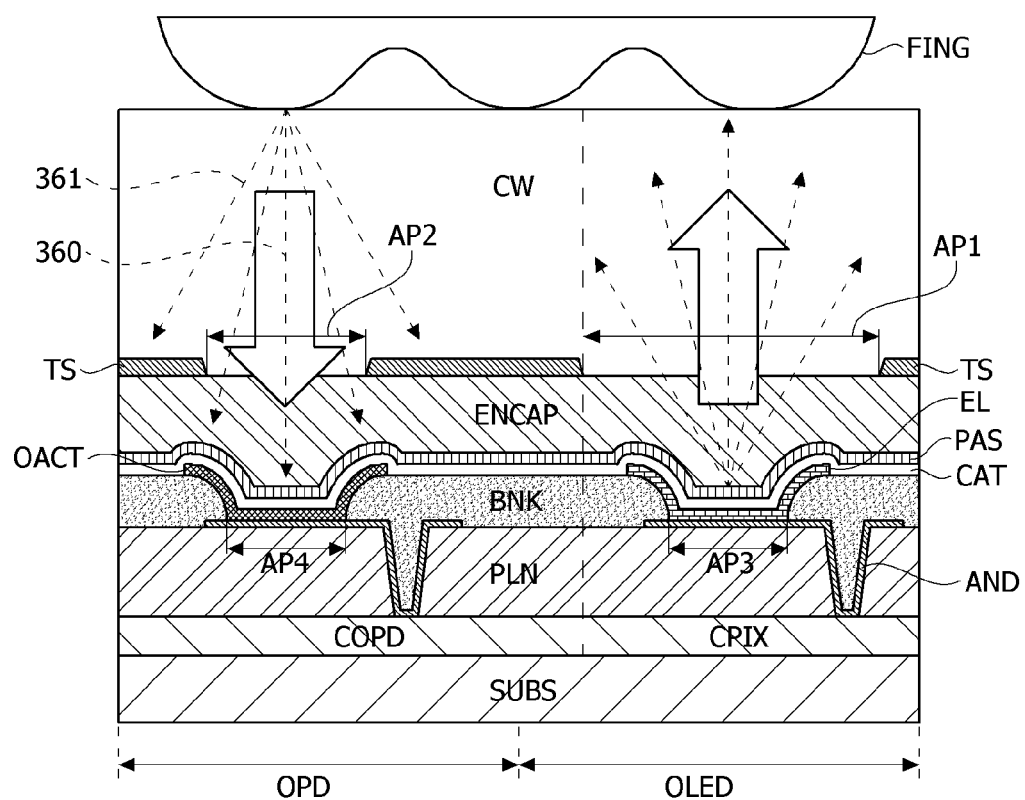
FIG. 36 is a cross-sectional view showing in detail a cross-sectional structure of a sensor pixel and a subpixel according to the first embodiment of the present disclosure.

FIG. 36 is a cross-sectional view showing in detail a cross-sectional structure of a sensor pixel and a subpixel according to the first embodiment of the present disclosure. In FIG. 36, "OPD" indicates the organic photodiode of a sensor pixel S. "OACT" indicates an organic compound layer of the organic photodiode. "CW" indicates a cover glass. Detailed cross-sectional structures of the sensor driving circuit COPD and the pixel circuit CPIX are omitted.

With reference to FIG. 36, the display panel may include a light emitting element OLED and an organic photodiode OPD disposed on the light emitting element and sensor layer. The organic photodiode OPD may be replaced with an inorganic photodiode including an inorganic semiconductor layer.

The display panel includes a touch sensor TS disposed on the light emitting element and sensor layer. The touch sensor TS includes a mesh-type electrode.

The mesh-type electrode of the touch sensor TS has a narrow line width at portions adjacent to the display pixels R, G and B so as to secure the emission region of the display pixels R, G and B, and provides an opening AP1 exposing the emission region. On the other hand, the mesh-type electrode of the touch sensor TS has a wide line width at portions adjacent to the sensor pixel S so as to block scattered light 361 incident on the sensor pixel S, and provides an opening AP2 exposing the light-receiving surface of the sensor pixel S. In one embodiment, the center of the opening AP2 coincides with the center of the light-receiving surface of the sensor pixel S. The opening AP2 of the sensor pixel S may be smaller than the opening AP1 of the display pixel R, G or B.

In the fingerprint recognition mode, the display pixels R, G and B adjacent to the sensor pixel S are driven as a light source to irradiate light to the fingerprint FING through the relatively large opening AP1, and light 360 reflected from the fingerprint FING is incident on the light-receiving surface of the sensor pixel S through the opening AP2. Scattered light 361, which is reflected from the fingerprint FING and travels obliquely, is blocked or reflected by the metal line of the touch sensor TS, and light 360 perpendicular to the light-receiving surface of the sensor pixel S is incident on the light-receiving surface.

The metal line of the touch sensor TS overlaps the pixel defining film BNK. The pixel defining film BNK provides an opening AP3 for defining the emission region of the light emitting element OLED in the display pixel R, G or D. In addition, the pixel defining film BNK provides an opening AP4 for defining the light-receiving surface of the organic photodiode OPD in the sensor pixel S. The openings AP3 and AP4 provided by the pixel defining film BNK and the openings AP1 and AP2 provided by the metal lines of the touch sensor TS may be set to have different sizes. For example, the sizes of the openings AP1 to AP4 may be designed to satisfy AP1>AP2, AP1>AP3, and AP2>AP4. These openings AP1 to AP4 may increase the fingerprint recognition rate by increasing the amount of light at the display pixels R, G and B and allowing diffusion of light, while blocking the scattered light 361 in multiple stages from the sensor pixels S.

The line width of the metal line of the touch sensor TS formed between the sensor pixel S and the display pixels R, G and B may be larger than that of the metal line of the touch sensor TS formed between the display pixels R, G and B. The metal line of the touch sensor TS formed between the sensor pixel S and the display pixels R, G and B may be disposed closer to the sensor pixel S than the display pixels R, G and B.

Figure 37:
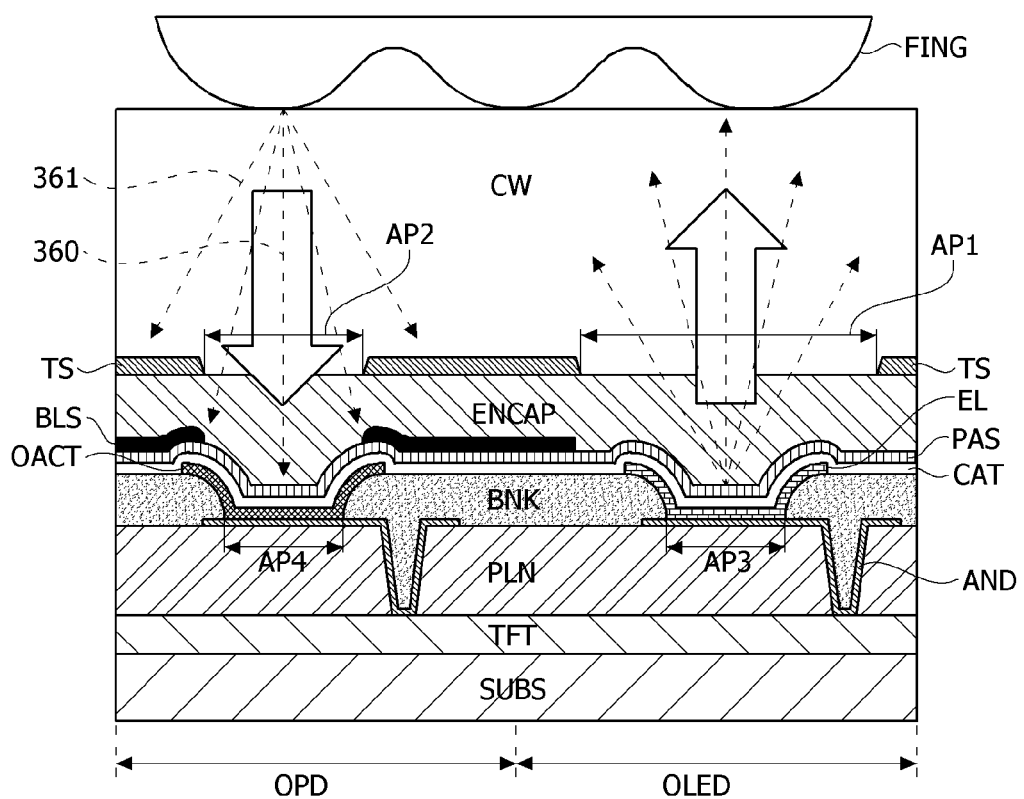
FIG. 37 is a cross-sectional view showing in detail a cross-sectional structure of a sensor pixel and a subpixel according to the second embodiment of the present disclosure.

FIG. 37 is a cross-sectional view showing in detail a cross-sectional structure of a sensor pixel and a subpixel according to the second embodiment of the present disclosure.

With reference to FIG. 37, the display panel may further include a barrier layer BLS disposed between the touch sensor TS and the cathode electrode CAT.

The barrier layer BLS may be formed of a material capable of reflecting or absorbing light, such as a metal or an organic insulating material colored in black. The barrier layer BLS may be formed on the cathode electrode CAT or may be formed on an inorganic insulating film PAS covering the cathode electrode CAT.

The barrier layer BLS provides an opening to expose the light-receiving surface of the sensor pixel S. The opening of the barrier layer BLS is, between the opening AP2 provided by the metal line of the touch sensor TS and the opening AP4 of the pixel defining film BNK, vertically aligned with these openings AP2 and AP4 to secure the path of light vertically traveling toward the light-receiving surface of the sensor pixel S.

The scattered light 361 with a large angle is blocked by the metal line of the touch sensor TS, and the scattered light 361 with a small angle having passed through the touch sensor TS is blocked by the barrier layer BLS. Hence, the scattered light 361 may be blocked by multiple layers.

The opening of the barrier layer BLS may be formed to have, but not limited to, a size identical to that of the opening AP2 of the touch sensor TS. For example, the opening of the barrier layer BLS may be designed to be larger or smaller than the opening AP2 of the touch sensor TS.

Figure 38:
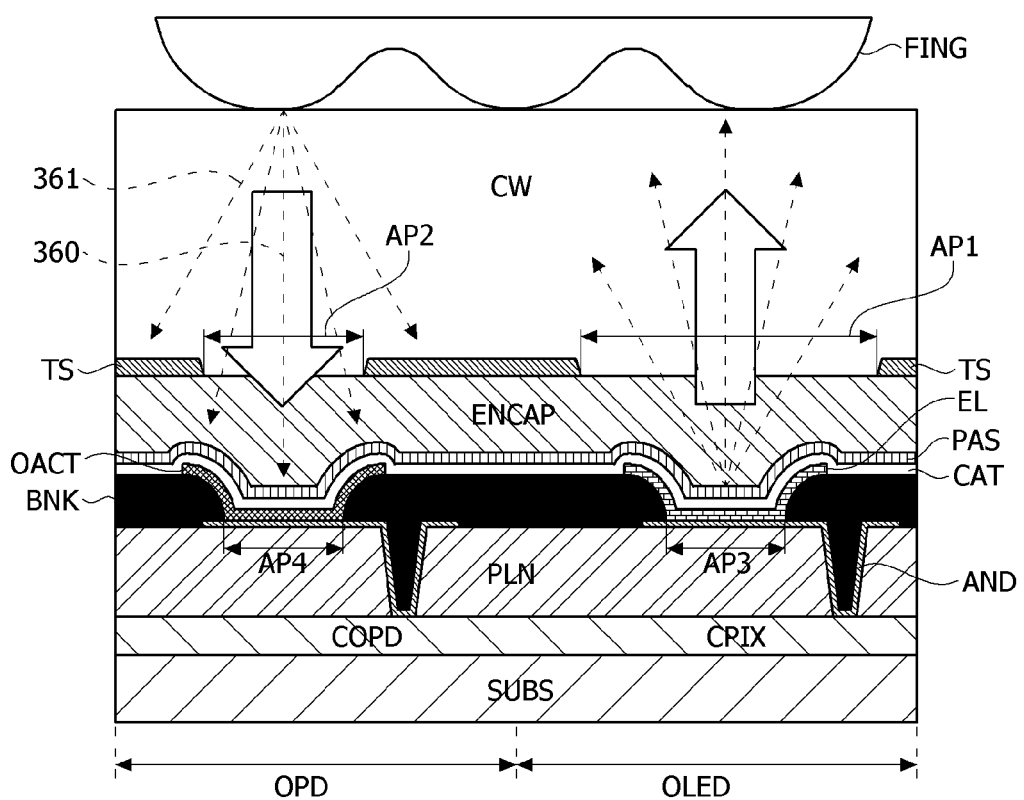
FIG. 38 is a cross-sectional view showing in detail a cross-sectional structure of a sensor pixel and a subpixel according to the third embodiment of the present disclosure.

FIG. 38 is a cross-sectional view showing in detail a cross-sectional structure of a sensor pixel and a subpixel according to the third embodiment of the present disclosure.

With reference to FIG. 38, the pixel defining film BNK may be colored in black.

The opening AP4 of the pixel defining film BNK is aligned with the opening AP2 provided by the metal line of the touch sensor TS in a direction perpendicular to the substrate surface of the display panel. Hence, scattered light 361 reflected from the fingerprint is blocked by the touch sensor TS and the pixel defining film BNK. In addition, the pixel defining film BNK blocks light travelling from the display pixels R, G and B adjacent to the sensor pixel S to the sensor pixel S.

Figure 39:
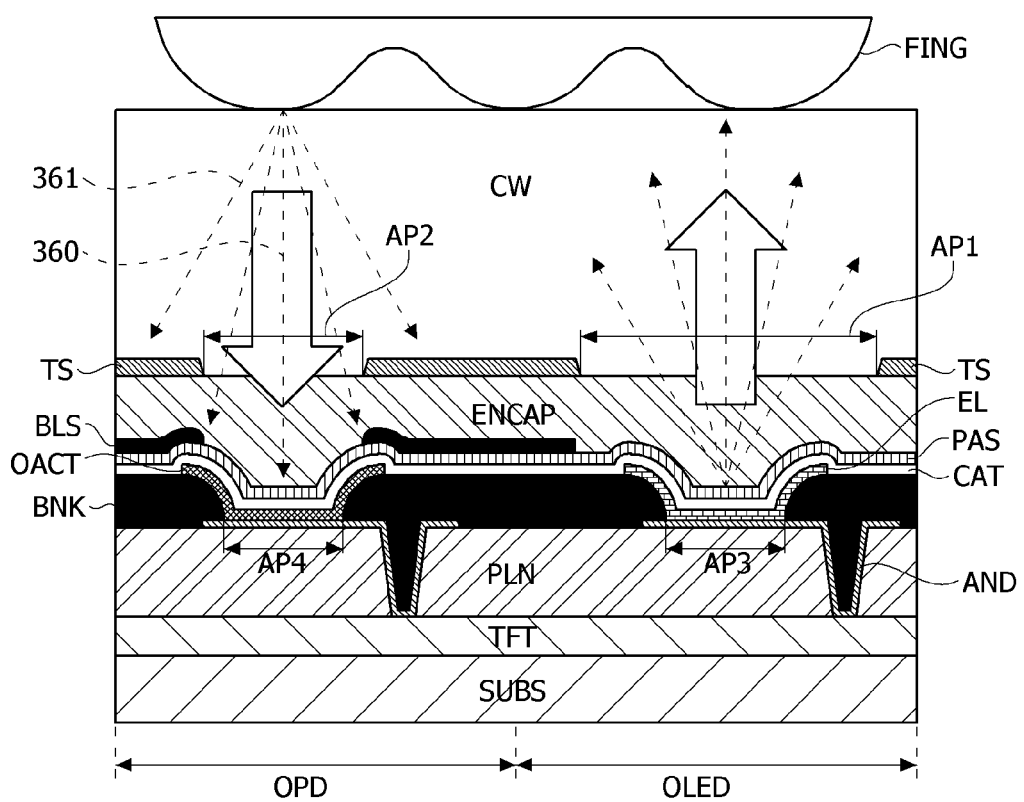
FIG. 39 is a cross-sectional view showing in detail a cross-sectional structure of a sensor pixel and a subpixel according to the fourth embodiment of the present disclosure.

FIG. 39 is a cross-sectional view showing in detail a cross-sectional structure of a sensor pixel and a subpixel according to the fourth embodiment of the present disclosure.

With reference to FIG. 39, the display panel may include a black barrier layer BLS disposed between the touch sensor TS and the cathode electrode CAT, and a black pixel defining film BNK.

In this embodiment, the black barrier layer BLS and the black pixel defining film BNK shown in FIGS. 37 and 38 are applied together to the display panel.

Figure 40:
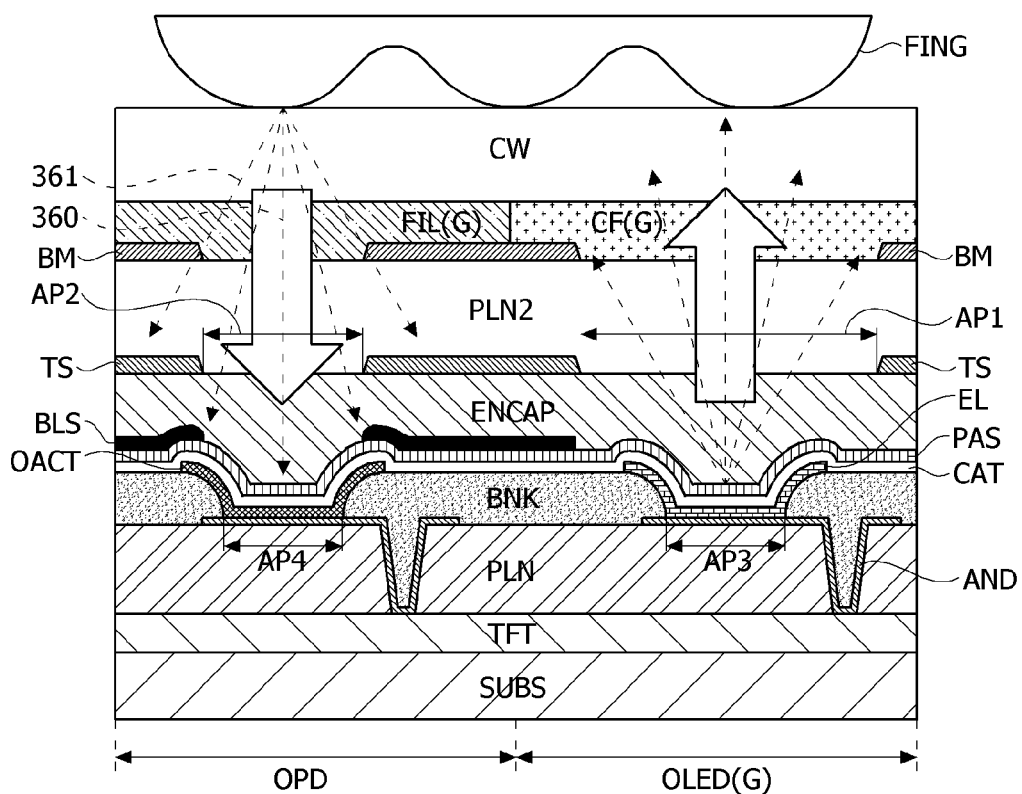
FIG. 40 is a cross-sectional view showing in detail a cross-sectional structure of a sensor pixel and a subpixel according to the fifth embodiment of the present disclosure.

FIG. 40 is a cross-sectional view showing in detail a cross-sectional structure of a sensor pixel and a subpixel according to the fifth embodiment of the present disclosure.

With reference to FIG. 40, the display panel may further include a color filter array disposed on the light emitting element and sensor layer.

The color filter array includes R, G and B color filters facing the openings AP1 and AP3 of the display pixels R, G and B, and a first black matrix BM disposed at a boundary between neighboring subpixels. The color filter array further includes an auxiliary filter FIL(G) facing the openings AP2 and AP4 of the sensor pixel S, and a second black matrix BM disposed at a boundary between the sensor pixel S and adjacent display pixels R, G and B.

In the first sensing area SA, if a color filter is disposed in the display pixels R, G and B and there is no color filter in the sensor pixel S, the sensor pixel S may be visible. The auxiliary filter FIL(G) may be implemented as a color filter that corrects the color sense of the first sensing area SA with the sensor pixel S being invisible.

The auxiliary filter FIL(G) may include at least one of a color filter for color sense correction, a color filter that passes only wavelengths of light generated from a subpixel driven as a light source in the fingerprint sensing mode, and an infrared cutoff filter.

In the fingerprint sensing mode, in one embodiment only the wavelength of light irradiated from the subpixel used as a light source in the first sensing area SA to the fingerprint passes through the auxiliary filter FIL(G). In the fingerprint sensing mode, it is preferable that a green subpixel G emitting light of a green wavelength, which has high luminance and does not pass through the skin, is used as a light source. In this case, a color filter that transmits only green wavelength light may be applied to the auxiliary filter FIL(G).

Meanwhile, since the infrared ray (IR) incident on the photodiode contain external light components that pass through the skin, it may act as noise in the fingerprint sensing mode. Hence, an infrared (IR) cutoff filter may be applied to the auxiliary filter FIL(G).

The second black matrix BM blocks scattered light 36. Light reflected from the fingerprint is irradiated to the sensor pixel S through the opening provided in the second black matrix BM. Consequently, in the sensor pixel S, the scattered light 361 may be blocked by the black matrix BM, the metal line of the touch sensor TS, and the barrier layer BLS.

The color filter array may be formed on a second planarization layer PLN2 covering the touch sensor TS. The color filter array may be covered with the cover glass CW.

Since the contents of the specification described above as the problem to be solved, the problem solving means, and effects do not specify essential features of the claims, the scope of the claims is not limited by the matters described in the specification.

Figure 41:
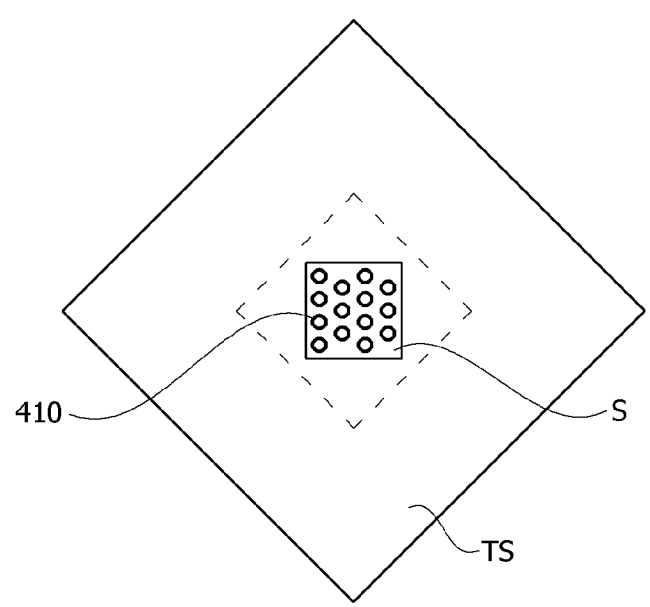
FIG. 41 is a plan view showing an example in which micro holes are formed in a metal line of the touch sensor according to an embodiment of the present disclosure.

In the above-described embodiments, one opening AP2 is provided in the metal line of the touch sensor TS, but the present disclosure is not limited thereto. As shown in FIG. 41, a plurality of micro holes 410 facing the light-receiving surface of the sensor pixel S may be disposed on the metal line of the touch sensor TS. The micro holes 410 may be formed in the metal line. The micro holes 410 may be applied to the above-described embodiments.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display panel comprising:
    a display area in which a plurality of display pixels including a light emitting element are disposed;
    a sensing area in which a plurality of display pixels including a light emitting element and a plurality of sensor pixels including a photoelectric conversion element are disposed; and
    a touch sensor disposed on the display area and the sensing area,
    wherein the touch sensor includes at least one line that provides a first opening exposing an emission region of the light emitting element and a second opening exposing a light-receiving surface of the photoelectric conversion element,
    wherein the touch sensor disposed on the sensing area includes:
        first lines positioned between adjacent display pixels from the plurality of display pixels, the first lines having a first line width; and
        second lines positioned between a sensor pixel from the plurality of sensor pixels and a display pixel from the plurality of display pixels, the second lines having a second line width that is larger than the first line width.

2. The display panel of claim 1, wherein a display pixel resolution of the sensing area is less than that of the display area.

3. The display panel of claim 1, wherein a pixels-per-inch (PPI) for the plurality of display pixels of the sensing area is less than a PPI of the plurality of display pixels of the display area.

4. The display panel of claim 1, wherein the second opening is smaller than the first opening.

5. The display panel of claim 1, wherein the touch sensor has a larger line width at a portion adjacent to a sensor pixel from the plurality of sensor pixels than at a portion adjacent to a display pixel from the plurality of display pixels included in either the display area or the sensing area.

6. The display panel of claim 1, wherein, between a display pixel from the plurality of display pixels included in either the display area or the sensing area and a neighboring sensor pixel, a metal line of the touch sensor is closer to the sensor pixel.

7. The display panel of claim 1, further comprising a pixel defining film that is disposed under the touch sensor to define an emission region of a display pixel from the plurality of display pixels included in either the display area or the sensing area and the light-receiving surface of the photoelectric conversion element.

8. The display panel of claim 7, further comprising a barrier layer disposed between the pixel defining film and the touch sensor, and wherein the barrier layer includes an opening that is aligned with the second opening perpendicularly to a substrate surface of the display panel.

9. The display panel of claim 8, wherein the barrier layer includes an organic insulating material colored in black or a metal.

10. The display panel of claim 1, further comprising a color filter array disposed on the touch sensor, wherein the color filter array includes a color filter facing the emission region of the light emitting element, a black matrix disposed at a boundary between subpixels of the display pixel and at a boundary between a display pixel from the plurality of display pixels included in either the display area or the sensing area and the sensor pixel, and wherein the black matrix includes an opening aligned with the first opening perpendicularly to a substrate surface of the display panel.

11. The display panel of claim 10, wherein:
the color filter array further includes an auxiliary filter facing the light-receiving surface of the photoelectric conversion element; and
the auxiliary filter includes at least one of a color filter for color sense correction, a color filter that passes only wavelengths of light generated from a subpixel driven as a light source in a fingerprint sensing mode, and an infrared cutoff filter.

12. The display panel of claim 1, wherein the touch sensor includes a line that includes a plurality of micro holes facing the light-receiving surface of the photoelectric conversion element.

13. A display panel comprising:
a display area in which a plurality of display pixels including a light emitting element are disposed;
a sensing area in which a plurality of display pixels including a light emitting element and a plurality of sensor pixels including a photoelectric conversion element are disposed; and
a touch sensor disposed on the display area and the sensing area,
wherein the touch sensor disposed on the sensing area includes:
first lines positioned between adjacent display pixels from the plurality of display pixels, the first lines having a first line width; and
second lines positioned between a sensor pixel from the plurality of sensor pixels and a display pixel from the plurality of display pixels, the second lines having a second line width that is larger than the first line width.

14. The display panel of claim 13, wherein a line of the touch sensor has a same line width in the display area.

15. The display panel of claim 13, wherein a line of the touch sensor has a larger line width at a portion adjacent to the sensor pixel than at a portion adjacent to a display pixel from the plurality of display pixels included in either the display area or the sensing area in the sensing area.

16. The display panel of claim 13, wherein, at a boundary between a green subpixel and a neighboring subpixel of a color other than green in the display area, a line of the touch sensor is disposed closer to the green subpixel.

17. The display panel of claim 16, wherein an emission region of the green subpixel is smaller than that of a non-green subpixel.

18. A display device comprising:
a display panel that includes a display area in which a plurality of display pixels including a light emitting element are disposed, a sensing area in which a plurality of display pixels including a light emitting element and a plurality of sensor pixels including a photoelectric conversion element are disposed, and a touch sensor disposed on the display area and the sensing area; and
a fingerprint recognition processor configured to recognize a fingerprint based on a fingerprint pattern image obtained from the photoelectric conversion element,
wherein the touch sensor includes a line that provides a first opening exposing an emission region of the light emitting element and a second opening exposing a light-receiving surface of the photoelectric conversion element,
wherein the touch sensor disposed on the sensing area includes:
first lines positioned between adjacent display pixels from the plurality of display pixels, the first lines having a first line width; and
second lines positioned between a sensor pixel from the plurality of sensing pixels and a display pixel from the plurality of display pixels, the second lines having a second line width that is larger than the first line width.

19. The display device of claim 18, wherein the display panel further includes:
a second sensing area that includes a plurality of light transmitting portions and a plurality of display pixels spaced apart from each other with the light transmitting portions interposed therebetween; and
a touch sensor disposed on the second sensing area,
wherein the display panel further includes an optical sensor disposed under the second sensing area of the display panel; and
wherein a display pixel resolution of the sensing area and the second sensing area is less than a display pixel resolution of the display area.

20. The display device of claim 18, wherein the touch sensor includes a line that has different line widths in part in the sensing area.

* * * * *